US010229942B2

(12) United States Patent
Oishi et al.

(10) Patent No.: US 10,229,942 B2
(45) Date of Patent: Mar. 12, 2019

(54) SOLID STATE IMAGING DEVICE AND ELECTRONIC APPARATUS

(71) Applicant: SONY SEMICONDUCTOR SOLUTIONS CORPORATION, Kanagawa (JP)

(72) Inventors: Hidetoshi Oishi, Kanagawa (JP); Kunihiko Izuhara, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 167 days.

(21) Appl. No.: 15/504,142

(22) PCT Filed: Aug. 27, 2015

(86) PCT No.: PCT/JP2015/074133
§ 371 (c)(1),
(2) Date: Feb. 15, 2017

(87) PCT Pub. No.: WO2016/039151
PCT Pub. Date: Mar. 17, 2016

(65) Prior Publication Data
US 2018/0350858 A1 Dec. 6, 2018

(30) Foreign Application Priority Data
Sep. 9, 2014 (JP) ................................. 2014-183388

(51) Int. Cl.
H01L 23/522 (2006.01)
H01L 27/04 (2006.01)
(Continued)

(52) U.S. Cl.
CPC ...... H01L 27/14605 (2013.01); H01L 21/768 (2013.01); H01L 27/04 (2013.01); H04N 5/369 (2013.01); H01L 2224/42 (2013.01)

(58) Field of Classification Search
CPC . H01L 27/146; H01L 21/3205; H01L 21/768; H01L 21/822; H01L 23/522;
(Continued)

(56) References Cited

U.S. PATENT DOCUMENTS 6,037,609 A * 3/2000 Liu .................. H01L 27/14603
257/127
7,722,965 B2 * 5/2010 Juni ...................... G02B 5/0242
257/100
(Continued)

FOREIGN PATENT DOCUMENTS

JP 2005-229086 A 8/2005
JP 2008-27934 A 2/2008
(Continued)

OTHER PUBLICATIONS

International Search Report prepared by the Japan Patent Office dated Aug. 27, 2015, for International Application No. PCT/JP2015/074133.

Primary Examiner — Alexander Oscar Williams
(74) Attorney, Agent, or Firm — Sheridan Ross P.C.

(57) ABSTRACT

The present technology relates to a solid state imaging device that enables a reduction in the manufacturing cost of the solid state imaging device, and an electronic apparatus. A first substrate including a pixel circuit having a pixel array unit and a second substrate including a first and a second signal processing circuit arranged side by side across a scribe area are stacked. The second substrate includes a first moisture-resistant ring surrounding at least part of a periphery of the first signal processing circuit, a second moisture-resistant ring surrounding at least part of a periphery of the second signal processing circuit, a third moisture-resistant ring surrounding at least part of a periphery of the second substrate in a layer different from the first and second moisture-resistant rings, and a barrier unit separating a first (Continued)

area between the first and second moisture-resistant rings and a second area. The present technology can be applied to, for example, a solid state imaging device such as a CMOS image sensor.

11 Claims, 66 Drawing Sheets

(51) Int. Cl.
  *H01L 27/146* (2006.01)
  *H01L 21/768* (2006.01)
  *H04N 5/369* (2011.01)
(58) Field of Classification Search
  CPC .................. H01L 27/04; H01L 27/14; H01L 2224/48091; H01L 2224/48227; H01L 2924/00014; H04N 5/369

USPC ................................. 257/685, 686, 777, 723
See application file for complete search history.

(56) References Cited

U.S. PATENT DOCUMENTS

| | | | |
|---|---|---|---|
| 2006/0267154 A1* | 11/2006 | Pitts ................... | H01L 23/5225 257/620 |
| 2015/0372037 A1* | 12/2015 | Tomeba ............ | H01L 27/14618 257/432 |
| 2017/0047368 A1* | 2/2017 | Tomita .............. | H01L 27/14621 |

FOREIGN PATENT DOCUMENTS

| | | | | |
|---|---|---|---|---|
| JP | 2013-21131 A | | 1/2013 | |
| JP | 2016058532 A | * | 4/2016 | ........... H01L 27/146 |
| WO | 2016039151 A1 | * | 3/2016 | ........... H01L 21/822 |

\* cited by examiner

SOLID STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2015/074133 having an international filing date of 27 Aug. 2015, which designated the United States, which PCT application claimed the benefit of Japanese Patent Application No. 2014-183388 filed 9 Sep. 2014, the disclosures of which are incorporated herein by reference in their entirety.

TECHNICAL FIELD

The present technology relates to a solid state imaging device and an electronic apparatus, and particularly relates to a solid state imaging device with a stacked structure, and an electronic apparatus including the solid state imaging device with the stacked structure.

BACKGROUND ART

When a solid state imaging device with a larger area than the exposure field of an exposure apparatus is manufactured, split exposure has conventionally been used which splits the solid state imaging device into a plurality of areas and exposes each split area (see, for example, Patent Document 1).

Moreover, in order to improve the aperture ratio of a solid state imaging device, a stacking technology has conventionally been used which forms a pixel circuit including a pixel array unit and a signal processing circuit respectively in different semiconductor substrates, stacks the two semiconductor substrates, and connects them electrically (see, for example, Patent Document 2).

In addition, if, for example, a solid state imaging device with the stacked structure having an area larger than the exposure field of an exposure apparatus is manufactured, split exposure is performed on each semiconductor substrate.

Moreover, a technology has conventionally been proposed which prevents moisture from entering a multi-core semiconductor device that can be separated into small units, through a mutually connected wire connecting between the cores when detached into the small units (see, for example, Patent Document 3).

CITATION LIST

Patent Document

Patent Document 1: Japanese Patent No. 2902506
Patent Document 2: Japanese Patent No. 4497844
Patent Document 3: Japanese Patent Application Laid-Open No. 2013-21131

SUMMARY OF THE INVENTION

Problems to be Solved by the Invention

However, split exposure requires the use of a photomask different according to each split area and highly accurate positioning at a connection portion of the split areas; there- fore, the manufacturing process becomes complicated and also the manufacturing cost increases.

On the other hand, even if an attempt is made to reduce the manufacturing cost, it is required to ensure moisture resistance and prevent a reduction in the reliability of a solid state imaging device as in the invention described in Patent Document 3.

Hence, the present technology is to enable a reduction in manufacturing cost without reducing the reliability of a solid state imaging device.

Solutions to Problems

A solid state imaging device of a first aspect of the present technology includes: a first substrate including a pixel circuit having a pixel array unit; and a second substrate including a first and a second signal processing circuit arranged side by side across a scribe area, wherein the first substrate and the second substrate are stacked, and the second substrate includes a first moisture-resistant ring surrounding at least part of a periphery of the first signal processing circuit, a second moisture-resistant ring surrounding at least part of a periphery of the second signal processing circuit, a third moisture-resistant ring surrounding at least part of a periphery of the second substrate in a layer different from the first and second moisture-resistant rings, and a barrier unit separating a first area between the first and second moisture-resistant rings and a second area, at least part of a periphery of which is surrounded by the third moisture-resistant ring, and having moisture resistance.

The barrier unit may include a dummy wire being a wire that is not used to transmit a signal.

The barrier unit may include a plurality of the dummy wires formed in a plurality of wiring layers, and a via connecting the dummy wires in different wiring layers.

The dummy wires in a first wiring layer and the dummy wires in a second wiring layer adjacent to the first wiring layer can be alternately placed in a first direction in which the scribe area extends, or a second direction perpendicular to the first direction in at least part of the barrier unit.

A wire that connects the first and second signal processing circuits can be formed in the first or second wiring layer that is closer to the third moisture-resistant ring.

The second substrate is further provided with a fourth moisture-resistant ring formed, leaving a predetermined space from the first and second moisture-resistant rings, in such a manner as to surround at least part of a periphery of the scribe area, and it is possible to cause the barrier unit to separate a third area between the first and fourth moisture-resistant rings and the second area, and a fourth area between the second and fourth moisture-resistant rings and the second area, between the first area and the second area.

It is possible to format least part of a layer including the first and second moisture-resistant rings by one-shot exposure, and form layers including the third moisture-resistant ring and the barrier unit by split exposure.

An inter-layer insulating film between the layer including the barrier unit and an adjacent layer thereof may include a low-K film.

A wire that connects the first and second signal processing circuits can be formed in the layer including the third moisture-resistant ring.

It is possible to form the pixel circuit by split exposure, and form at least part of the layers of the signal processing circuits by one-shot exposure.

An electronic apparatus of a second aspect of the present technology includes a solid state imaging device including a first substrate including a pixel circuit having a pixel array unit, and a second substrate including a first and a second signal processing circuit arranged side by side across a scribe area, wherein the first substrate and the second substrate are stacked, and the second substrate includes a first moisture-resistant ring surrounding at least part of a periphery of the first signal processing circuit, a second moisture-resistant ring surrounding at least part of a periphery of the second signal processing circuit, a third moisture-resistant ring surrounding at least part of a periphery of the second substrate in a layer different from the first and second moisture-resistant rings, and a barrier unit separating a first area between the first and second moisture-resistant rings and a second area, at least part of a periphery of which is surrounded by the third moisture-resistant ring, and having moisture resistance.

In the first and second aspects of the present technology, moisture is prevented from entering the second area, at least part of the periphery of which is surrounded by the third moisture-resistant ring, from the first area between the first and second moisture-resistant rings.

Effects of the Invention

According to the first or second aspect of the present technology, the manufacturing cost can be reduced without reducing the reliability of a solid state imaging device.

MODES FOR CARRYING OUT THE INVENTION

Modes for carrying out the present technology (hereinafter referred to as the embodiments) are described hereinafter. Incidentally, descriptions are given in the following order:
1. First embodiment (an example where signal processing circuits are not electrically connected)
2. Second embodiment (an example where the signal processing circuits are electrically connected in a logic substrate)
3. Third embodiment (an example where the signal processing circuits are electrically connected in a pixel substrate)
4. Modifications 1. First Embodiment {1-1. System Configuration}

Figure 1:
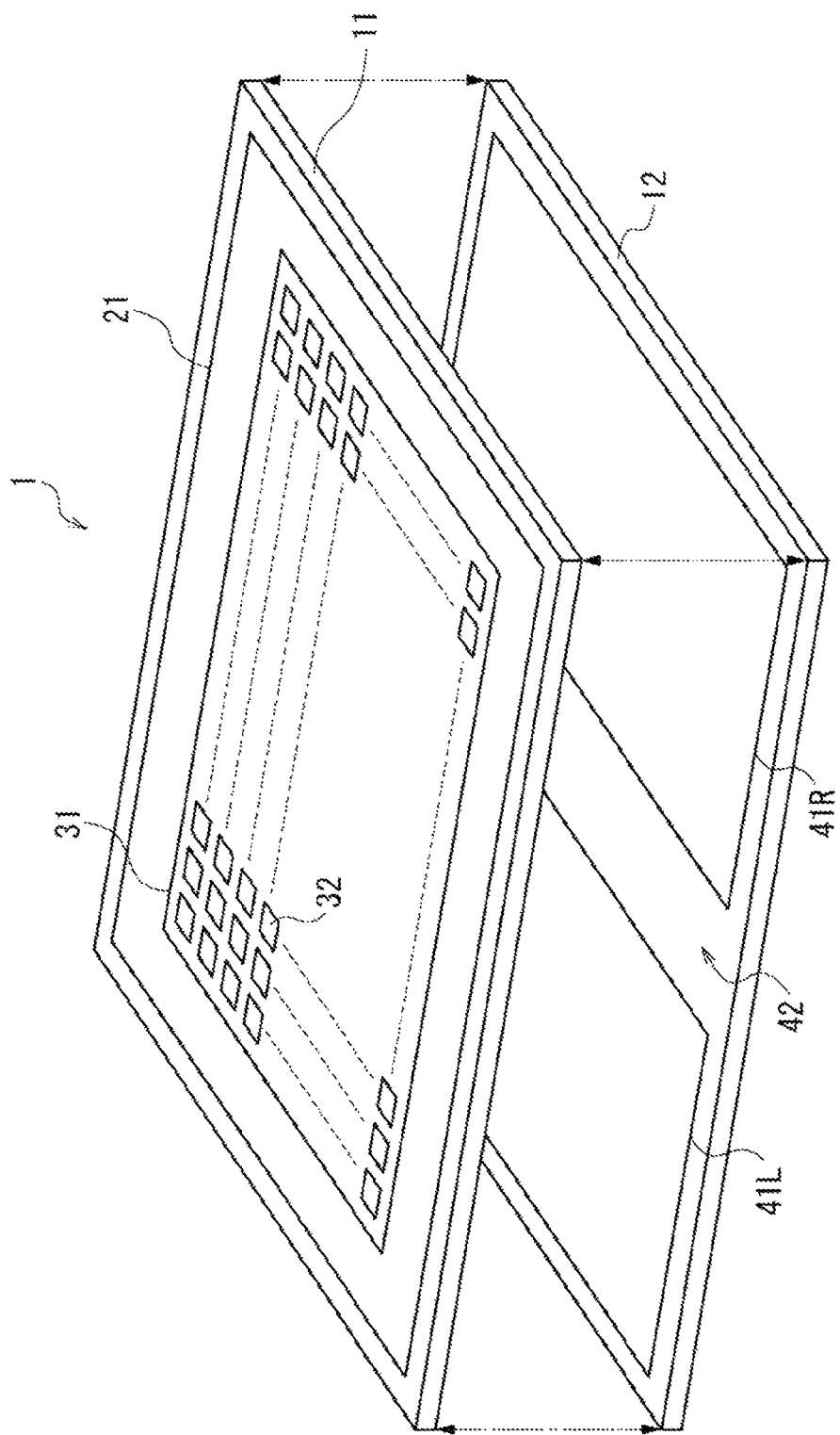
FIG. 1 is a perspective view schematically illustrating a solid state imaging device according to a first embodiment of the present technology.

FIG. 1 is a perspective view schematically illustrating a configuration example of a solid state imaging device 1 according to a first embodiment of the present technology. Incidentally, a description is given here taking a case where the solid state imaging device 1 is a CMOS image sensor as an example. However, the present technology is not limited to the application to the CMOS image sensor.

The solid state imaging device 1 is a semiconductor chip with a structure where a pixel substrate 11 and a logic substrate 12 are stacked (what is called a stacked structure). Moreover, the solid state imaging device 1 is a back-illuminated CMOS image sensor. Wiring layers of the pixel substrate 11 and wiring layers of the logic substrate 12 are stacked in such a manner as to be adjacent to each other. Incidentally, the present technology is not limited to the application to the back-illuminated CMOS image sensor.

The pixel substrate 11 is a semiconductor substrate where a pixel circuit 21 is formed, the pixel circuit 21 including a pixel array unit (pixel unit) 31 where unit pixels 32 each including a photoelectric conversion device are two-dimensionally arranged in a matrix. Moreover, although illustration is omitted, an edge portion surrounding the pixel array unit 31 of the pixel circuit 21 is provided with, for example, a pad for electrically connecting to the outside and a via for electrically connecting to the logic substrate 12. A pixel signal obtained from each unit pixel 32 of the pixel array unit 31 is an analog signal. This analog pixel signal is transmitted from the pixel substrate 11 to the logic substrate 12 through the via and the like.

The logic substrate 12 is a semiconductor substrate that is formed in such a manner as to arrange a signal processing circuit 41L and a right signal processing circuit 41R, both of which include the same circuit pattern, side by side across a scribe area 42. Incidentally in FIG. 1, the width of the scribe area 42 is exaggerated and illustrated larger than actually it is to facilitate the understanding of FIG. 1. The same shall apply to subsequent drawings.

The signal processing circuit 41L, for example, performs predetermined signal processing including digitization (AD conversion) on an analog pixel signal read out from each unit pixel 32 in a left-half area of the pixel array unit 31, and stores pixel data on which the signal processing has been performed. Moreover, the signal processing circuit 41L, for example, reads out the stored pieces of pixel data in a predetermined order and outputs the data to the outside of the chip. Consequently, the signal processing circuit 41L outputs image data obtained by the unit pixels 32 in the left-half area of the pixel array unit 31.

The signal processing circuit 41R, for example, performs predetermined signal processing including digitization (AD conversion) on an analog pixel signal read out from each unit pixel 32 in a right-half area of the pixel array unit 31, and stores pixel data on which the signal processing has been performed. Moreover, the signal processing circuit 41R, for example, reads out the stored pieces of pixel data in a predetermined order and outputs the data to the outside of the chip. Consequently, the signal processing circuit 41R outputs image data obtained by the unit pixels 32 in the right-half area of the pixel array unit 31.

Moreover, the signal processing circuits 41L and 41R, for example, control each unit of the solid state imaging device 1 in synchronization with the pixel circuit 21.

In this manner, with the stacked structure of the pixel substrate 11 and the logic substrate 12, the area of the pixel substrate 11 can be made substantially equal to the area of the pixel array unit 31. As a result, the size of the solid state imaging device 1 can be reduced, which in turn can reduce the size of the entire chip. Moreover, the aperture ratio of the solid state imaging device 1 can be increased.

Furthermore, a process suitable for the production of the unit pixel 32 and the like can be applied to the pixel substrate 11, and a process suitable for the production of the signal processing circuits 41L and 41R to the logic substrate 12. Accordingly, upon the manufacture of the solid state imaging device 1, process optimization can be promoted.

Incidentally, the area of the pixel circuit 21 is larger than the exposure field of an exposure apparatus. Therefore, split exposure is required. On the other hand, each of the areas of the signal processing circuits 41L and 41R is smaller than the exposure field of the exposure apparatus. Therefore, one-shot exposure is possible.

Incidentally, if there is no need to distinguish the signal processing circuits 41L and 41R individually, they are simply referred to as the signal processing circuit 41 below.

{1-2. Circuit Configuration}

Figure 2:
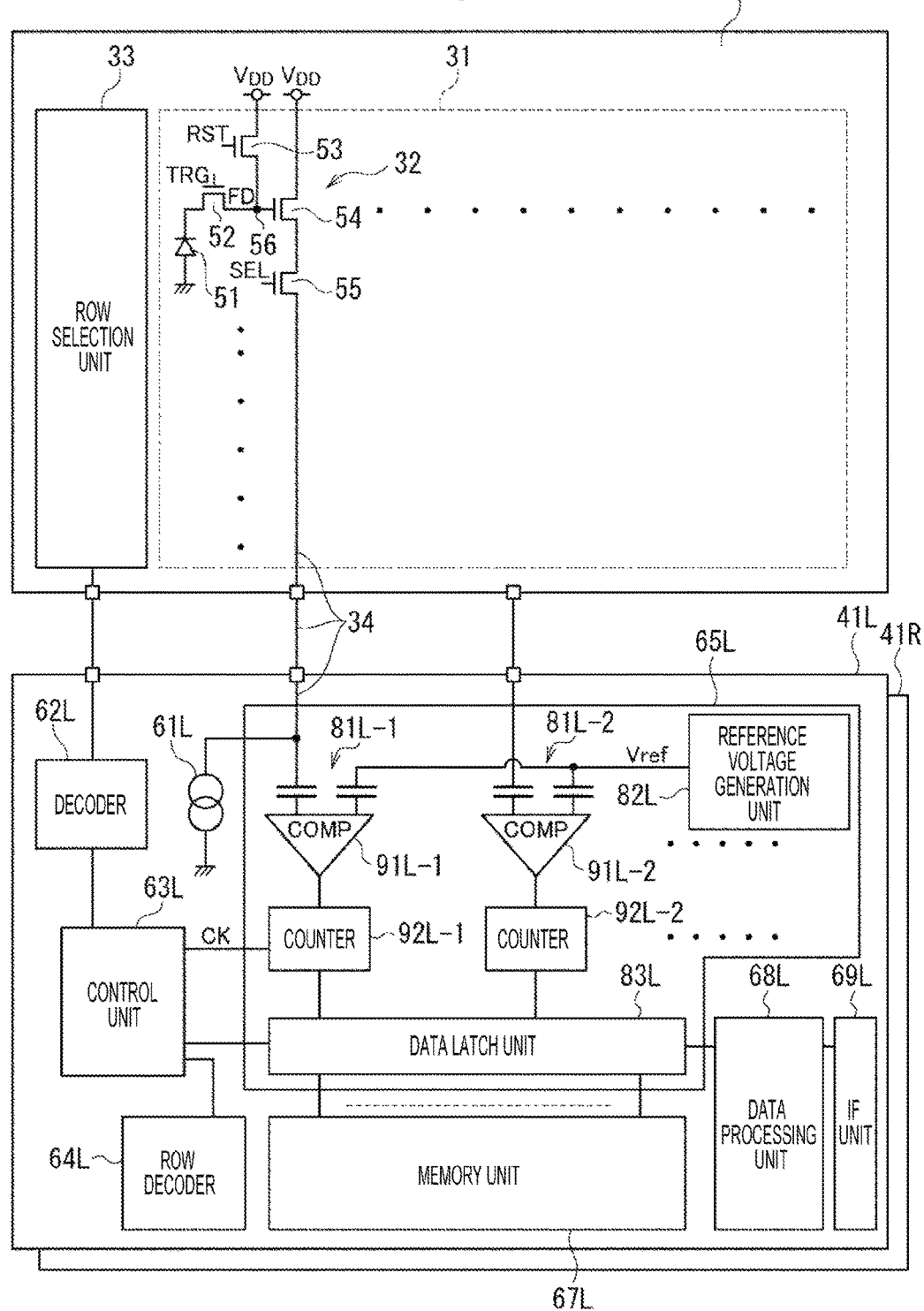
FIG. 2 is a circuit diagram illustrating specific configurations of a pixel circuit and signal processing circuits of the solid state imaging device according to the first embodiment.

FIG. 2 is a circuit diagram illustrating specific configurations of the pixel circuit 21 on the pixel substrate 11 side of the solid state imaging device 1, and the signal processing circuits 41L and 41R on the logic substrate 12 side. Incidentally, as described above, electrical connections between the pixel circuit 21 and the signal processing circuits 41L and 41R are made via unillustrated vias.

(Configuration of the Pixel Circuit 21)

Firstly, the configuration of the pixel circuit 21 on the pixel substrate 11 side is described. The pixel circuit 21 is provided with a row selection unit 33 that selects the unit pixels 32 of the pixel array unit 31, row by row, using an address signal given from the logic substrate 12 side, in addition to the pixel array unit 31 where the unit pixels 32 are two-dimensionally arranged in a matrix. Incidentally, here the row selection unit 33 is provided on the pixel substrate 11 side, but can also be provided on the logic substrate 12 side.

The unit pixel 32 includes, for example, a photodiode 51 as the photoelectric conversion device. Moreover, the unit pixel 32 includes, for example, four transistors—a transfer transistor (transfer gate) 52, a reset transistor 53, an amplifying transistor 54, and a select transistor 55—in addition to the photodiode 51.

For example, N-channel transistors are used here as the four transistors 52 to 55. However, the combination of the conductivity types of the transfer transistor 52, the reset transistor 53, the amplifying transistor 54, and the select transistor 55 illustrated here is a mere example, and the combination is not limited to this. In other words, a combination using a P-channel transistor can be used if needed.

The row selection unit 33 provides a transfer signal TRG, a reset signal RST, and a select signal SEL, which are drive signals to drive a unit pixel 32, to the unit pixel 32 as appropriate. In other words, the transfer signal TRG is applied to a gate electrode of the transfer transistor 52, the reset signal RST to a gate electrode of the reset transistor 53, and the select signal SEL to a gate electrode of the select transistor 55.

The photodiode 51 is connected at an anode electrode to a low potential-side power supply (for example, the ground), and photoelectrically converts the received light (incident light) into photocharge (photoelectrons, here) of a charge amount according to the light quantity to accumulate the photocharge. A cathode electrode of the photodiode 51 is electrically connected to a gate electrode of the amplifying transistor 54 via the transfer transistor 52. A node 56 that is electrically coupled to the gate electrode of the amplifying transistor 54 is called a floating diffusion/floating diffusion region (FD) portion.

The transfer transistor 52 is connected between the cathode electrode of the photodiode 51 and the FD portion 56. The row selection unit 33 provides the transfer signal TRG that is active at a high level (for example, a $V_{DD}$ level) (hereinafter described as "active-high") to the gate electrode of the transfer transistor 52. In response to this transfer signal TRG, the transfer transistor 52 becomes electrically conductive to transfer the photocharge photoelectrically converted by the photodiode 51 to the FD portion 56.

The reset transistor 53 is connected at a drain electrode to a pixel power supply $V_{DD}$ and at a source electrode to the FD portion 56. The row selection unit 33 provides an active-high reset signal RST to the gate electrode of the reset transistor 53. In response to this reset signal RST, the reset transistor 53 becomes electrically conductive, dumps the charge of the FD portion 56 into the pixel power supply $V_{DD}$, and accordingly resets the FD portion 56.

The amplifying transistor 54 is connected at the gate electrode to the FD portion 56 and at a drain electrode to the pixel power supply $V_{DD}$. Then, the amplifying transistor 54 outputs the potential of the FD portion 56 that has been reset by the reset transistor 53 as a reset signal (reset level) Vreset. The amplifying transistor 54 further outputs the potential of the FD portion 56 whose signal charge has been transferred by the transfer transistor 52 as a light accumulated signal (signal level) Vsig.

The select transistor 55 is connected, for example, at a drain electrode to a source electrode of the amplifying transistor 54 and at a source electrode to a signal line 34. The row selection unit 33 provides an active-high select signal SEL to the gate electrode of the select transistor 55. In response to this select signal SEL, the select transistor 55 becomes electrically conductive to put the unit pixel 32 in a selected state, and reads out a signal output from the amplifying transistor 54 to the signal line 34.

As is clear from the above-mentioned description, the potential of the FD portion 56 after resetting is read out as the reset level Vreset first and then the potential of the FD portion 56 after the transfer of signal charge is read out as the signal level Vsig, from the unit pixel 32 to the signal line 34. Parenthetically, the signal level Vsig also includes a component of the reset level Vreset.

Incidentally, here the circuit is configured to connect the select transistor 55 between the source electrode of the amplifying transistor 54 and the signal line 34. However, it is also possible to adopt a circuit configuration where the select transistor 55 is connected between the pixel power supply $V_{DD}$ and the drain electrode of the amplifying transistor 54.

Moreover, the unit pixel 32 is not limited to the one with the above pixel configuration including four transistors. For example, a pixel configuration including three transistors, in which the amplifying transistor 54 has the function of the select transistor 55, and a pixel configuration that shares transistors of the FD portion 56 and later among a plurality of photoelectric conversion devices (pixels) are also acceptable. The configuration of the pixel circuit does not matter.

(Configuration of the Signal Processing Circuits 41L and 41R)

Next, the configuration of the signal processing circuits 41L and 41R on the logic substrate 12 side is described. Incidentally, as described above, the signal processing circuits 41L and 41R have the same circuit pattern. The configuration of the signal processing circuit 41L is mainly described here.

The signal processing circuit 41L is a circuit that mainly performs processing on pixel signals from the unit pixels 32 in the left-half area of the pixel array unit 31. The signal processing circuit 41L is configured including a current source 61L, a decoder 62L, a control unit 63L, a row decoder 64L, a signal processing unit 65L, a column decoder/sense amplifier 66L, a memory unit 67L, a data processing unit 68L, and an interface (IF) unit 69L.

The current source 61L is connected to each signal line 34 where signals are read out, on a pixel column basis, from each unit pixel 32 of the pixel array unit 31. The current source 61L has a configuration of what is called a load MOS circuit including MOS transistors whose gate potentials are biased to a constant potential in such a manner as to supply a constant current to the signal line 34. The current source 61L including the load MOS circuit supplies a constant current to an amplifying transistor 54 of a unit pixel 32 in the selected row to operate the amplifying transistor 54 as a source follower.

Upon the selection of the unit pixels 32, row by row, in the pixel array unit 31, the decoder 62L provides an address signal that specifies an address of the selected row to the row selection unit 33 under control by the control unit 63L.

The row decoder 64L specifies a row address under control by the control unit 63L when the pixel data is written into the memory unit 67L and read out from the memory unit 67L.

The signal processing unit 65L includes at least AD converters 81L-1 to 81L-n that digitize an analog pixel signal read out from each unit pixel 32 of the pixel array unit 31 through the signal line 34 (AD conversion). In addition, the signal processing unit 65L is configured to perform signal processing on the analog pixel signals in parallel on a pixel column basis (column parallel AD). Incidentally, if there is no need to distinguish the AD converters 81L-1 to 81L-n individually, they are simply referred to as the AD converter 81L below.

The signal processing unit 65L further includes a reference voltage generation unit 82L that generates a reference voltage to be used upon AD conversion in each AD converter 81L. The reference voltage generation unit 82L generates a reference voltage of what is called a ramp (RAMP) waveform (an inclined waveform) where a voltage value changes stepwise with the passage of time. The reference voltage generation unit 82L can be configured using, for example, a digital-to-analog converter (DAC) circuit.

The AD converter 81L is provided to, for example, each column of pixels of the pixel array unit 31, that is, each signal line 34. In other words, the AD converter 81L is what is called a column parallel AD converter where the AD converter 81L is placed at each column of the pixels in the left half of the pixel array unit 31. In addition, each AD converter 81L, for example, generates a pulse signal with an amplitude (pulse width) in a time axis direction corresponding to the level of the amplitude of a pixel signal, measures the length of the duration of the pulse width of the pulse signal, and accordingly performs an AD conversion process.

More specifically, for example, the AD converter 81L-1 is configured including at least a comparator (COMP) 91L-1 and a counter 92L-1 as illustrated in FIG. 2. The comparator 91L-1 sets the analog pixel signal (the above-mentioned signal level Vsig or reset level Vreset) read out from the unit pixel 32 through the signal line 34 as a comparison input, and a reference voltage Vref of a ramp wave supplied from the reference voltage generation unit 82L as a reference input to compare both inputs.

Then, in terms of the comparator 91L-1, for example, when the reference voltage Vref is larger than the pixel signal, an output is in a first state (for example, at a high level), and when the reference voltage Vref is equal to or less than the pixel signal, an output is in a second state (for example, at a low level). An output signal of the comparator 91L-1 is a pulse signal with a pulse width corresponding to the level of the amplitude of the pixel signal.

For example, an up/down counter is used for the counter 92L-1. A clock CK is provided to the counter 92L-1 at the same timing as the timing to start supplying the reference voltage Vref to the comparator 91L. The counter 92L-1 being the up-down counter counts up (UP) or down (DOWN) in synchronization with the clock CK to measure the duration of the pulse width of the output pulse of the comparator 91L-1, that is, a comparison period from the start to the end of the comparison operation. In terms of the reset level Vreset and the signal level Vsig, which are read out sequentially from the unit pixel 32, the counter 92L-1 counts down for the reset level Vreset and counts up for the signal level Vsig upon the measurement operation.

With the count-up/count-down operation, it is possible to take a difference between the signal level Vsig and the reset level Vreset. As a result, the AD converter 81L-1 performs a correlated double sampling (correlated double sampling) (CDS) process, in addition to the AD conversion process. The CDS process here is a process of taking the difference between the signal level Vsig and the reset level Vreset to remove reset noise of the unit pixel 32 and fixed pattern noise unique to a pixel such as the threshold variation of the amplifying transistor 54. Then, the count result (count value) of the counter 92L-1 becomes a digital value obtained by digitizing the analog pixel signal.

Incidentally, the AD converters 81L-2 to 81L-n also have a similar configuration to the AD converter 81L-1. Their descriptions are omitted since they are repetitive. Moreover, in the following description, if there is no need to distinguish the comparators 91L-1 to 91L-n individually, they are simply referred to as the comparator 91L, and if there is no need to distinguish the counters 92L-1 to 92L-n individually, they are simply referred to as the counter 92L.

Figure 3:
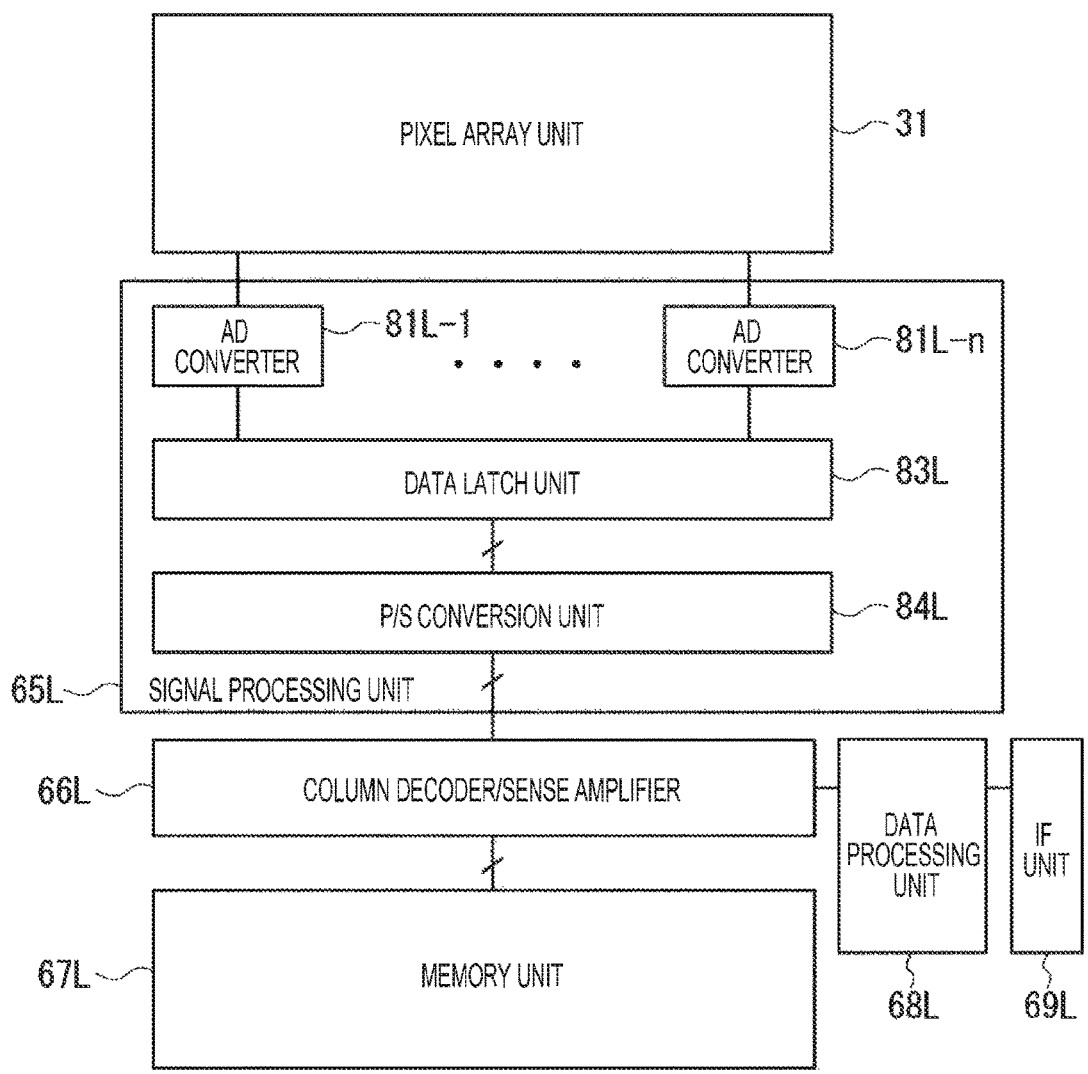
FIG. 3 is a block diagram illustrating a specific configuration example of a signal processing unit of the solid state imaging device according to the first embodiment.

FIG. 3 is a block diagram illustrating an example of a specific configuration of the signal processing unit 65L. The signal processing unit 65L includes a data latch unit 83L and a parallel-to-serial (hereinafter abbreviated as "P/S") conversion unit 84L in addition to the AD converter 81L and the reference voltage generation unit 82L. In addition, the signal processing unit 65L has a pipeline configuration where pixel data digitized by the AD converter 81L is pipeline transferred to the memory unit 67L. At this point in time, the signal processing unit 65L performs a digitization process by the AD converter 81L in one horizontal period, and performs a process of transferring the digitized pixel data to the data latch unit 83L in the next horizontal period.

On the other hand, the memory unit 67L is provided with the column decoder/sense amplifier 66L as its peripheral circuit. The above-mentioned row decoder 64L (see FIG. 2) specifies a row address for the memory unit 67L, whereas the column decoder specifies a column address for the memory unit 67L. Moreover, the sense amplifier amplifies a weak voltage readout from the memory unit 67L through a bit line to a level where it can be handled as a digital level. The pixel data read out through the column decoder/sense amplifier 66L is then output to the outside of the logic substrate 12 via the data processing unit 68L and the interface unit 69L.

Incidentally, here the case where the number of the column parallel AD converters 81L is one is taken as an example. The number of the column parallel AD converters 81L is not limited to one. A configuration can also be adopted in which two or more AD converters 81L are provided to perform the digitization process in parallel in the two or more AD converters 81L.

In this case, the two or more AD converters 81L are placed divided in, for example, the extension direction of the signal line 34 of the pixel array unit 31, that is, into both of the upper and lower sides of the pixel array unit 31. If two or more AD converters 81L are provided, two or more (systems of) data latch units 83L, P/S conversion units 84L, memory units 67L, and the like are also provided accordingly.

In this manner, in the solid state imaging apparatus 1 that adopts a configuration where, for example, two systems of the AD converters 81L and the like are provided, every two rows of pixels are scanned in parallel. Then, a signal of each pixel of one pixel row and a signal of each pixel of the other pixel row are read out to one side in the up-and-down direction of the pixel array unit 31 and the other side in the up-and-down direction of the pixel array unit 31, respectively. The two AD converters 81L perform the digitization process on them in parallel. Subsequent signal processing is also similarly performed in parallel. As a result, the pixel data is read out at a higher speed than a case where one pixel row is scanned at a time.

Incidentally, although detailed illustration and description are omitted, the signal processing circuit 41R also has a similar configuration to the signal processing circuit 41L. In addition, the signal processing circuit 41R mainly performs processing on pixel signals from the unit pixels 32 in the right-half area of the pixel array unit 31.

Incidentally, a reference sign of each unit of the signal processing circuit 41R, the illustration of which is omitted, is a reference sign having the letter R replaced with L included in a reference sign of each unit of the signal processing circuit 41L below.

{1-3. Layout of the Logic substrate 12}

Figure 4:
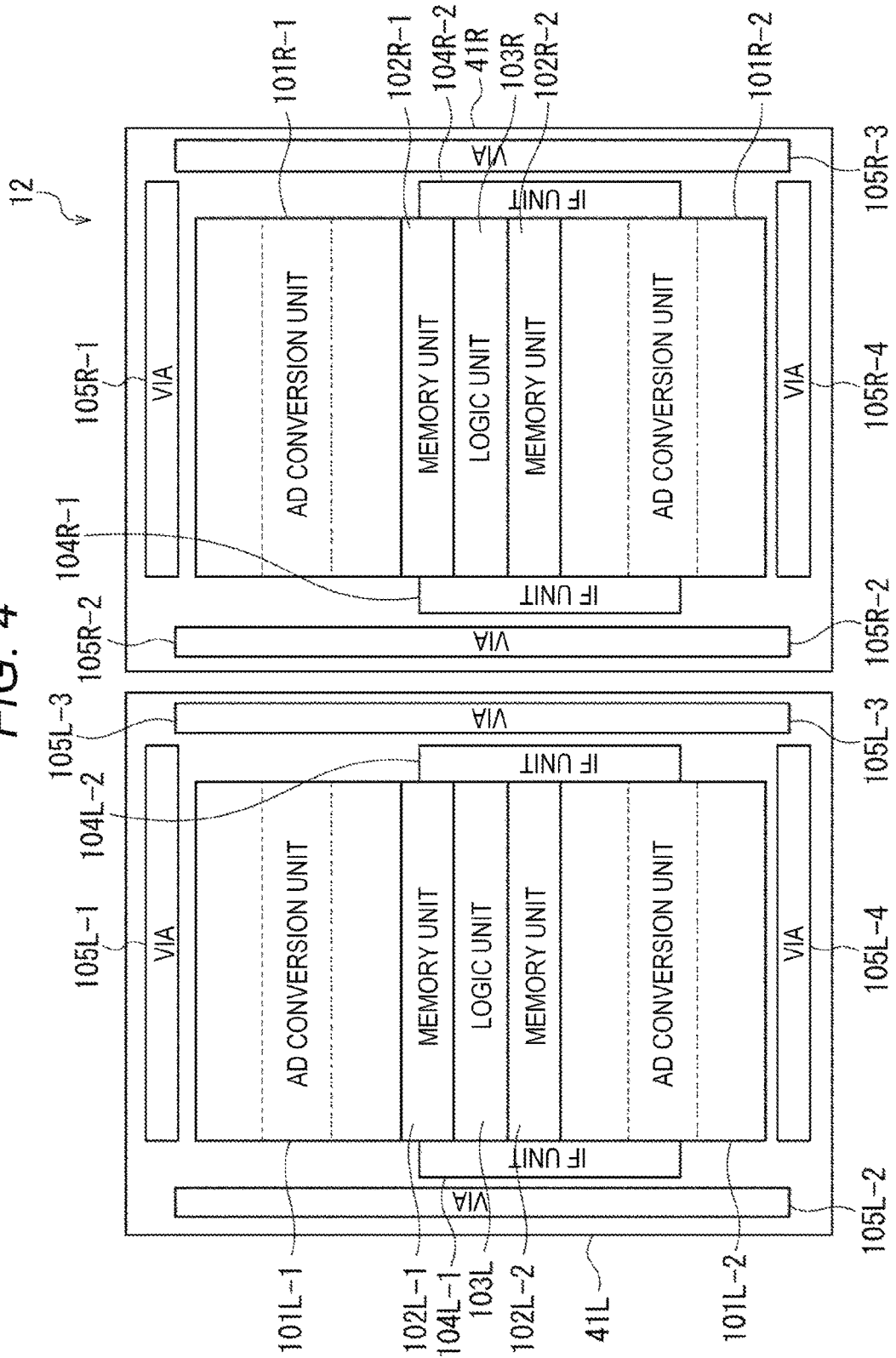
FIG. 4 is a diagram schematically illustrating the layout of a logic substrate of the solid state imaging device according to the first embodiment.

FIG. 4 illustrates an example of the layout of the logic substrate 12. As illustrated in FIG. 4, the signal processing circuits 41L and 41R of the logic substrate 12 have the same and left-right symmetric layout.

In the signal processing circuit 41L, an AD conversion unit 101L-1, a memory unit 102L-1, a logic unit 103L, a memory unit 102L-2, and an AD conversion unit 101L-2 are stacked sequentially from the top. Moreover, an interface unit 104L-1 and an interface unit 104L-2 are placed on the left and right of the stacked unit. Furthermore, vias 105L-1 to 105L-4 are placed respectively at upper, lower, left and right edges of the signal processing circuit 41L.

For example, the current sources 61L, the AD converters 81L-1 to 81L-n, the reference voltage generation units 82L, the data latch units 83L, and the P/S conversion units 84L illustrated in FIGS. 2 and 3 are divided and placed in the AD conversion units 101L-1 and 101L-2.

Incidentally, in this example, three layers each including the AD converter 81L and a circuit part accompanied by the AD converter 81L are stacked and placed in each of the AD conversion units 101L-1 and 101L-2. In other words, in the signal processing circuit 41L, the AD converters 81L and the accompanied circuit parts are placed divided into six systems. In addition, the signal processing circuit 41L scans, for example, every six pixel rows in parallel.

Moreover, pixel signals from the unit pixels 32 of the pixel array unit 31 are supplied to the AD converter 81L placed in the AD conversion units 101L-1 and 101L-2 via the vias 105L-1 to 105L-4.

For example, the column recorder/sense amplifier 66L and the memory unit 67L, which are illustrated in FIG. 3, are placed in each of the memory units 102L-1 and 102L-2. In addition, pixel data supplied from the AD conversion unit 101L-1 is stored in the memory unit 102L-1, and pixel data supplied from the AD conversion unit 101L-2 is stored in the memory unit 102L-2.

For example, the decoder 62L, the control unit 63L, the row decoder 64L, and the data processing unit 68L, which are illustrated in FIG. 2, are placed in the logic unit 103L.

For example, the interface unit 69L illustrated in FIG. 2 is placed in each of the interface units 104L-1 and 104L-2.

Incidentally, the signal processing circuit 41R has the same layout as the signal processing circuit 41L. The description is omitted since it is repetitive.

Moreover, the above-mentioned configuration and layout of the signal processing circuits 41L and 41R are examples. Configurations and layouts other than the above mentioned ones can also be adopted.

{1-4. Imaging Process of the Solid State Imaging Device 1}

Next, an imaging process of the solid state imaging device 1 is briefly described with reference to FIGS. 5 and 6.

Figure 5:
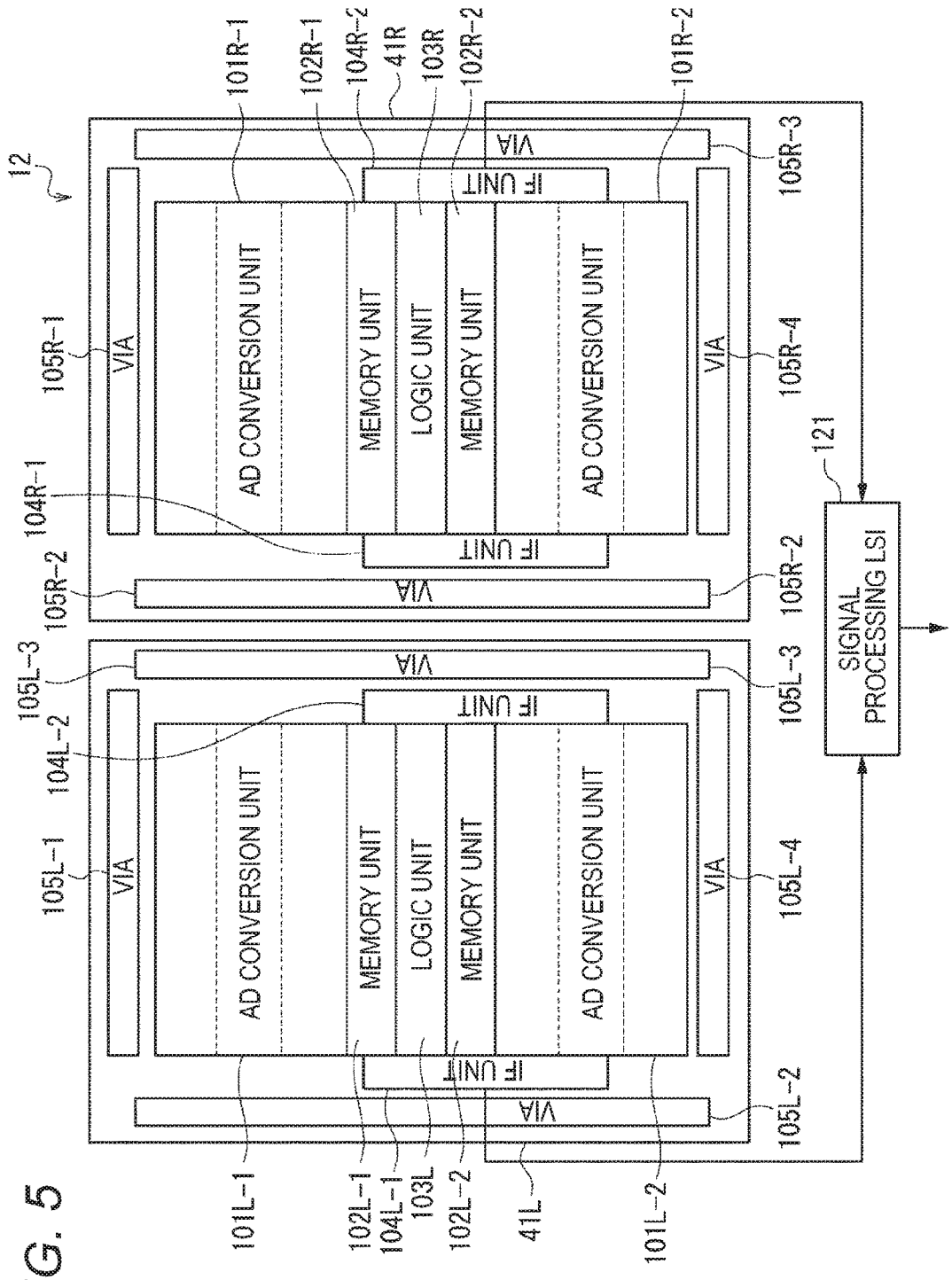
FIG. 5 is a diagram illustrating an example of a method for connecting the signal processing circuits.

FIG. 5 illustrates an example of a method for connecting the signal processing circuits 41L and 41R of the solid state imaging device 1 and an external signal processing LSI 121. Specifically, the interface unit 104L-1 of the signal processing circuit 41L and an interface unit 104R-2 of the signal processing circuit 41R are connected to the signal processing LSI 121.

Figure 6:
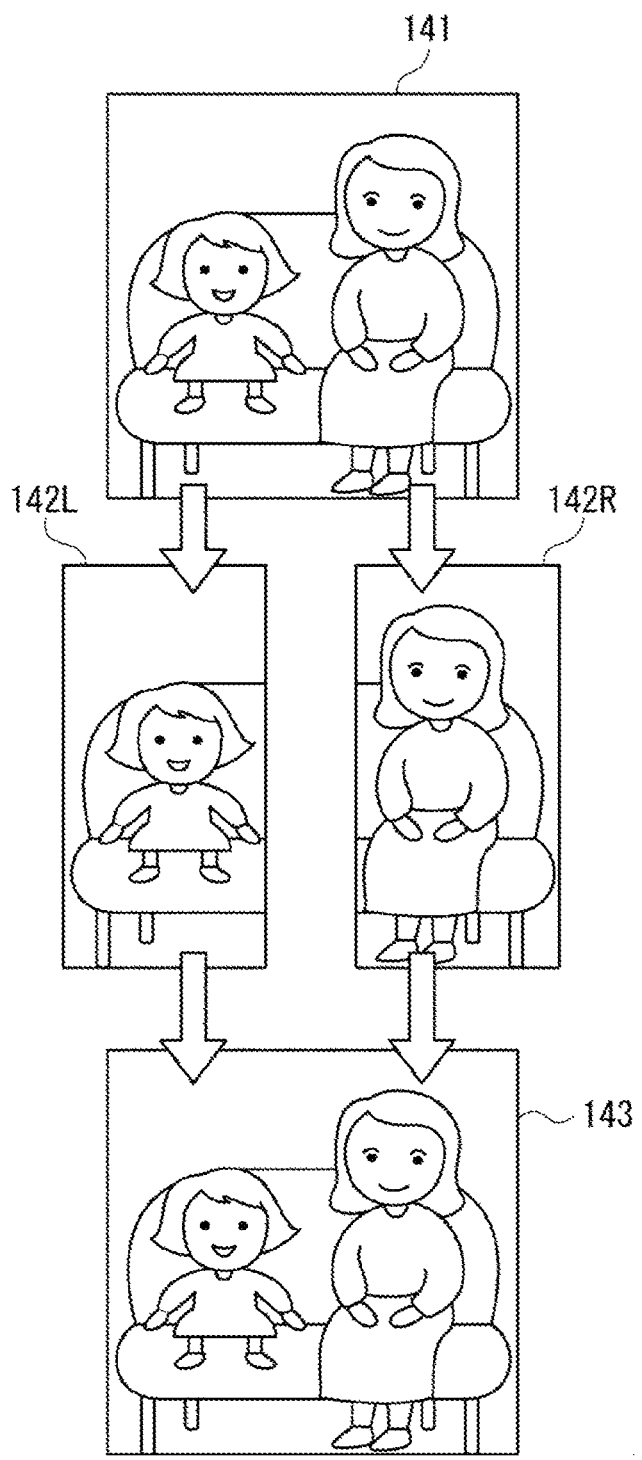
FIG. 6 is a diagram for describing an imaging process of the solid state imaging device according to the first embodiment.

If, for example, an object 141 of FIG. 6 is imaged with the solid state imaging device 1, pixel signals from the unit pixels 32 in the left-half area of the pixel array unit 31 are supplied to the signal processing circuit 41L, and pixel signals from the unit pixels 32 in the right-half area to the signal processing circuit 41R. In other words, pixel signals corresponding to the left half of the object 141 are supplied to the signal processing circuit 41L, and pixel signals corresponding to the right half of the object 141 to the signal processing circuit 41R.

The signal processing circuit 41L generates image data 142L corresponding to the left half of the object 141, using the pixel signals supplied from the pixel circuit 21. Similarly, the signal processing circuit 41R generates image data 142R corresponding to the right half of the object 141, using the pixel signals supplied from the pixel circuit 21.

The signal processing circuit 41L then outputs the generated image data 142L from the interface unit 104L-1, and supplies the image data 142L to the signal processing LSI 121. The signal processing circuit 41R outputs the generated image data 142R from the interface unit 104R-2, and supplies the image data 142R to the signal processing LSI 121.

The signal processing LSI 121 combines the image data 142L and the image data 142R, generates one sheet of image data 143, and outputs the generated image data 143.

In this manner, left and right sets of image data are generated independently in the solid state imaging device 1. Accordingly, processing speed can be increased.

{1-5. Method for Setting the Left and Right Signal Processing Circuits 41}

As described above, the signal processing circuits 41 have a common circuit pattern and the same functions. On the other hand, as described above, the signal processing circuit 41L generates image data of the left half of an object and outputs the generated image data from the left interface unit 104L-1. Moreover, the signal processing circuit 41R generates image data of the right half of the object, and outputs the generated image data from the right interface unit 104R-2. In other words, the signal processing circuit 41L operates as a circuit placed on the left side of the logic substrate 12, and the signal processing circuit 41R operates as a circuit placed on the right side of the logic substrate 12.

Hence, each signal processing circuit 41 has the functions of both of the left signal processing circuit 41L and the right signal processing circuit 41R to be able to operate as both of them. In addition, an external signal sets each signal processing circuit 41 regarding whether to operate as the left signal processing circuit 41L or the right signal processing circuit 41R. To put another way, the external signal sets the functions of each signal processing circuit 41 to enabled and disabled, respectively.

Figure 7:
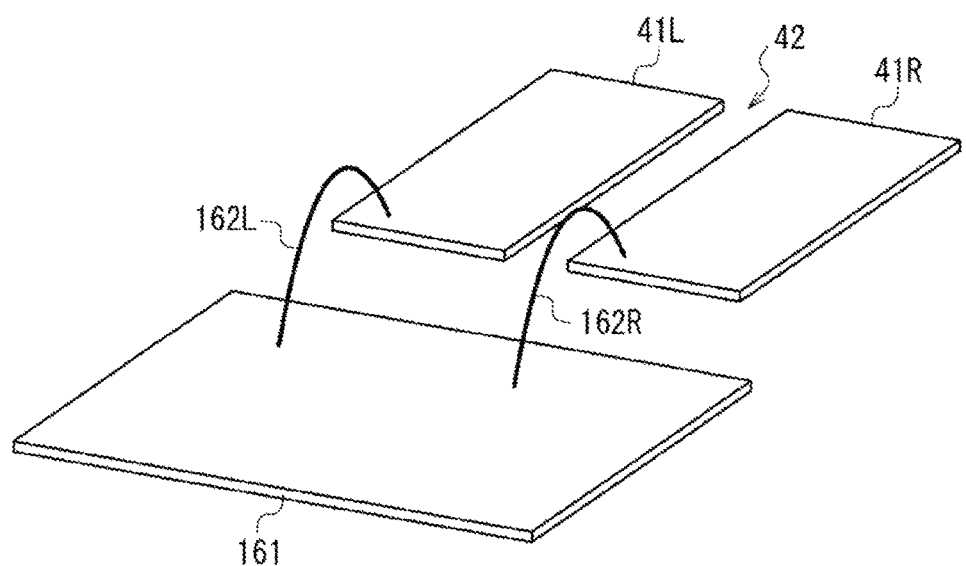
FIG. 7 is a diagram for describing setting methods for the left and right signal processing circuits.

Specifically, for example, the signal processing circuits 41L and 41R are connected to an external substrate 161 respectively by bonding wires 162L and 162R as illustrated schematically in FIG. 7. Incidentally, this substrate 161 may be provided within the same package as the solid state imaging device 1, or may be provided outside the package.

Figure 8:
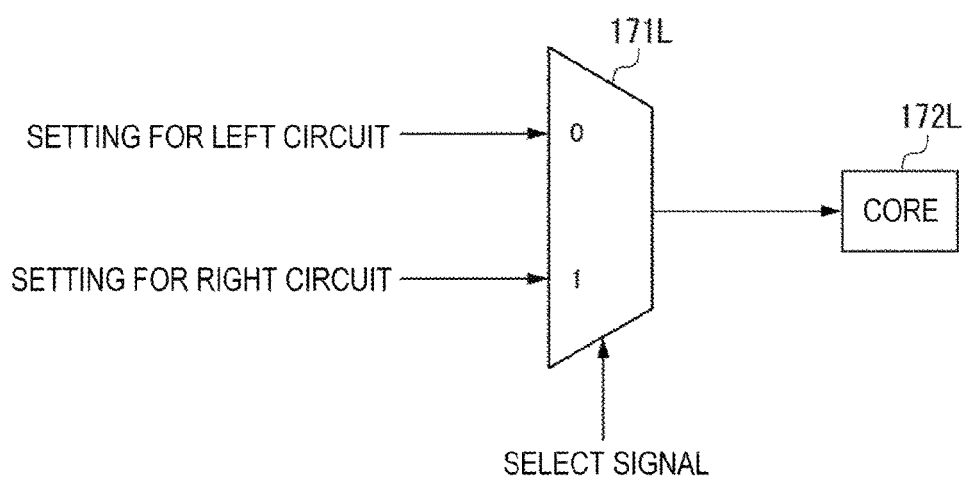
FIG. 8 is a diagram for describing the setting methods for the left and right signal processing circuits.

In addition, the substrate 161 supplies a select signal to the signal processing circuit 41L via a bonding wire 162L. The select signal takes, for example, a value of a power supply level (High) or ground level (Low). The signal processing circuit 41L includes multiplexer 171L and a core 172L, which are illustrated in FIG. 8. The select signal from the substrate 161 is then input into the multiplexer 171L. The multiplexer 171L supplies, to the core 172L, a setting signal indicating the value 0 or 1 in accordance with the select signal.

The setting signal has the value 0 if a setting is performed for the left circuit (the signal processing circuit 41L), and has the value 1 if a setting is performed for the right circuit (the signal processing circuit 41R). The core 172L then stores the value of the setting signal in an unillustrated register. The signal processing circuit 41L operates in accordance with the value of the register. For example, the value of the register of the signal processing circuit 41L is set to 0, and the signal processing circuit 41L then operates as the left signal processing circuit.

Incidentally, although illustration is omitted, the signal processing circuit 41R is also provided with a multiplexer 171R and a core 172R as in the signal processing circuit 41L. The signal processing circuit 41R is then set by a select signal supplied from the substrate 161 via the bonding wire 162R in a similar method to the signal processing circuit 41L to operate as the right signal processing circuit.

Moreover, the signal processing circuits 41L and 41R have the same functions so that the functions are redundant. Hence, in terms of functions that suffice if only one of them operates, this select signal enables those of one of the signal processing circuits 41 and disables those of the other signal processing circuit 41.

{1-6. Method for Manufacturing the Solid State Imaging Device 1}

Next, a method for manufacturing the solid state imaging device 1 is described with reference to FIGS. 9 to 13. Incidentally, in FIGS. 9 to 13, only the pixel circuits 21 and the signal processing circuits 41 are illustrated and the illustration of wafers (semiconductor substrates) on which the pixel circuits 21 and the signal processing circuits 41 are formed is omitted to facilitate the understanding of FIGS. 9 to 13.

Figure 9:
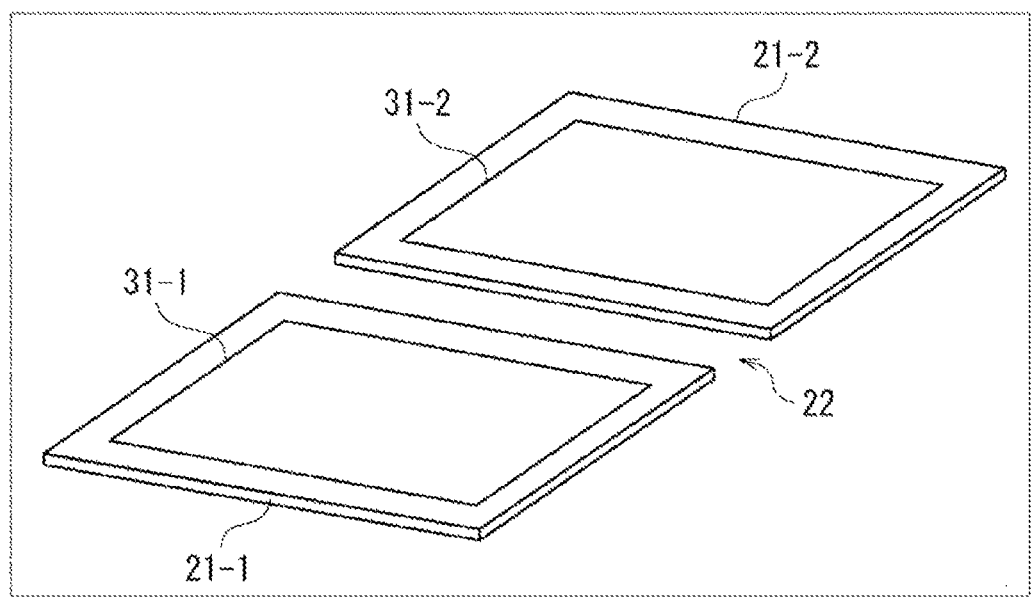
FIG. 9 is a diagram for describing a method for manufacturing the solid state imaging device according to the first embodiment.

Firstly, as illustrated in FIG. 9, pixel circuits 21-1 and 21-2, . . . are formed on the unillustrated wafer (semiconductor substrate). At this point in time, the area of each pixel circuit 21 is larger than the exposure field of the exposure apparatus. Therefore, split exposure is used for the exposure of each pixel circuit 21.

Moreover, scribe areas 22 are provided between adjacent pixel circuits 21 in a longitudinal direction and a lateral direction. Incidentally, in FIG. 9, the width of the scribe area 22 is exaggerated and illustrated larger than actually it is to facilitate the understanding of FIG. 9. The same shall apply to the subsequent drawings.

Moreover, in FIG. 9, only two pixel circuits 21 in two rows and one column are illustrated. However, in reality more pixel circuits 21 are formed in such a manner as to be two-dimensionally arranged.

Figure 10:
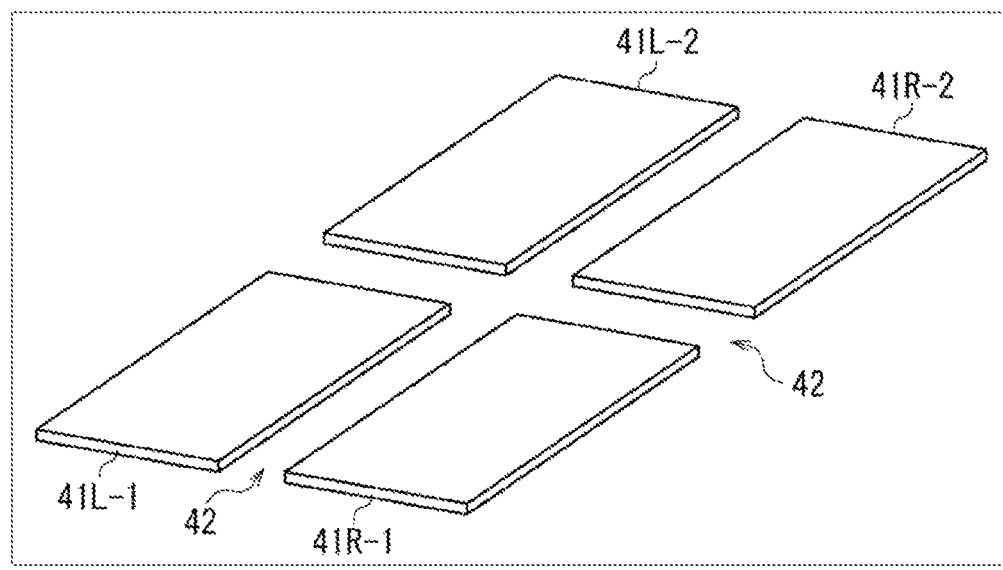
FIG. 10 is a diagram for describing the method for manufacturing the solid state imaging device according to the first embodiment.

Moreover, with a manufacturing process different from FIG. 9, signal processing circuits 41L-1, 41R-1, 41L-2, 42R-2, . . . are formed on the unillustrated wafer (semiconductor substrate) as illustrated in FIG. 10. Of them, the signal processing circuits 41L-1 and 41R-1 are placed in the same logic substrate 12, and the signal processing circuits 41L-2 and 41R-1 are placed in the same logic substrate 12. At this point in time, the area of each signal processing circuit 41 is smaller than the exposure field of the exposure apparatus. Accordingly, one-shot exposure is used for the exposure of each signal processing circuit 41.

Moreover, scribe areas 42 are provided between adjacent signal processing circuits 41 in a longitudinal direction and a lateral direction. Naturally the scribe area 42 is also provided between the signal processing circuits 41 placed in the same logic substrate 12.

Moreover, in FIG. 10, only four signal processing circuits 41 in two rows and two columns are illustrated. However, in reality more signal processing circuits 41 are formed in such a manner as to be two-dimensionally arranged.

Figure 11:
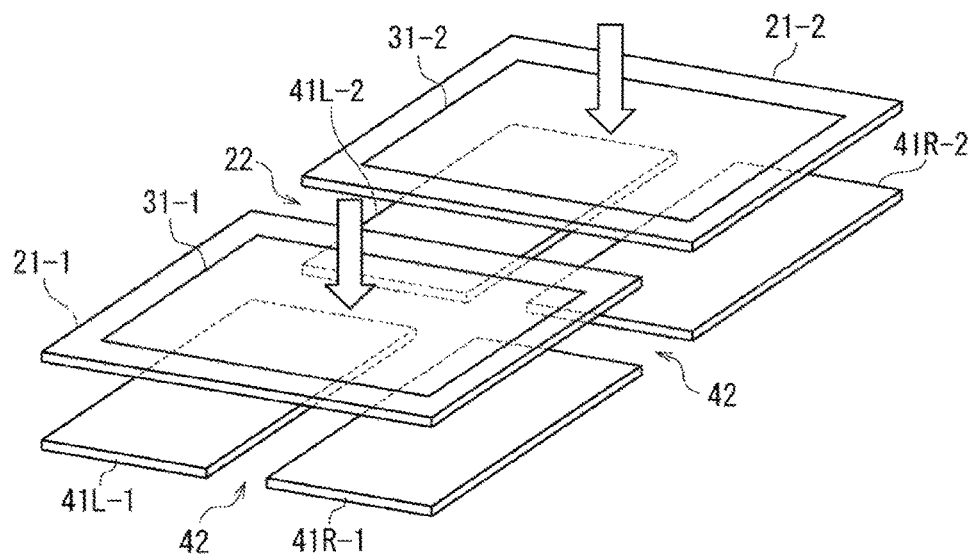
FIG. 11 is a diagram for describing the method for manufacturing the solid state imaging device according to the first embodiment.

Next, as illustrated in FIG. 11, the wafer on which the pixel circuits 21 are formed (hereinafter referred to as the pixel wafer) and the wafer on which the signal processing circuits 41 are formed (hereinafter referred to as the logic wafer) are bonded to stack the pixel wafer and the logic wafer.

Here the area of the signal processing circuits 41 adjacent side by side across the scribe area 42 is substantially the same as that of the pixel circuit 21. The pixel wafer and the logic wafer are stacked in such a manner as to superpose the scribe area 22 of the pixel wafer on the scribe area 42 of the logic wafer. Consequently, the pixel circuit 21 is precisely overlaid on the signal processing circuits 41 that are adjacent side by side. For example, the pixel circuit 21-1 is precisely overlaid on the signal processing circuits 41L-1 and 41R-2 that are adjacent side by side across the scribe area 42.

Moreover, the solid state imaging device 1 is back illuminated. The pixel wafer and the logic wafer are stacked such that a substrate layer where the pixel circuits 21 of the logic wafer are formed faces up and wiring layers of the logic wafer and wiring layers of the pixel wafer are adjacent to each other.

Incidentally, the wafer obtained by stacking the pixel wafer and the logic wafer is referred to as the stacked wafer below.

Figure 12:
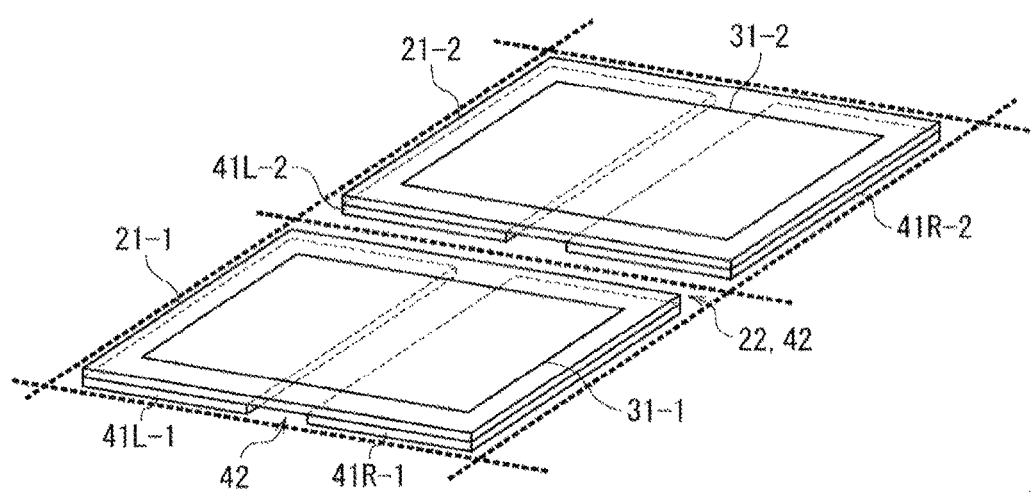
FIG. 12 is a diagram for describing the method for manufacturing the solid state imaging device according to the first embodiment.

Next, as indicated by bold dotted lines of FIG. 12, the stacked wafer is cut into chips. In other words, the stacked wafer is cut along the scribe areas 22, provided around the pixel circuits 21, of the pixel wafer. Incidentally, the scribe areas 42 of the logic wafer that are not superposed on the scribe areas 22 of the pixel wafer are left uncut as they are.

Figure 13:
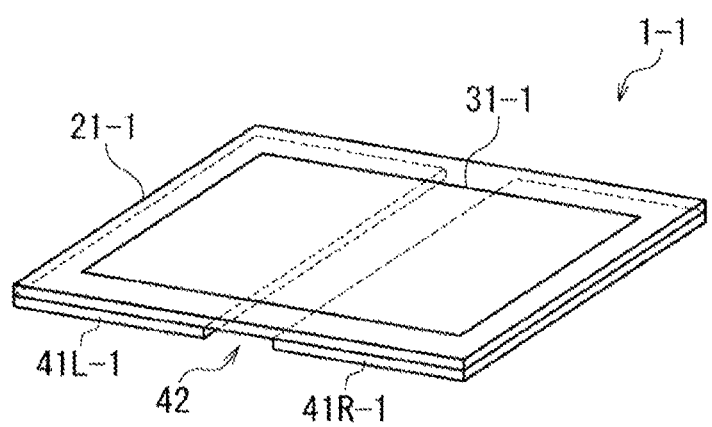
FIG. 13 is a diagram for describing the method for manufacturing the solid state imaging device according to the first embodiment.

Consequently, the solid state imaging device where the pixel circuit 21 is stacked on the signal processing circuits 41 adjacent side by side with the uncut scribe area 42 is separated as a single piece. For example, as illustrated in FIG. 13, a solid state imaging device 1-1 where the pixel circuit 21-1 is stacked on the signal processing circuits 41L-1 and 41R-1 adjacent across the scribe area 42 is separated as a single piece.

In this manner, even if the area of the pixel circuit 21 on the pixel substrate 11 side is larger than the exposure field of the exposure apparatus and therefore split exposure is required, each signal processing circuit 41 on the logic substrate 12 side is manufactured by one-shot exposure without using split exposure. Moreover, the signal processing circuits 41 with the same circuit pattern are formed in such a manner as to be two-dimensionally arranged, leaving a predetermined space (the scribe area 42) therebetween, irrespective of on which of the left and right sides of the solid state imaging device 1 each signal processing circuit 41 is placed. Therefore, for example, it is possible to reduce the number of types of photomasks required to manufacture the logic substrate 12 and also manufacture the logic substrate 12 with an exposure apparatus that does not have a photomask replacement apparatus.

2. Second Embodiment

As described above, in the solid state imaging device 1, two signal processing circuits are not electrically connected, and perform processing independently of each other. In contrast, in a second embodiment of the present technology, two signal processing circuits are electrically connected and perform part of the processing in coordination.

{2-1. System Configuration}

Figure 14:
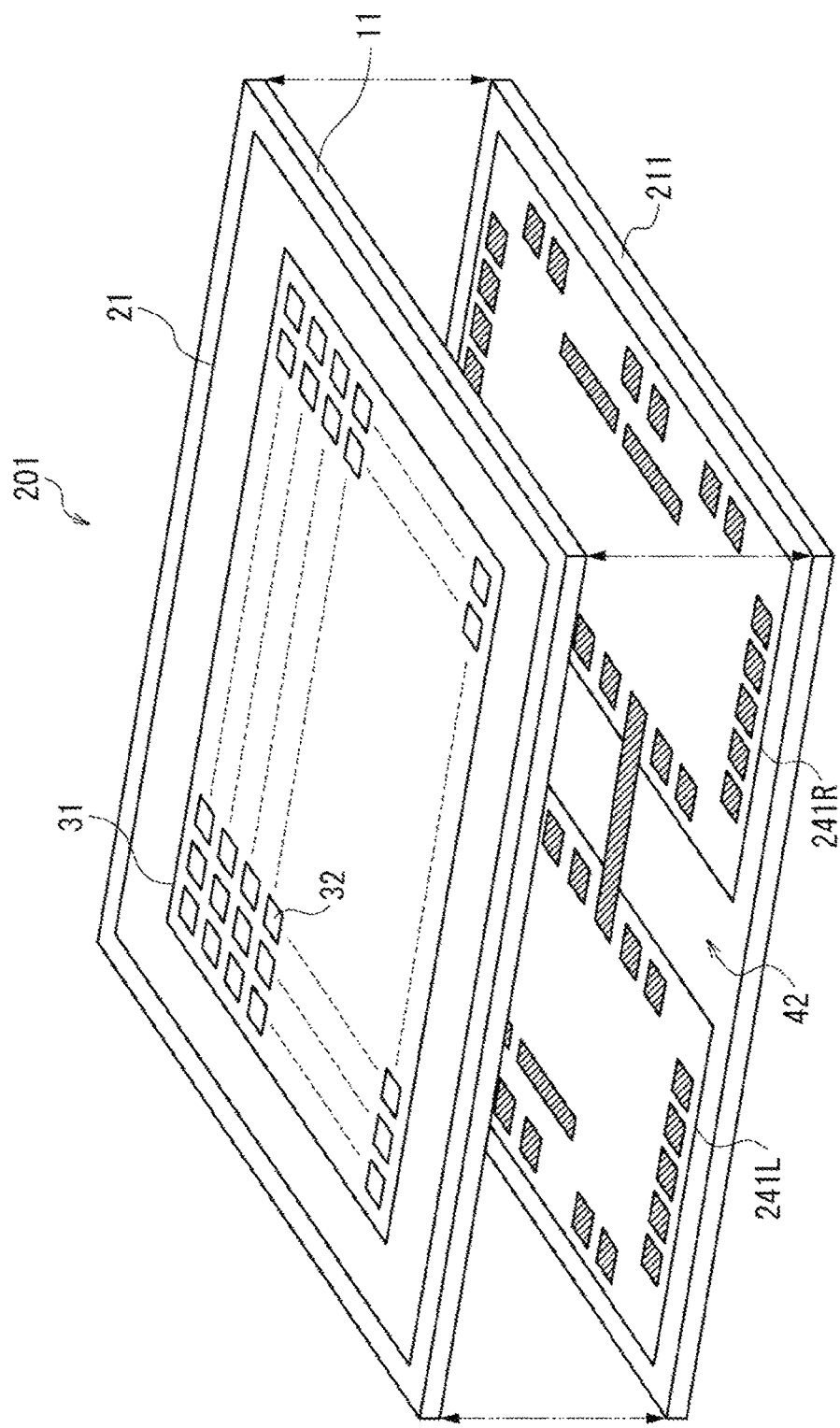
FIG. 14 is a perspective view schematically illustrating a solid state imaging device according to a second embodiment of the present technology.

FIG. 14 is a perspective view schematically illustrating a configuration example of a solid state imaging device 201 according to the second embodiment of the present technology. Incidentally, in FIG. 14, the same reference signs are assigned to portions corresponding to FIG. 1 and the description of portions that perform the same processes is omitted as appropriate since it is repetitive.

As illustrated in FIG. 14, the solid state imaging device 201 is a semiconductor chip with a structure where the pixel substrate 11 and a logic substrate 211 are stacked (what is called a stacked structure) as in the solid state imaging device 1.

The logic substrate 211 is different from the logic substrate 12 in that, instead of the signal processing circuits 41L and 41R, signal processing circuits 241L and 241R are provided. Moreover, the logic substrate 211 is different from the logic substrate 12 in that a wiring layer for electrically connecting the signal processing circuits 241L and 241R (hereinafter referred to as the inter-circuit wiring layer) is formed in the uppermost layer of the logic substrate 12. In other words, shaded patterns on the logic substrate 211 of FIG. 14 indicate wiring patterns of the inter-circuit wiring layer. The signal processing circuits 241L and 241R are electrically connected in this inter-circuit wiring layer.

Moreover, the signal processing circuits 241L and 241R are different in part of the layout from the signal processing circuits 41L and 41R as described below with reference to FIG. 15.

Incidentally, if there is no need to distinguish the signal processing circuits 241L and 241R individually, they are simply referred to as the signal processing circuit 241 below.

{2-2. Layout of the Logic substrate 211}

Figure 15:
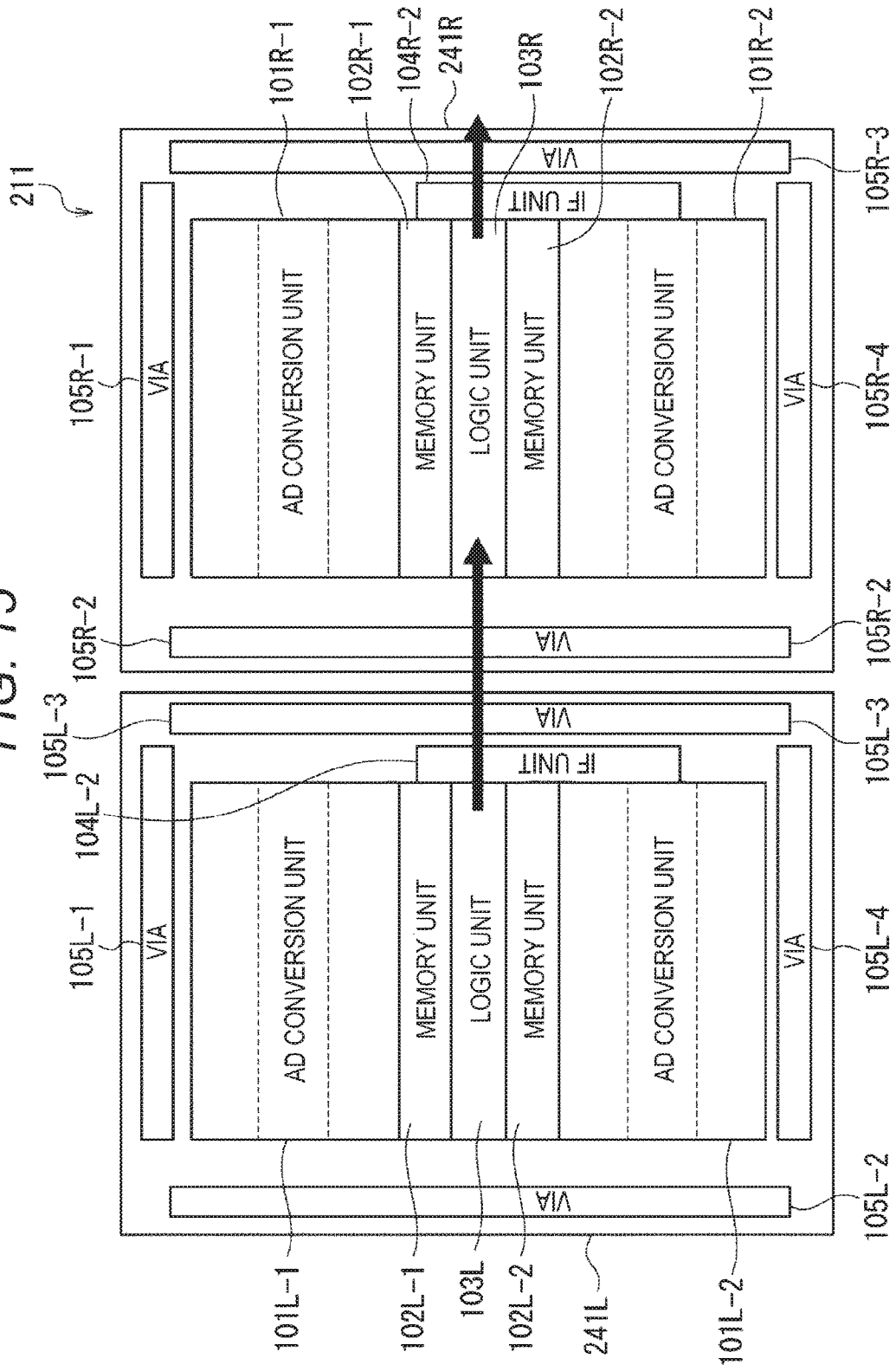
FIG. 15 is a diagram for describing an imaging process of the solid state imaging device according to the second embodiment.

FIG. 15 illustrates an example of the layout of the logic substrate 211. Incidentally, in FIG. 15, the illustration of the inter-circuit wiring layer is omitted. Moreover, in FIG. 15, the same reference signs are assigned to portions corresponding to FIG. 4. The description of portions that perform the same processes and the like is omitted as appropriate.

The signal processing circuit 241L is different from the signal processing circuit 41L of FIG. 4 in that the interface unit 104L-1 is eliminated and only the interface unit 104L-2 is provided. Similarly, the signal processing circuit 241R is different from the signal processing circuit 41R of FIG. 4 in that the interface unit 104R-1 is eliminated and only the interface unit 104R-2 is provided.

{2-3. Imaging Process of the Solid State Imaging Device 201}

Next, an imaging process of the solid state imaging device 201 is briefly described with reference to FIGS. 6 and 15.

If, for example, the object 141 of FIG. 6 is imaged with the solid state imaging device 201, pixel signals from the unit pixels 32 in the left-half area of the pixel array unit 31 are supplied to the signal processing circuit 241L. Pixel signals from the unit pixels 32 in the right-half area are supplied to the signal processing circuit 241R. In other words, pixel signals corresponding to the left half of the object 141 are supplied to the signal processing circuit 241L, and pixel signals corresponding to the right half of the object 141 are supplied to the signal processing circuit 241R.

The signal processing circuit 241L generates the image data 142L corresponding to the left half of the object 141, using the pixel signals supplied from the pixel circuit 21.

Similarly, the signal processing circuit 241R generates the image data 142R corresponding to the right half of the object 141, using the pixel signals supplied from the pixel circuit 21.

The processing up to this point is similar to the above-mentioned solid state imaging device 1.

The logic unit 103L of the signal processing circuit 241L then supplies the generated image data 142L to a logic unit 103R of the signal processing circuit 241R via the unillustrated inter-circuit wiring layer.

The logic unit 103R combines the image data 142L supplied from the signal processing circuit 241L and the image data 142R created by itself, and generates one sheet of the image data 143. The logic unit 103R then outputs the generated image data 143 to the outside via the interface unit 104R-2.

In this manner, the solid state imaging device 201 can generate and output one complete sheet of image data without using a device such as an external LSI unlike the solid state imaging device 1. Therefore, the necessity of providing the signal processing LSI 121 externally is eliminated; accordingly, cost reduction can be promoted.

Incidentally, also in the solid state imaging device 201, the signal processing circuits 241L and 241R are set regarding whether to operate as the left or right side signal processing circuit, by the method described above with reference to FIGS. 7 and 8 as in the solid state imaging device 1.

[Method for Manufacturing the Solid State Imaging Device 201]

Next, a method for manufacturing the solid state imaging device 201 is described with reference to the above-illustrated FIGS. 9 and 10, and FIGS. 16 to 19. Incidentally, in FIGS. 16 to 19, only the pixel circuits 21 and the signal processing circuits 241 are illustrated and the illustration of wafers (semiconductor substrates) of the pixel circuits 21 and the signal processing circuits 241 are formed is omitted to facilitate the understanding of FIGS. 16 to 19 as in FIGS. 9 to 13.

Firstly, a pixel wafer on which the pixel circuits 21 are two-dimensionally arranged across the scribe areas 22, and a logic wafer on which the signal processing circuits 241 are two-dimensionally arranged across the scribe areas 42 are manufactured in a similar method to the method described above with reference to FIGS. 9 and 10.

Figure 16:
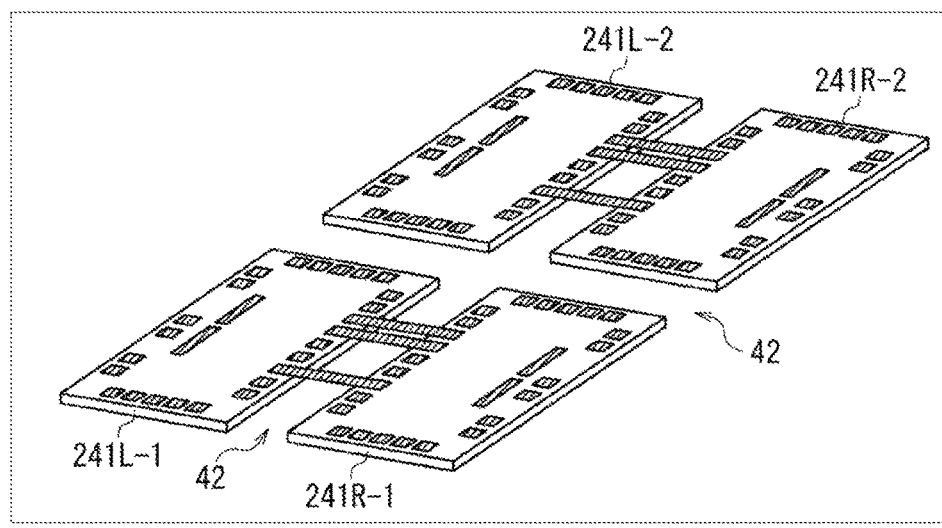
FIG. 16 is a diagram for describing a method for manufacturing the solid state imaging device according to the second embodiment.

Next, as illustrated in FIG. 16, the inter-circuit wiring layer is formed in the uppermost layer of the logic wafer. Incidentally, the inter-circuit wiring layer is of substantially the same size as the pixel circuit 21 of the pixel substrate 11 and accordingly is formed using split exposure. The inter-circuit wiring layer connects two signal processing circuits 241 (for example, signal processing circuits 241L-1 and 241R-1) placed in the same solid state imaging device 201 electrically.

Incidentally, for example, a manufacturer who manufactures logic wafers may manufacture a logic wafer before exposure on which a metal film for the inter-circuit wiring layer has simply been deposited, and deliver it to a manufacture who manufactures the solid state imaging devices 201. Then, for example, the manufacturer who manufactures the solid state imaging devices 201 may form the inter-circuit wiring layer of the logic wafer by split exposure and then stack the pixel wafer and the logic wafer. Consequently, even a manufacturer who does not have a facility for split exposure can manufacture the logic wafer.

Figure 17:
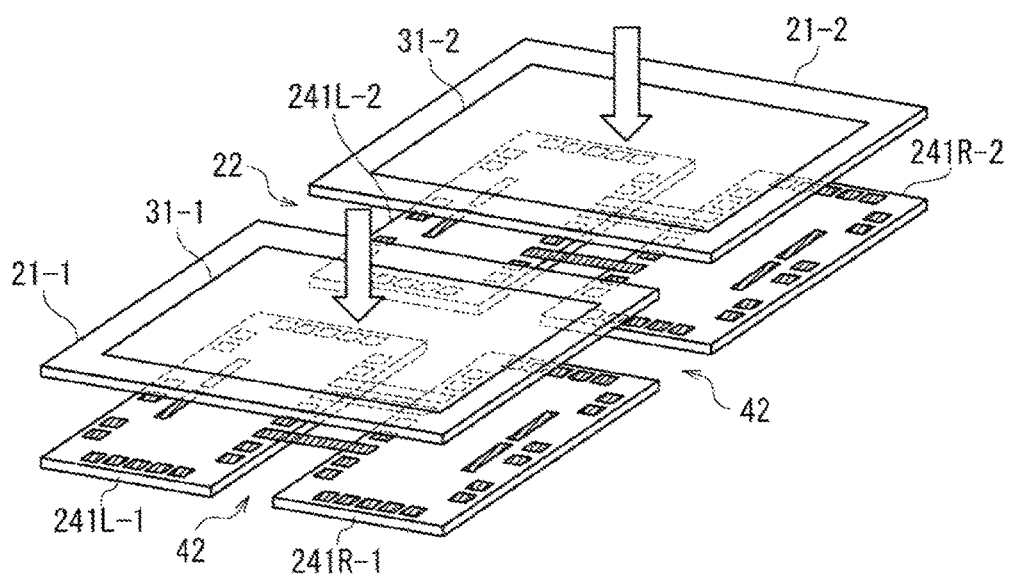
FIG. 17 is a diagram for describing the method for manufacturing the solid state imaging device according to the second embodiment.

Next, as illustrated in FIG. 17, the pixel wafer and the logic wafer are stacked as in the manufacturing process described above with reference to FIG. 11.

Figure 18:
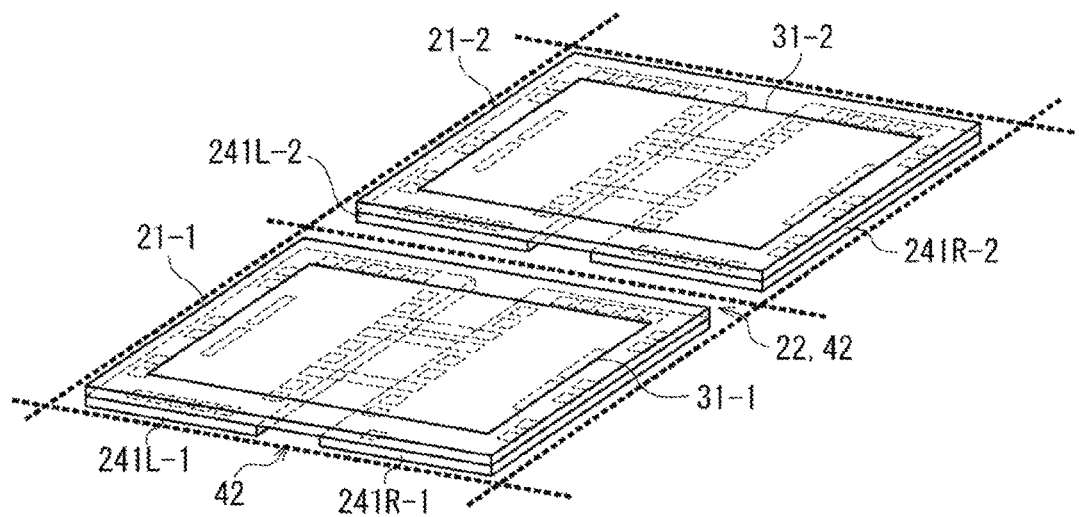
FIG. 18 is a diagram for describing the method for manufacturing the solid state imaging device according to the second embodiment.
Figure 19:
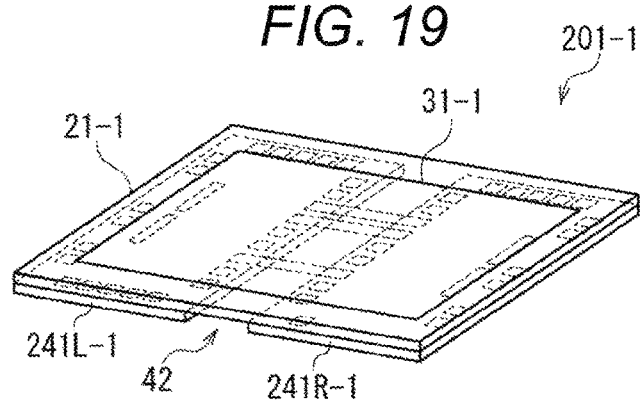
FIG. 19 is a diagram for describing the method for manufacturing the solid state imaging device according to the second embodiment.

As illustrated in FIG. 18, the stacked wafer is then cut into chips as in the manufacturing process described above with reference to FIG. 12. Consequently, for example, a solid state imaging device 201-1 where the pixel circuit 21-1 is stacked on the signal processing circuits 241L-1 and 241R-1 that are adjacent across the scribe area 42 is separated as one piece as illustrated in FIG. 19.

Incidentally, in the above-mentioned example, the example where the inter-circuit wiring layer is formed in the uppermost layer of the logic substrate 211 is illustrated. However, the inter-circuit wiring layer may be formed in a layer below the uppermost layer. If, for example, a plurality of wiring layers is provided to the signal processing circuit 241, the signal processing circuits 241L and 241R may be connected in a wiring layer formed below the uppermost layer of the logic substrate 211.

Moreover, for example, the signal processing circuits 241L and 241R may be connected via a plurality of wiring layers. In other words, a plurality of inter-circuit wiring layers may be formed. Furthermore, not only a wire for connecting the signal processing circuits 241L and 241R but also a wire in each signal processing circuit 241 (for example, a wire between devices) can also be provided in the inter-circuit wiring layer.

Moreover, also if the inter-circuit wiring layer is placed in any of layers of the logic substrate 211, among the layers of the logic substrate 211, for example, the inter-circuit wiring layer is formed by split exposure and the other layers are formed by one-shot exposure. Incidentally, if the inter-circuit wiring layer is formed by a different manufacturer as described above, the inter-circuit wiring layer is desired to be formed in the uppermost layer of the logic substrate 211.

3. Third Embodiment

In a third embodiment of the present technology, left and right signal processing circuits are electrically connected by a different method from the one of the second embodiment.

Figure 20:
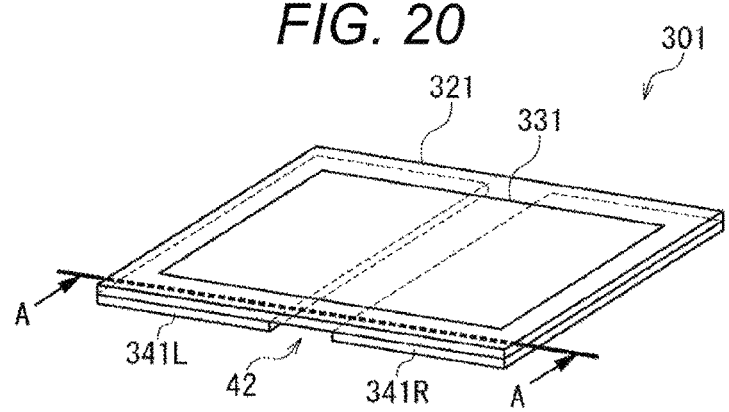
FIG. 20 is a perspective view schematically illustrating a solid state imaging device according to a third embodiment of the present technology.

Specifically, FIG. 20 is a perspective view schematically illustrating a configuration example of a solid state imaging device 301 according to the third embodiment of the present technology. The solid state imaging device 301 is a semiconductor chip with a structure where a pixel substrate 311 (FIG. 21) in which a pixel circuit 321 is formed and a logic substrate 312 (FIG. 21) in which signal processing circuits 341L and 341R are formed are stacked (what is called a stacked structure) as in the solid state imaging devices 1 and 201.

A pixel array unit 331 similar to the pixel array unit 31 of the pixel circuit 21 of FIG. 1 is formed in the pixel circuit 321. Moreover, the pixel circuit 321 has a circuit configuration similar to that of the pixel circuit 21 described above with reference to FIG. 2. The signal processing circuits 341L and 341R have a similar circuit configuration to that of the signal processing circuits 41L and 41R described above with reference to FIGS. 2 and 3. The logic substrate 312 has a similar layout to that of the logic substrate 12 described above with reference to FIG. 4. In this manner, the solid state imaging device 301 has a substantially similar circuit configuration and layout to those of the solid state imaging device 1.

However, the solid state imaging device 301 is different from the solid state imaging device 1 in that the signal processing circuits 341L and 341R are electrically connected in the pixel substrate 311.

Figure 21:
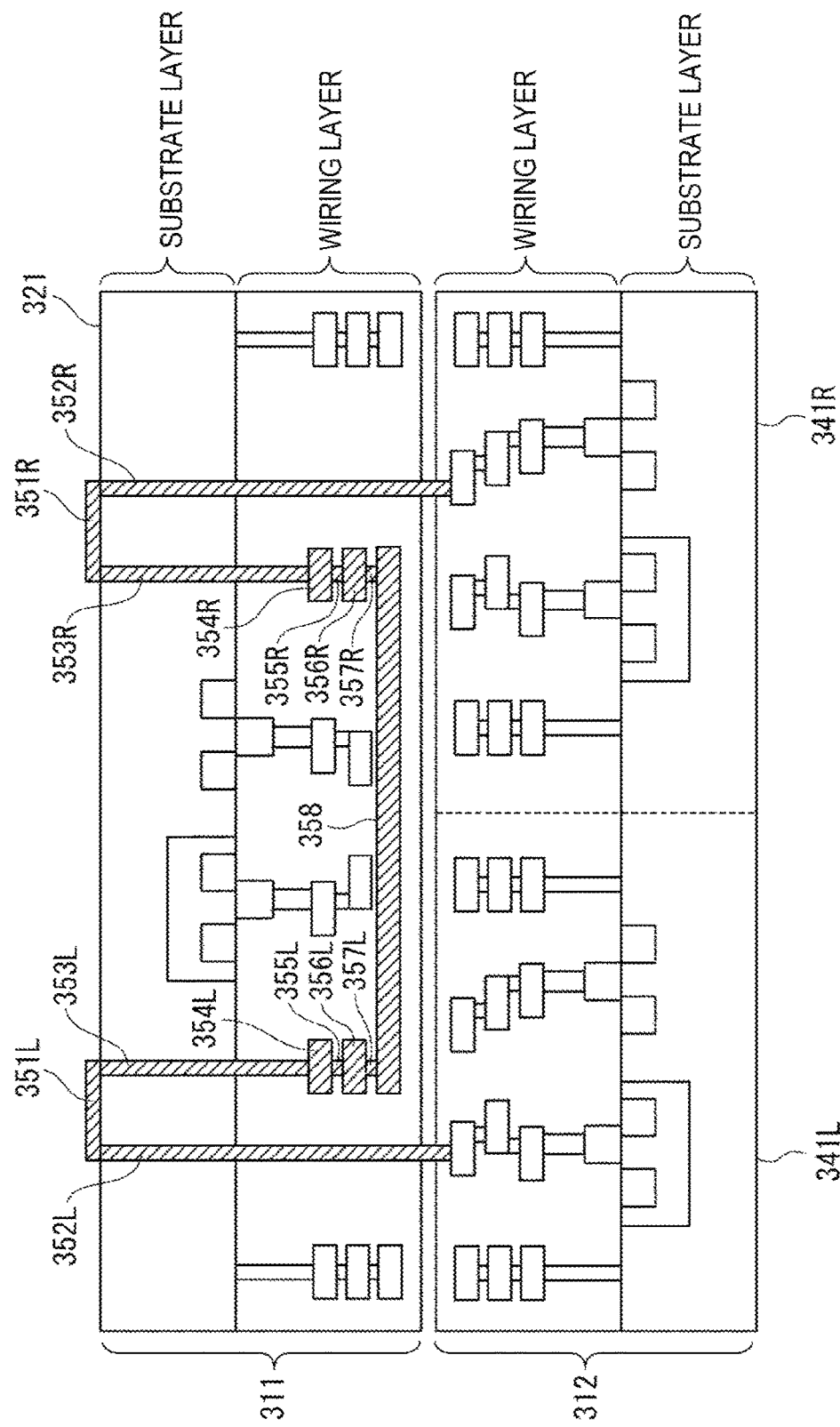
FIG. 21 is a cross-sectional view schematically illustrating the solid state imaging device according to the third embodiment of the present technology.

Specifically, FIG. 21 illustrates an A-A cross-sectional view of the solid state imaging device 301 of FIG. 20. In other words, FIG. 21 illustrates a cross section of the solid state imaging device 301 outside the pixel array unit 331 of the pixel circuit 321 and on the front side in FIG. 20.

The solid state imaging device 301 is a back-illuminated imaging device; accordingly, the pixel substrate 311 and the logic substrate 312 are stacked in such a manner that their wiring layers are adjacent to each other. Therefore, a substrate layer of the pixel substrate 311 is placed on the top side and a substrate layer of the logic substrate 312 is placed on the bottom side.

Wires 351L and 351R are formed outside the pixel array unit 331 on the substrate layer of the pixel substrate 311. The wire 351L is placed above the signal processing circuit 341L. The wire 351R is placed above the signal processing circuit 341R.

In addition, the wire 351L is connected to a wiring layer of the signal processing circuit 341L via a via 352L formed in the pixel substrate 311. Moreover, the wire 351L is connected to a wire 354L via a via 353L. The wire 354L is connected to a wire 356L via a via 355L. The wire 356L is connected to a wire 358 via a via 357L.

The wire 351R is connected to a wiring layer of the signal processing circuit 341R via a via 352R formed in the pixel substrate 311. Moreover, the wire 351R is connected to a wire 354R via a via 353R. The wire 354R is connected to a wire 356R via a via 355R. The wire 356R is connected to the wire 358 via a via 357R.

Consequently, the wiring layer of the signal processing circuit 341L and the wiring layer of the signal processing circuit 341R are electrically connected via the via 352L, the wire 351L, the via 353L, the wire 354L, the via 355L, the wire 356L, the via 357L, the wire 358, the via 357R, the wire 356R, the viva 355R, the wire 354R, the via 353R, the wire 351R, and the via 352R.

Therefore, the solid state imaging device 301 can also generate and output one sheet of image data obtained by imaging an object by the method described above with reference to FIGS. 6 and 15, as in the solid state imaging device 201.

Incidentally, the wires 351L and 351R, the vias 352L and 352R, and the like of the pixel circuit 321 are formed upon, for example, the manufacture of the pixel wafer described above with reference to FIG. 9.

Moreover, the number of wiring layers of the pixel substrate 311 of FIG. 21 is an example of the number of wiring layers and can be set to any given number. Furthermore, for example, the wire 358 for electrically connecting the signal processing circuits 341L and 341R in the wiring layer of the pixel substrate 311 may be provided in any wiring layer of the pixel substrate 311, and also, for example, may be formed divided into a plurality of wiring layers.

4. Modifications

Modifications of the above-mentioned embodiments of the present technology are described below.

{5-1. Modifications Related to the Configuration of the Solid State Imaging Device}
(Modification Related to the Logic Substrate)

In the above description, the example where two signal processing circuits are provided to the logic substrate is illustrated. However, three or more signal processing circuits can also be provided.

Moreover, the circuit patterns and sizes of all signal processing circuits provided to one logic substrate are not necessarily required to be the same. Signal processing circuits respectively having different circuit patterns and sizes can also be coresident. However, the manufacturing process is simpler and therefore the manufacturing cost is lower if signal processing circuits having the same circuit pattern are provided to the logic substrate than if signal processing circuits having different circuit patterns and sizes are coresident.

(Modification Related to the Stacked Structure)

Moreover, in the above description, the example is illustrated in which the solid state imaging device has a dual-layer stacked structure including the pixel substrate and the logic substrate. However, the present technology can also be applied to a solid state imaging device of a stacked structure of three or more layers. For example, another logic substrate may be further stacked below the logic substrate 12 of FIG. 1 (that is, a surface, which is opposite to a surface adjacent to the pixel substrate 11, of the logic substrate 12). In this case, for example, it is conceivable to place the memory units 102L-1 to 102R-2 included in the signal processing circuits 41L and 41R in the added logic substrate in the lowermost layer.

Moreover, if two or more logic substrate layers are provided, the logic substrates in all the layers are not necessarily required to be manufactured using one-shot exposure. Part of the logic substrates may be manufactured using split exposure. For example, in the above-mentioned example, the logic substrate in the lowermost layer provided with the memory units 102L-1 to 102R-2 may be manufactured using split exposure.

Furthermore, as described above, the logic substrates in all the layers are not necessarily required to be manufactured using one-shot exposure if, for example, signal processing circuits are connected in the logic substrates, and part of the layers may be manufactured using split exposure.

(Modification Related to a Method for Connecting the Signal Processing Circuits)

Furthermore, in the second and third embodiments of the present technology, the example is illustrated in which the left and right signal processing circuits are electrically connected in the solid state imaging device. However, the left and right signal processing circuits may be connected outside the solid state imaging device.

Figure 22:
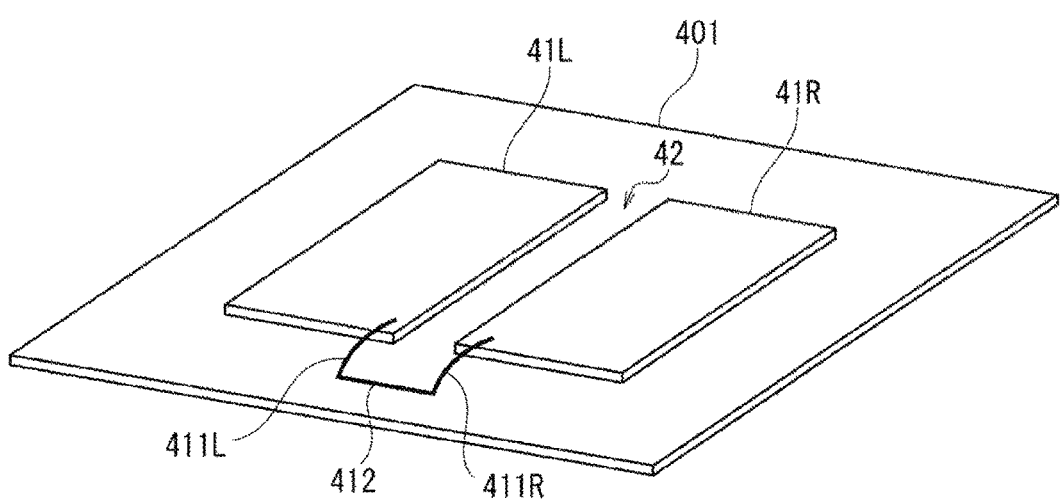
FIG. 22 is a diagram illustrating an example of a method for connecting signal processing circuits.

FIG. 22 illustrates an example where the signal processing circuits 41L and 41R of the solid state imaging device 1 are connected outside the solid state imaging device 1. Incidentally, in this example, the solid state imaging device 1 is housed in a package 401. Moreover, in FIG. 22, only the signal processing circuits 41L and 41R of the solid state imaging device 1 are illustrated to facilitate the understanding of FIG. 22.

The signal processing circuit 41L is connected to a conductive pattern 412 formed in the package 401 via a bonding wire 411L. Similarly, the signal processing circuit 41R is connected to the conductive pattern 412 via a bonding wire 411R. Therefore, the signal processing circuits 41L and 41R are electrically connected via the bonding wires 411L and 411R and the conductive pattern 412.

Incidentally, in addition to this, the signal processing circuits 41L and 41R may be electrically connected outside via a lead frame and the like.

Moreover, the number of mountable wires is limited if the signal processing circuits 41L and 41R are connected outside the solid state imaging device 1 as compared to if they are connected inside. Hence, it is assumed that it may be difficult to combine left and right sets of image data in the solid state imaging device 1. In this case, for example, a signal line of a predetermined same analog signal between the signal processing circuits 41L and 41R (for example, a reference voltage signal line or a ground line) may be connected to achieve commonality of the analog signal.

For example, if different signal processing circuits 41 generate left and right sets of image data, differences may occur in color and brightness between the left and right sets of image data due to differences in the characteristics and the like of each signal processing circuit 41; accordingly, the boundary of the combined portion of the two sets of image data may be visible. Hence, commonality of the predetermined analog signal of each signal processing circuit 41 is achieved to enable a reduction in differences in the characteristics and the like of each signal processing circuit 41 and the boundary of the combined portion of the image data to become inconspicuous.

(Modification Related to an AD Conversion Technology)

Furthermore, in the above description, the example is illustrated in which a column parallel AD conversion technology is adopted for the solid state imaging device as described above with reference to FIG. 2. However, a pixel AD parallel conversion technology may be adopted.

Figure 23:
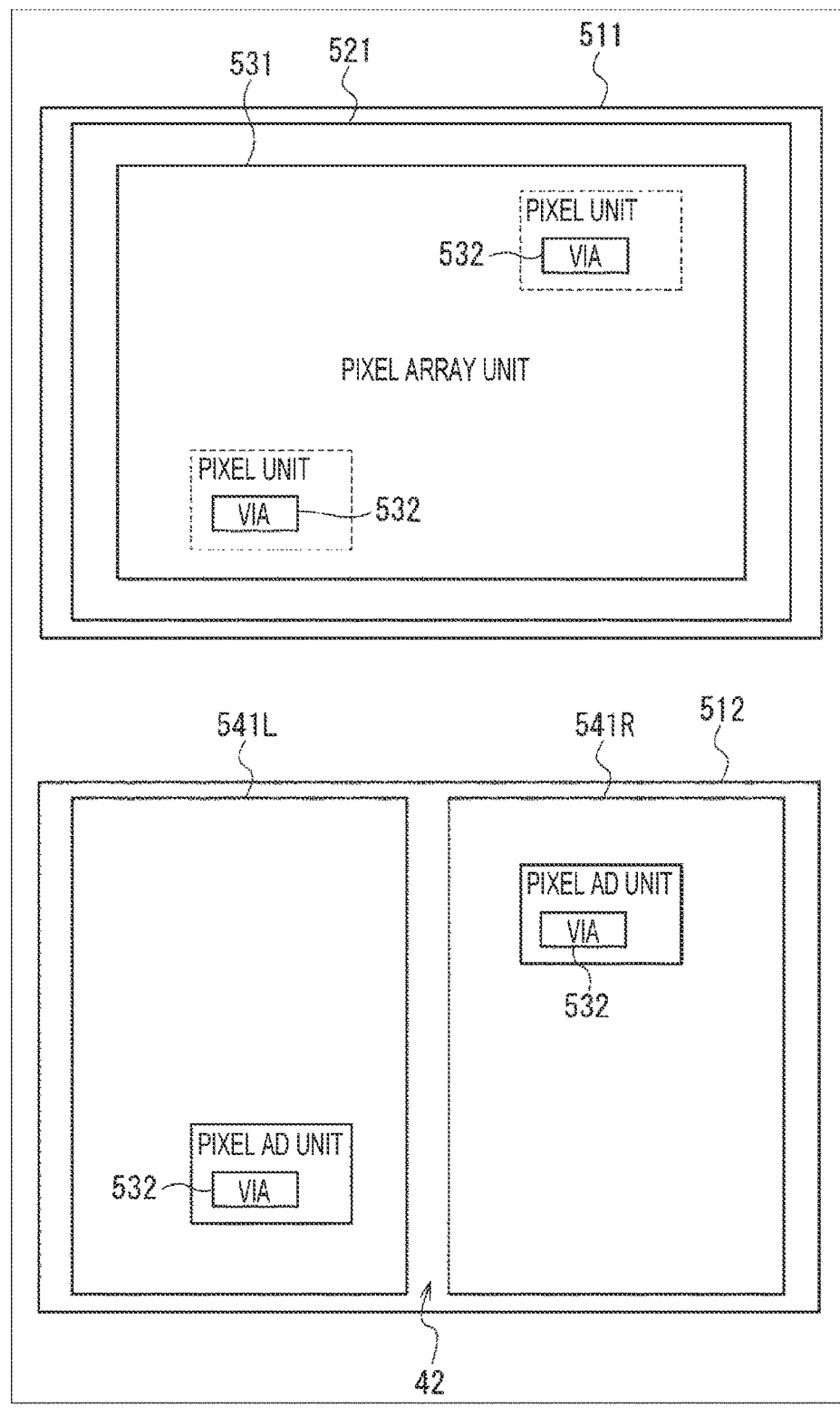
FIG. 23 is a diagram schematically illustrating configuration examples of a pixel substrate and a logic substrate of when a pixel AD conversion technique is adopted.

FIG. 23 schematically illustrates the configurations of a pixel substrate 511 and a logic substrate 512 of when the pixel AD conversion technology is adopted.

A pixel circuit 521 including a pixel array unit 531 is formed in the pixel substrate 511 as in the pixel substrate 11 of FIG. 1. Moreover, signal processing circuits 541L and 541R with the same circuit pattern are formed in the logic substrate 512 in such a manner as to be arranged side by side across the scribe area 42 as in the logic substrate 12 of FIG. 1.

In addition, pixel units (groups) where an area including a two-dimensional array with a predetermined number of pixels is set as one unit are two-dimensionally arranged in a matrix in the pixel array unit 531 of the pixel substrate 511. A via 532 is formed for each pixel unit. On the other hand, a circuit part (a pixel AD unit in FIG. 23) including, for example, the AD converter 81 (FIG. 2) and the memory unit 67 (FIG. 2) is provided to each pixel unit of the pixel array unit 531 in the signal processing circuits 541L and 541R. Moreover, a via 23 corresponding to the pixel unit is formed for each pixel AD unit.

In this manner, the pixel parallel AD conversion technology is adopted to enable an increase in the reading speed of a pixel signal. Accordingly, the halt period of the AD converter 81 can be increased. As a result, a reduction in power consumption can be promoted.

(Modifications Related to a Moisture-Resistant Ring)

A moisture-resistant ring (also referred to as a sealing ring, a guard ring, and the like) of the logic substrate can be basically formed by a similar method to a known one. For example, the moisture-resistant ring is formed by a similar method to the known one in such a manner as to surround the periphery of each signal processing circuit individually. However, if the inter-circuit wiring layer that connects signal processing circuits electrically is formed in the logic substrate as in the second embodiment described above with reference to FIG. 14 and the like, when a moisture-resistant ring is formed by a similar method to the known one, a wire in the inter-circuit wiring layer and the moisture-resistant ring interfere with each other. In other words, in a portion where a wire in the inter-circuit wiring layer passes an edge of the signal processing circuit, a moisture-resistant ring formed at the edge of the inter-circuit wiring layer and the wire in the inter-circuit wiring layer interfere with each other.

Hence, a method for avoiding interference between a wire in the inter-circuit wiring layer and a moisture-resistant ring is described below.

Firstly, a first method for avoiding interference between a wire in the inter-circuit wiring layer and a moisture-resistant ring is described with reference to FIGS. 24 to 26.

Figure 24:
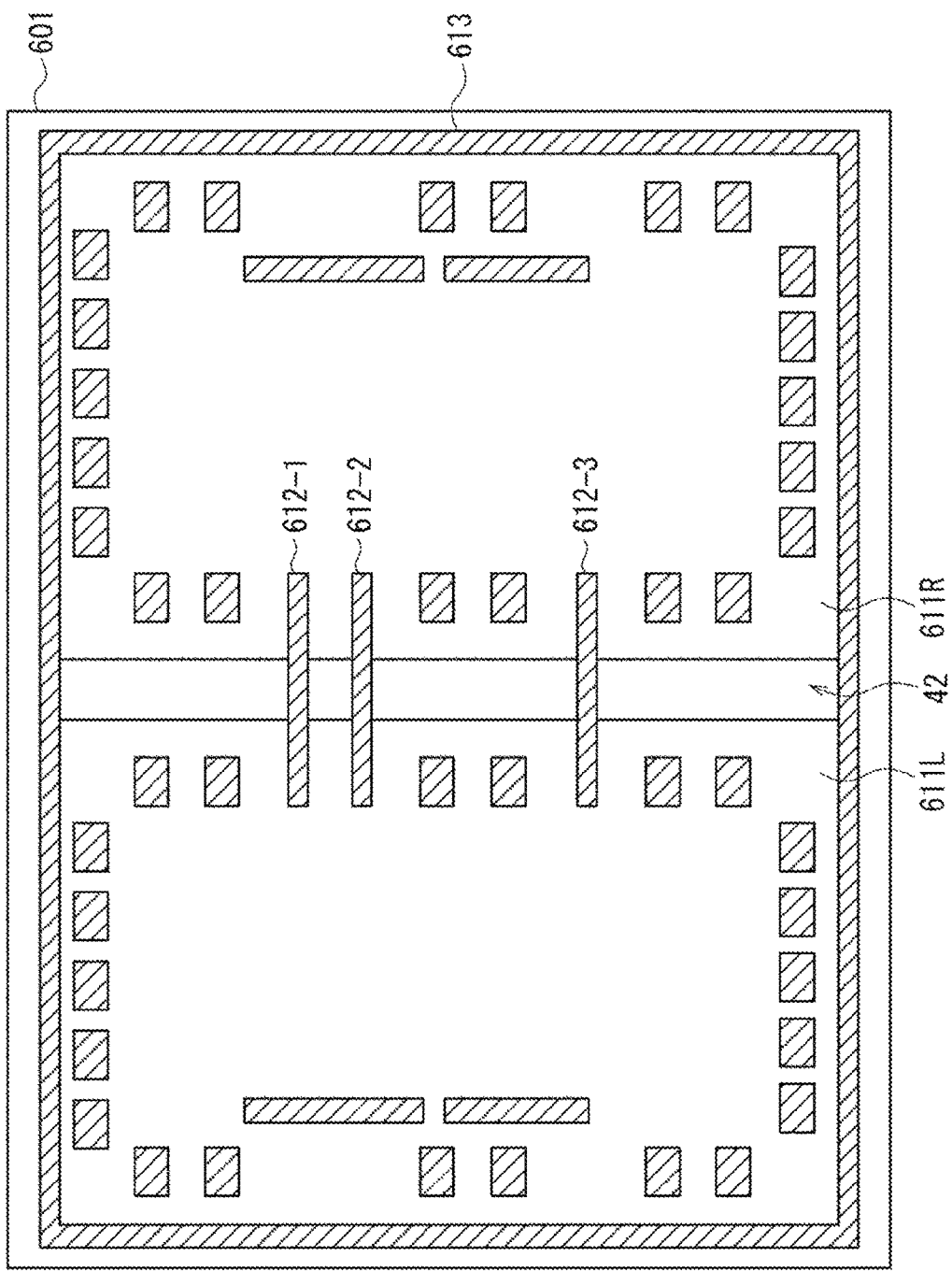
FIG. 24 is a plan view schematically illustrating a first embodiment of the logic substrate configured to avoid interference between a wire in an inter-circuit wiring layer and a moisture-resistant ring.

FIG. 24 is a plan view schematically illustrating a configuration example of a logic substrate 601 configured to avoid interference between a wire in the inter-circuit wiring layer and a moisture-resistant ring.

The logic substrate 601 is different from the above-mentioned logic substrate 211 of FIG. 14 in that instead of the signal processing circuits 241L and 241R, signal processing circuits 611L and 611R with the same circuit pattern are provided across the scribe area 42. Moreover, an inter-circuit wiring layer that connects the signal processing circuits 611L and 611R electrically is formed in the uppermost layer of the logic substrate 601 as in the logic substrate 211. In this example, wires 612-1 to 612-3 in the inter-circuit wiring layer connect the signal processing circuits 611L and 611R electrically.

Furthermore, a moisture-resistant ring 613 is formed along the vicinity of an outer periphery of the logic substrate 601 in such a manner as to surround an outer periphery of the signal processing circuits 611L and 611R.

Figure 25:
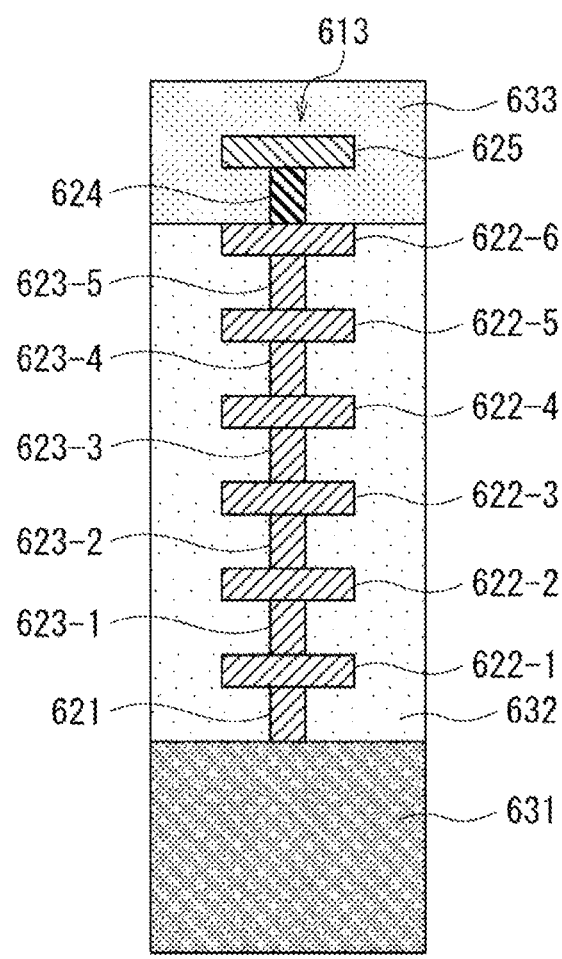
FIG. 25 is a cross-sectional view schematically illustrating a first embodiment of the moisture-resistant ring.
Figure 26:
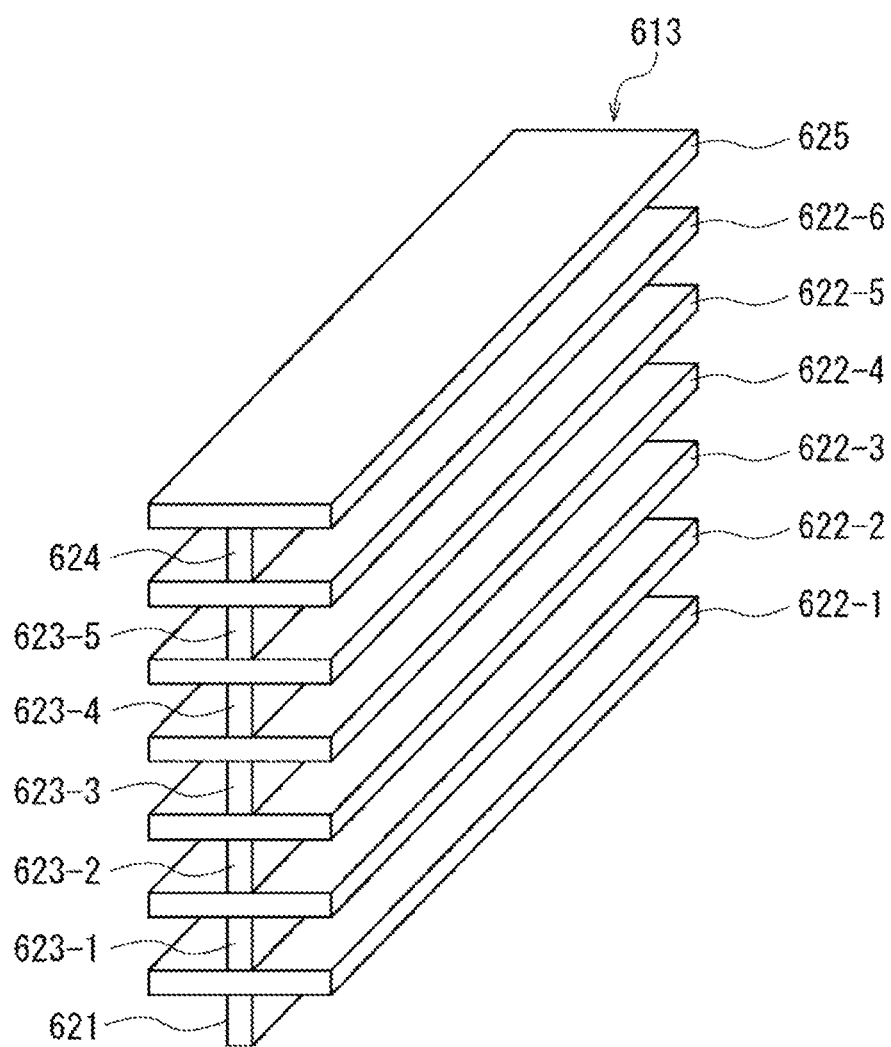
FIG. 26 is a perspective view schematically illustrating the first embodiment of the moisture-resistant ring.

The structure of the moisture-resistant ring 613 is described here with reference to FIGS. 25 and 26. FIG. 25 is a cross-sectional view schematically illustrating a cross section of the moisture-resistant ring 613. FIG. 26 is a perspective view schematically illustrating part of the moisture-resistant ring 613.

The moisture-resistant ring 613 includes a wall 621 made of a material of a contact, dummy wires 622-1 to 622-6, walls 623-1 to 623-5 made of a material of a via, a wall 624, and a dummy wire 625.

The dummy wires 622-1 to 622-6 and the dummy wire 625 are formed respectively in different wiring layers of the logic substrate 601, and are dummy wires that are not used for the transmission of a signal. In this example, seven wiring layers of the logic substrate 601 are stacked on a substrate layer 631 including, for example, a silicon substrate. In addition, the dummy wires 622-1 is formed in the first wiring layer at the bottom of the logic substrate 601. The dummy wires 622-2 to 622-6 are formed in the second to sixth wiring layers of the logic substrate 601. The dummy wire 625 is formed in the seventh wiring layer at the top of the logic substrate 601.

The dummy wires 622-1 to 622-6 and the dummy wire 625 have substantially the same rectangular ring shape. The dummy wires 622-1 to 622-6 and the dummy wire 625 are formed along the vicinity of the outer periphery of the logic substrate 601 in each wiring layer in such a manner as to surround the outer periphery of the signal processing circuits 611L and 611R.

The wall 621, the walls 623-1 to 623-5, and the wall 624 have substantially the same rectangular ring shape. The wall 621, the walls 623-1 to 623-5, and the wall 624 are formed along the vicinity of the outer periphery of the logic substrate 601 in such a manner as to surround the outer periphery of the signal processing circuits 611L and 611R.

The wall 621 is formed in the same step as a contact that connects the substrate layer 631 and the first wiring layer to connect the substrate layer 631 and the dummy wire 622-1.

The walls 623-1 to 623-5 are formed in the same step as vias that connect adjacent wiring layers of the first to sixth wiring layers. The wall 623-1 is a via that connects the dummy wire 622-1 and the dummy wire 622-2. The wall 623-2 is a via that connects the dummy wire 622-2 and the dummy wire 622-3. The wall 623-3 is a via that connects the dummy wire 622-3 and the dummy wire 622-4. The wall 623-4 is a via that connects the dummy wire 622-4 and the dummy wire 622-5. The wall 623-5 is a via that connects the dummy wire 622-5 and the dummy wire 622-6.

The wall 624 is formed in the same step as a via that connects the sixth and seventh wiring layers. The wall 624 is a via that connects the dummy wire 622-6 and the dummy wire 625.

For example, copper is used for the first to sixth wiring layers. The wall 621 is made of tungsten. The dummy wires 622-1 to 622-6 and the walls 623-1 to 623-5 are made of copper. Moreover, for example, an insulating film made of a low-K material with a low dielectric contact is used for an inter-layer insulating film 632 from a surface of the substrate layer 631 to an upper end of the sixth wiring layer. In addition, the first to sixth wiring layers are used for, for example, the transmission of a high-speed signal.

On the other hand, for example, aluminum is used for the seventh wiring layer. The dummy wire 625 is made of aluminum. Moreover, the wall 624 is made of, for example, tungsten. Furthermore, for example, a highly water-resistant oxide film with a higher dielectric constant than the inter-layer insulating film 632 (for example, an oxide silicon film) is used for an inter-layer insulating film 633 above the upper end of the sixth wiring layer. In addition, the seventh wiring layer is used for, for example, the transmission of a low-speed signal of a power supply or the like. Moreover, the seventh wiring layer serves as the inter-circuit wiring layer.

In this manner, the moisture-resistant ring 613 forms a wall that surrounds the periphery of the logic substrate 601 with the wall 621 to the dummywire 625, and prevents moisture from entering the signal processing circuits 611L and 611R from a side surface of the logic substrate 601.

Moreover, the moisture-resistant ring 613 is not provided between the signal processing circuits 611L and 611R. Therefore, the wires 612-1 to 612-3 that connect the signal processing circuits 611L and 611R do not interfere with the moisture-resistant ring 613.

Incidentally, the circumference of the moisture-resistant ring 613 is substantially the same as that of the pixel circuit 21, and is larger than the exposure field of the exposure apparatus. Therefore, when the layers above the substrate layer 631 of the logic substrate 601 (the layers including the moisture-resistant ring 613) are formed, split exposure is used.

Moreover, the moisture-resistant ring 613 is not necessarily required to be formed in such a manner as to surround the entire periphery of the logic substrate 601. The moisture-resistant ring 613 may be formed in such a manner as to surround, for example, only part of the periphery of the logic substrate 601 within a range that can ensure moisture resistance.

Furthermore, also if, for example, three or more signal processing circuits are placed in the logic substrate, it is similarly required to form the moisture resistant-ring in such a manner as to contain all the signal processing circuits within it and surround the periphery or part of the periphery of the logic substrate.

Next, a second method for avoiding interference between a wire in the inter-circuit wiring layer and a moisture-resistant ring is described with reference to FIGS. 27 to 33.

Figure 27:
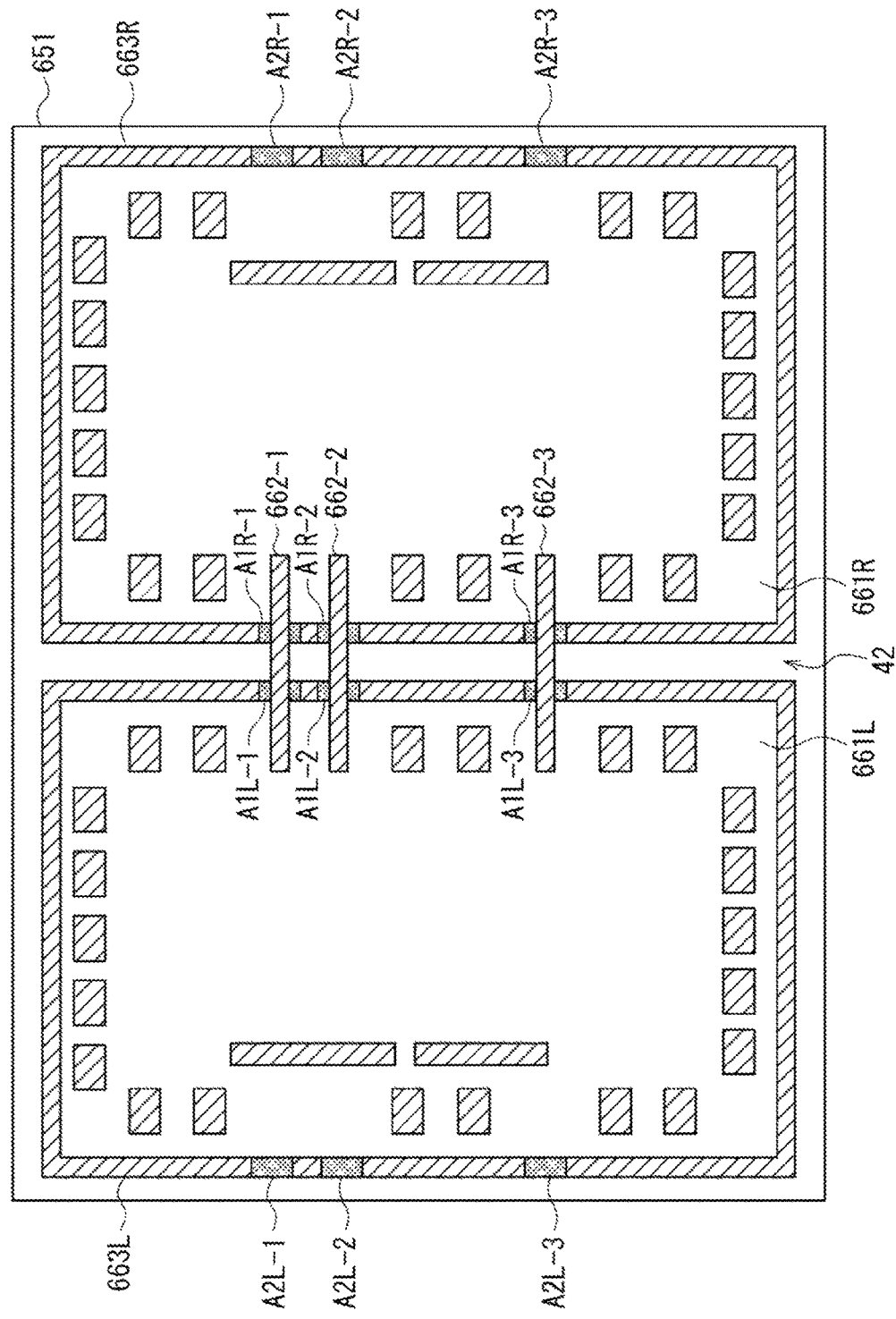
FIG. 27 is a plan view schematically illustrating a second embodiment of a logic substrate configured to avoid interference between a wire in an inter-circuit wiring layer and a moisture-resistant ring.

FIG. 27 is a plan view schematically illustrating a configuration example of a logic substrate 651 configured to avoid interference between a wire in the inter-circuit wiring layer and a moisture-resistant ring.

The logic substrate 651 is different from the above-mentioned logic substrate 601 of FIG. 24 in that, instead of the signal processing circuits 611L and 611R, signal processing circuits 661L and 661R with the same circuit pattern are provided across the scribe area 42. Moreover, an inter-circuit wiring layer that connects the signal processing circuits 661L and 661R electrically is formed in the uppermost layer of the logic substrate 651 as in the logic substrate 601. In this example, wires 662-1 to 662-3 in the inter-circuit wiring layer connect the signal processing circuits 661L and 661R electrically.

Furthermore, the logic substrate 651 is different from the logic substrate 601 in that, instead of the moisture-resistant ring 613, moisture-resistant rings 663L to 663R are formed. The moisture-resistant ring 663L is formed along the vicinity of an outer periphery of the signal processing circuit 661L in such a manner as to surround the periphery of the signal processing circuit 661L. The moisture-resistant ring 663R is formed along the vicinity of an outer periphery of the signal processing circuit 661R in such a manner as to surround the periphery of the signal processing circuit 661R.

The structure of the moisture-resistant ring 663R is described here with reference to FIGS. 28 to 33. Incidentally, although not described in detail, the moisture-resistant ring 663L also has substantially the same structure as the moisture-resistant ring 663R. Moreover, a reference sign of a portion of the moisture-resistant ring 663L corresponding to each portion of the moisture-resistant ring 663R is expressed by a reference sign having the letter "L" replaced with "R" included in the reference sign of each portion of the moisture-resistant ring 663R below.

Figure 28:
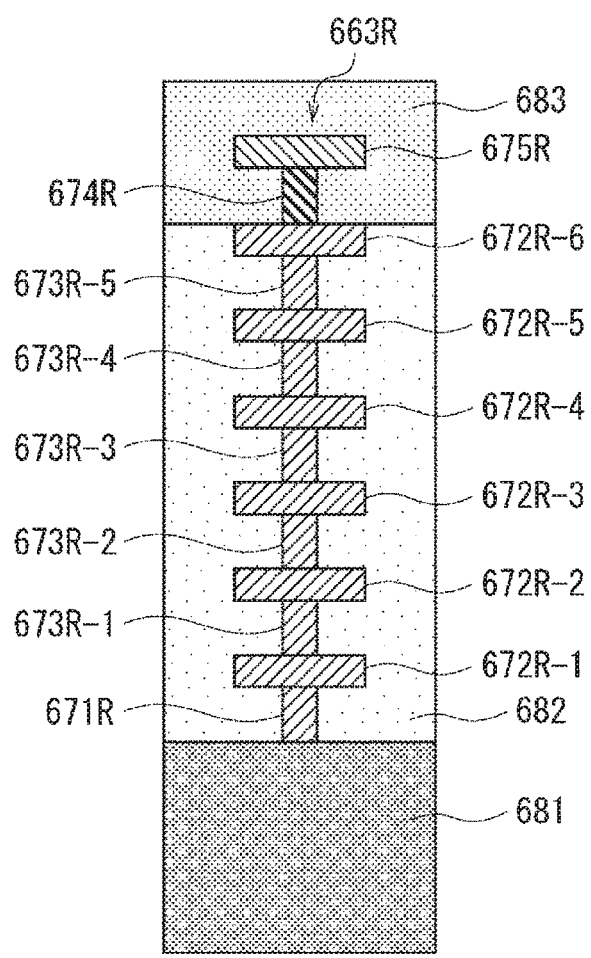
FIG. 28 is a first cross-sectional view schematically illustrating a second embodiment of the moisture-resistant ring.
Figure 29:
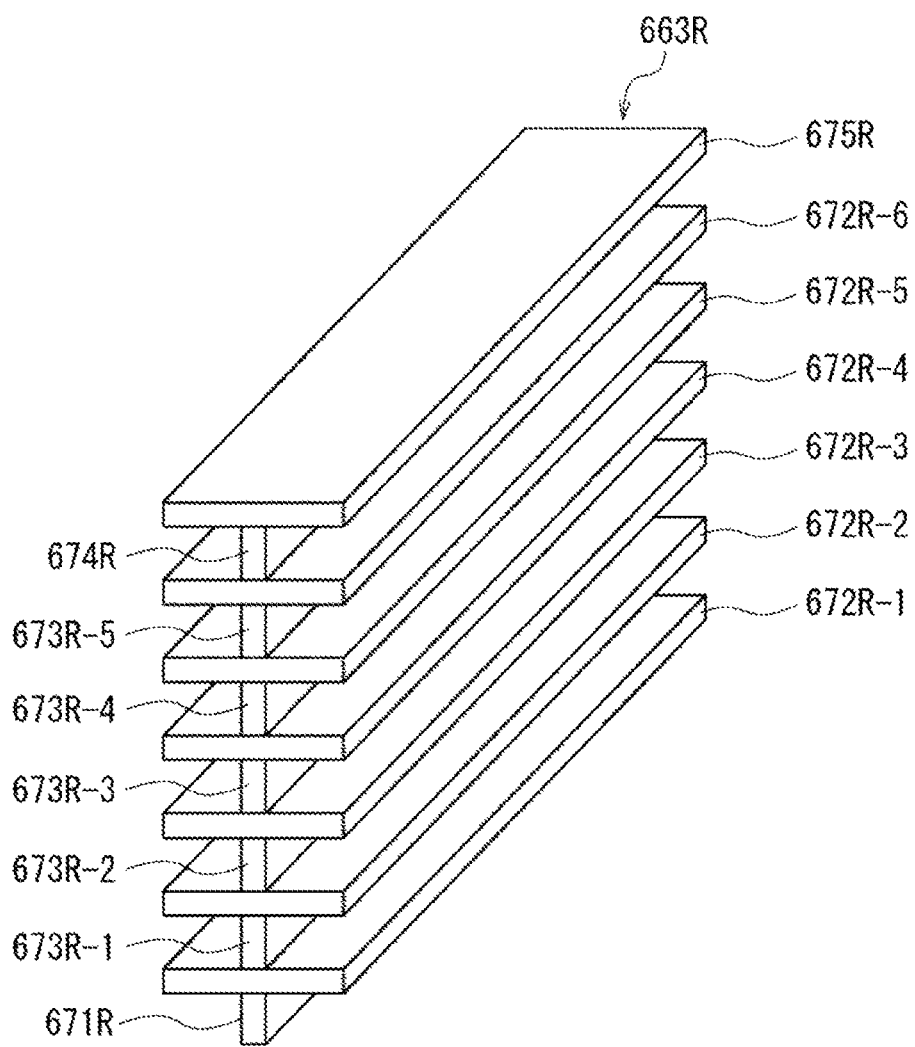
FIG. 29 is a first perspective view schematically illustrating the second embodiment of the moisture-resistant ring.

FIG. 28 is a cross-sectional view schematically illustrating a cross section of a portion other than areas A1R-1 to A1R-3 and areas A2R-1 to A2R-3 of the moisture-resistant ring 663R. FIG. 29 is a perspective view schematically illustrating part of the portion other than the areas A1R-1 to A1R-3 and the areas A2R-1 to A2R-3 of the moisture-resistant ring 663R.

Figure 30:
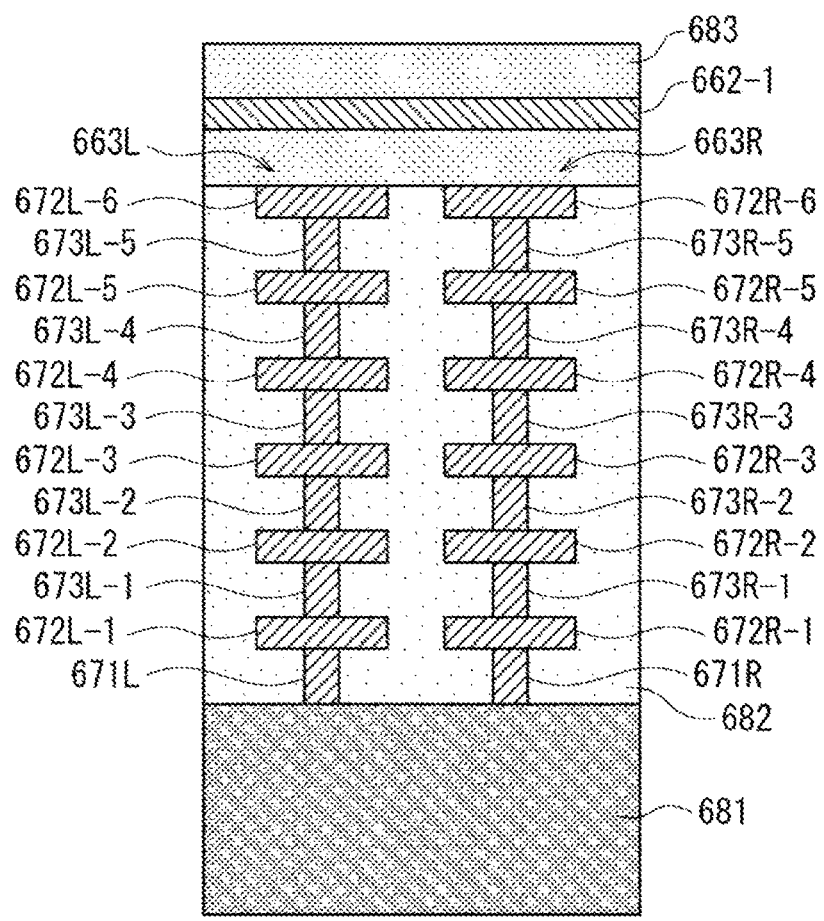
FIG. 30 is a second cross-sectional view schematically illustrating the second embodiment of the moisture-resistant ring.
Figure 31:
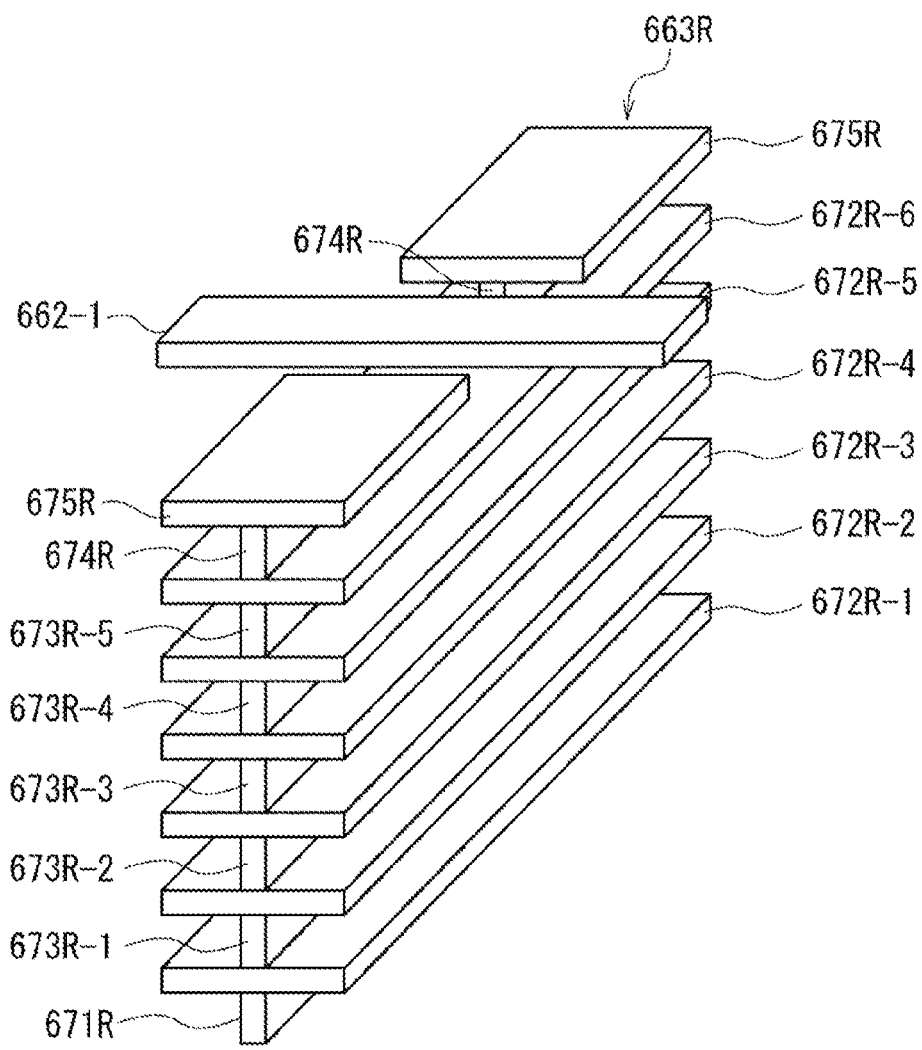
FIG. 31 is a second perspective view schematically illustrating the second embodiment of the moisture-resistant ring.

FIG. 30 is a cross-sectional view schematically illustrating a cross section of a portion where the wire 662-1 passes in the area A1L-1 of the moisture-resistant ring 663L and the area A1R-1 of the moisture-resistant ring 663R. FIG. 31 is a perspective view schematically illustrating the vicinity of the area A1R-1 of the moisture-resistant ring 663R.

Figure 32:
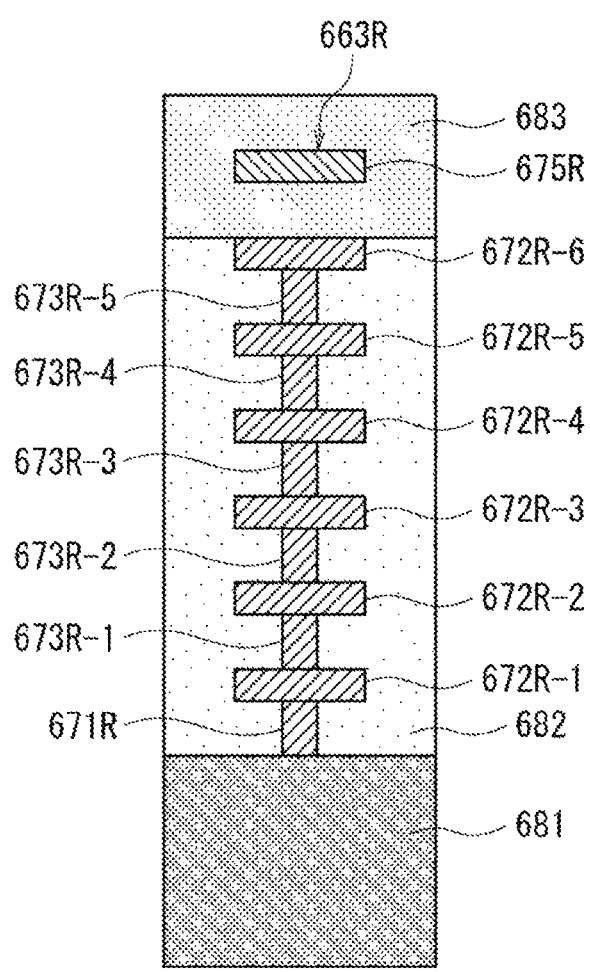
FIG. 32 is a third cross-sectional view schematically illustrating the second embodiment of the moisture-resistant ring.
Figure 33:
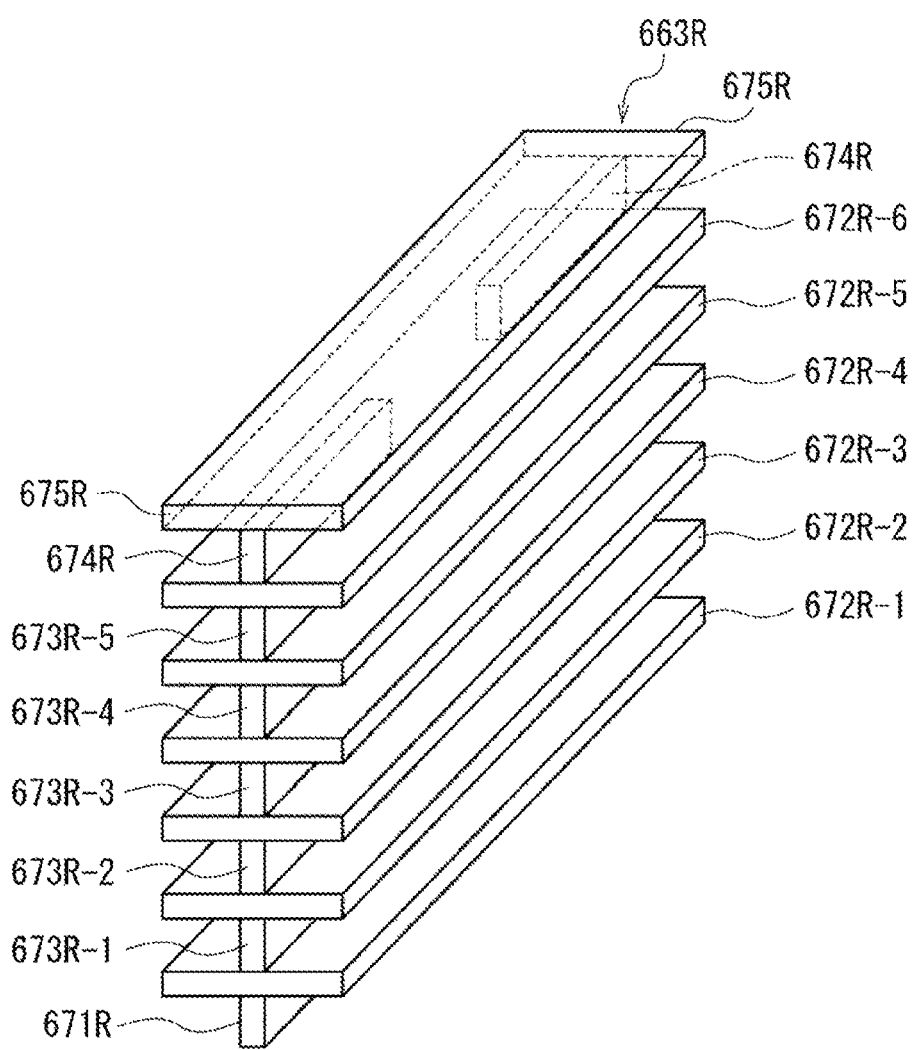
FIG. 33 is a third perspective view schematically illustrating the second embodiment of the moisture-resistant ring.

FIG. 32 is a cross-sectional view schematically illustrating a cross section at the same position in the area A2R-1 of the moisture-resistant ring 663R as the portion where the wire 662-1 passes in the area A1L-1 of the moisture-resistant ring 663L. FIG. 33 is a perspective view schematically illustrating the vicinity of the area A2R-1 of the moisture-resistant ring 663R. Incidentally, in FIG. 33, only a dummy wire 675R in the uppermost layer is made see-through.

The moisture-resistant ring 663R includes a wall 671R, dummy wires 672R-1 to 672R-6, walls 673R-1 to 673R-5, a wall 674R, and the dummy wire 675R. The moisture-resistant ring 663R has substantially the same structure as the moisture-resistant ring 613 described above with reference to FIGS. 25 and 26. In other words, the moisture-resistant ring 663R similarly has the seven-layer stacked structure as in the moisture-resistant ring 613 and also is made of the same material as the moisture-resistant ring 613.

For example, an insulating film made of a low-K material is used for an inter-layer insulating film 682 from a surface of a substrate layer 681 to an upper end of the sixth wiring layer as in the inter-layer insulating film 632 of the logic substrate 601. Moreover, for example, an oxide film (for example, an oxide silicon film) is used for an inter-layer insulating film 683 above the upper end of the sixth wiring layer as in the inter-layer insulating film 633 of the logic substrate 601.

However, the moisture-resistant ring 663 R is different from the moisture-resistant ring 613 in that parts of the wall 674R and the dummywire 675R are not formed and are discontinuous. Specifically, the wall 674R and the dummy wire 675R are discontinuous in portions where the wires 662-1 to 662-3 in the areas A1R-1 to A1R-3 on the left side of the moisture-resistant ring 663R pass.

For example, as illustrated in FIGS. 30 and 31, the wall 674R and the dummy wire 675R are discontinuous in the portion where the wire 662-1 in the area A1R-1 passes to prevent interference with the wire 662-1. Moreover, although illustration is omitted, the wall 674R and the dummy wire 675R are also discontinuous in the portion where the wire 662-2 in the area A1R-2 passes and the portion where the wire 662-3 in the area A1R-3 passes to prevent interference with the wires 662-2 and 662-3.

Similarly, a wall 674L and a dummy wire 675L of the moisture-resistant ring 663L are also discontinuous in portions where the wires 662-1 to 662-3 in the areas A1L-1 to A1L-3 on the right side of the moisture-resistant ring 663L pass to prevent interference with the wires 662-1 to 662-3.

Moreover, the wall 674R of the moisture-resistant ring 663R is discontinuous in portions corresponding to the discontinuous portions of the wall 674L in the areas A1L-1 to A1L-3 of the moisture-resistant ring 663L. For example, the wall 674R is discontinuous at the same portion as the discontinuous portion of the wall 674L in the area A1L-1 on the right side of the moisture-resistant ring 663L, in the area A2R-1 on the right side of the moisture-resistant ring 663R as illustrated in FIGS. 32 and 33. Moreover, although illustration is omitted, the wall 674R is discontinuous at the same portions as the discontinuous portions of the wall 674L in the areas A1L-2 and A1L-3 on the right side of the moisture-resistant ring 663L, in the areas A2R-2 and A2R-3 on the right side of the moisture-resistant ring 663R.

Similarly, the wall 674L of the moisture-resistant ring 663L is discontinuous at portions corresponding to the discontinuous portions of the wall 674R in the areas A1R-1 to A1R-3 of the moisture-resistant ring 663R.

Consequently, the discontinuous portions of the wall 674L of the moisture-resistant ring 663L are the same as the discontinuous portions of the wall 674R of the moisture-resistant ring 663R. Accordingly, the walls 674R and 674L have the same and left-right symmetric shape.

Incidentally, the dummy wire 675R is unbroken and continuous in the areas A2R-1 to A2R-3. Similarly, the dummy wire 675L is unbroken and continuous in the areas A2L-1 to A2L-3.

As described above, the moisture-resistant ring 663R forms a wall surrounding the periphery of the signal processing circuit 661R with the wall 671R to the dummy wire 675R, and prevents moisture from entering the signal processing circuit 661R from a side surface of the logic substrate 651. Similarly, the moisture-resistant ring 663L forms a wall surrounding the periphery of the signal processing circuit 661L with a wall 671L to the dummy wire 675L, and prevents moisture from entering the signal processing circuit 661L from a side surface of the logic substrate 651.

Moreover, as described above, the moisture-resistant rings 663L and 663R do not interfere with the wires 662-1 to 662-3 connecting the signal processing circuits 661L and 661R.

Furthermore, the discontinuous section of the wall 674R and the dummy wire 675R of the moisture-resistant ring 663R is very short. The water resistance of the inter-layer insulating film 683 is also high. Accordingly, the moisture resistance of the moisture-resistant ring 663R is hardly reduced. Similarly, the discontinuous section of the wall 674L and the dummy wire 675L of the moisture-resistant ring 663L is very short. The water resistance of the inter-layer insulating film 683 is also high. Accordingly, the moisture resistance of the moisture-resistant ring 663L is hardly reduced.

Moreover, the wall 674L of the moisture-resistant ring 663L and the wall 674R of the moisture-resistant ring 663R have the same shape. Accordingly, it is possible to, for example, use the same photomask for exposure and achieve cost reduction.

Incidentally, the moisture-resistant rings 663L and 663R are not necessarily required to be formed in such a manner as to surround the entire peripheries of the signal processing circuits 661L and 661R, respectively, and for example, may surround only parts of the peripheries within a range that can ensure moisture resistance.

Moreover, the discontinuous portions of the walls 674L and 674R other than the portions where the wires 662-1 to 662-3 pass are not necessarily required to be provided. However, the walls 674L and 674R do not have the same shape without the discontinuous portions. Accordingly, there arises a need to use split exposure.

Furthermore, also if, for example, three or more signal processing circuits are placed in the logic circuit, the moisture-resistant ring of each signal processing circuit can be formed by a similar method in such a manner as to avoid interference with wires connecting the signal processing circuits.

(Method for Manufacturing the Moisture-Resistant Rings 663L and 663R)

Next, a method for manufacturing the moisture-resistant rings 663L and 663R of the logic substrate 651 is described with reference to FIGS. 34 to 40.

Incidentally, a left diagram in each of FIGS. 34 to 40 schematically illustrates a cross section of a portion where the wires 662-1 to 662-3 do not pass, in a portion where the right side of the moisture-resistant ring 663L and the left side of the moisture-resistant ring 663R are adjacent. On the other hand, a right diagram in each of FIGS. 34 to 40 schematically illustrates a cross section of a portion where the wire 662-1 passes, in a portion where the right side of the moisture-resistant ring 663L and the left side of the moisture-resistant ring 663R are adjacent.

Moreover, the step of forming a portion above the inter-layer insulating film 682 with the already formed wall 671L to a dummy wire 672L-6 of the moisture-resistant ring 663L and the wall 671R to the dummy wire 672R-6 of the moisture-resistant ring 663R, and the inter-layer insulating film 682 is described below. Incidentally, one-shot exposure is used for exposure in the previous steps.

Figure 34:
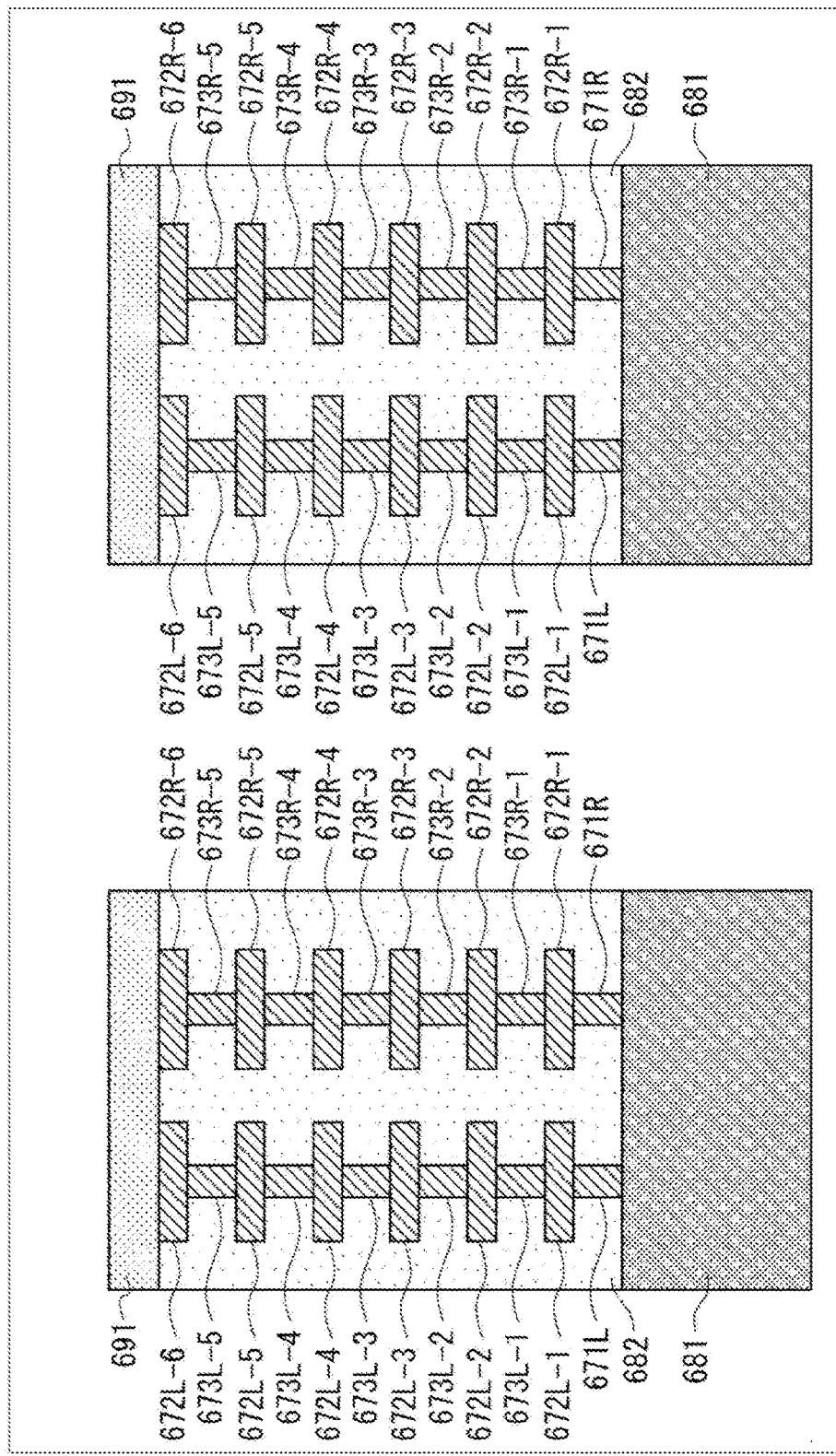
FIG. 34 is a diagram for describing a method for manufacturing the second embodiment of the moisture-resistant ring.

Firstly, as illustrated in FIG. 34, an oxide film 691 is deposited on the inter-layer insulating film 682.

Figure 35:
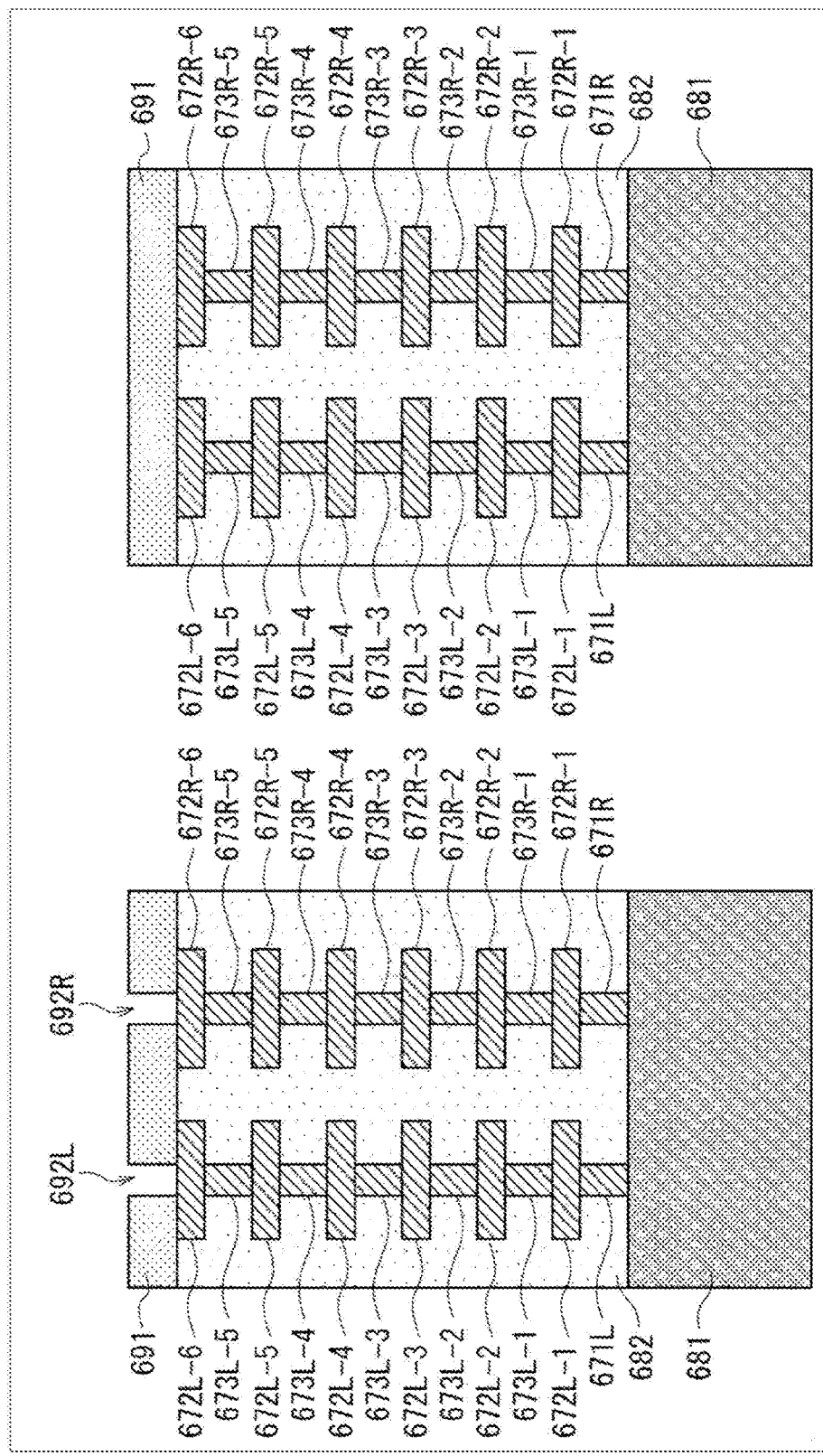
FIG. 35 is a diagram for describing the method for manufacturing the second embodiment of the moisture-resistant ring.

Next, as illustrated in FIG. 35, the oxide film 691 is etched to form grooves 692L and 692R. The groove 692L is formed in such a manner as to be substantially superposed on a wall 673L-5 via the dummy wire 672L-6 when viewed from above. However, the groove 692L is for forming the wall 674L of the moisture-resistant ring 663L, and is not formed at the above-mentioned portions where the wall 674L is discontinuous. Similarly, the groove 692R is formed in such a manner as to be substantially superposed on the wall 673R-5 via the dummy wire 672R-6 when viewed from above. However, the groove 692R is for forming the wall 674R of the moisture-resistant ring 663R and is not formed at the above-mentioned portions where the wall 674R is discontinuous.

Moreover, as described above, the walls 674L and 674R have the same shape. Accordingly, the grooves 692L and 692R have the same shape. Therefore, the grooves 692L and 692R can be formed by one-shot exposure using the same photomask.

Figure 36:
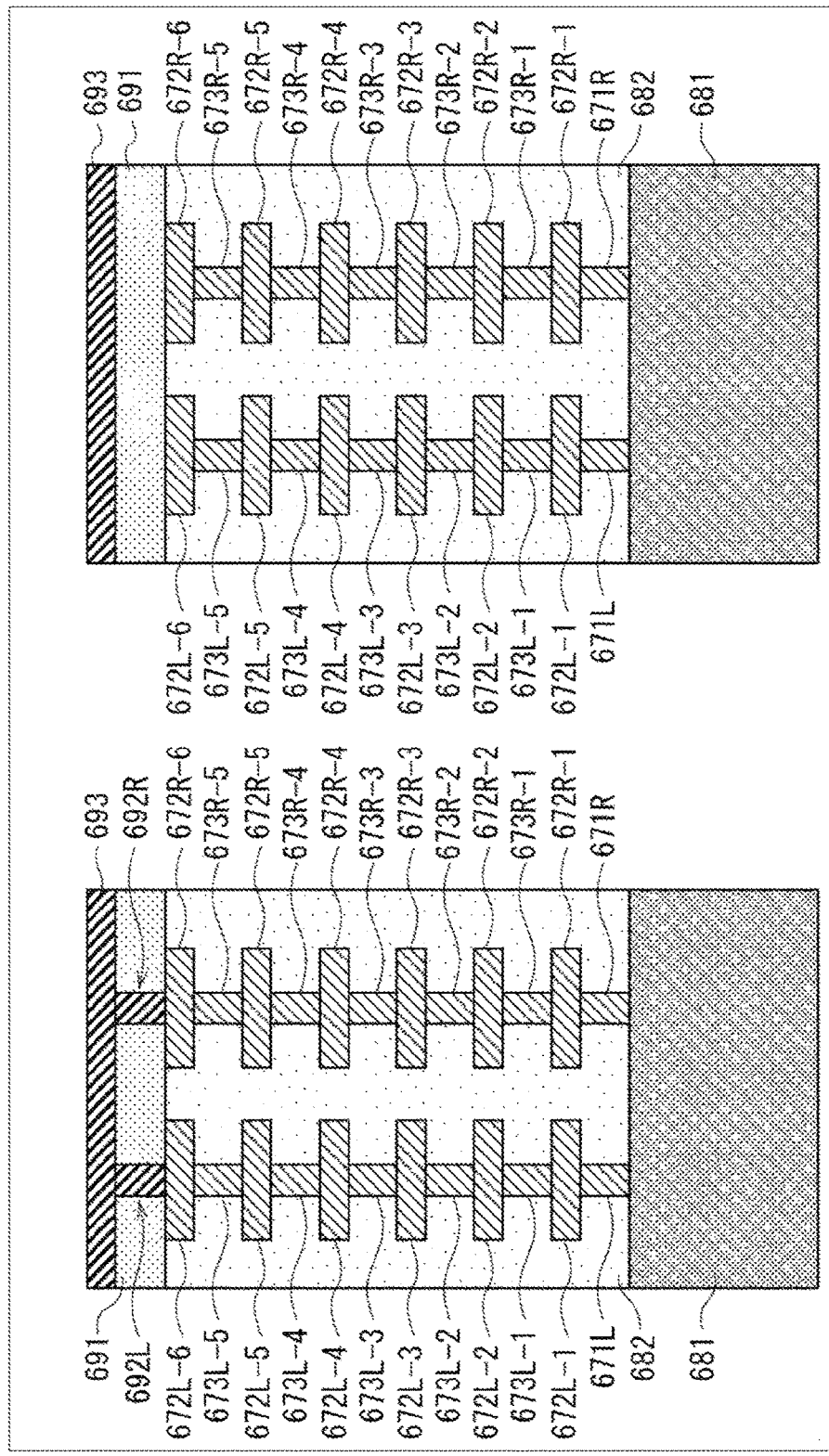
FIG. 36 is a diagram for describing the method for manufacturing the second embodiment of the moisture-resistant ring.

Next, as illustrated in FIG. 36, a metal film 693 made of tungsten is evaporated onto the oxide film 691. At this point in time, the metal film 693 is evaporated thick in such a manner as to bury the grooves 692L and 692R completely.

Figure 37:
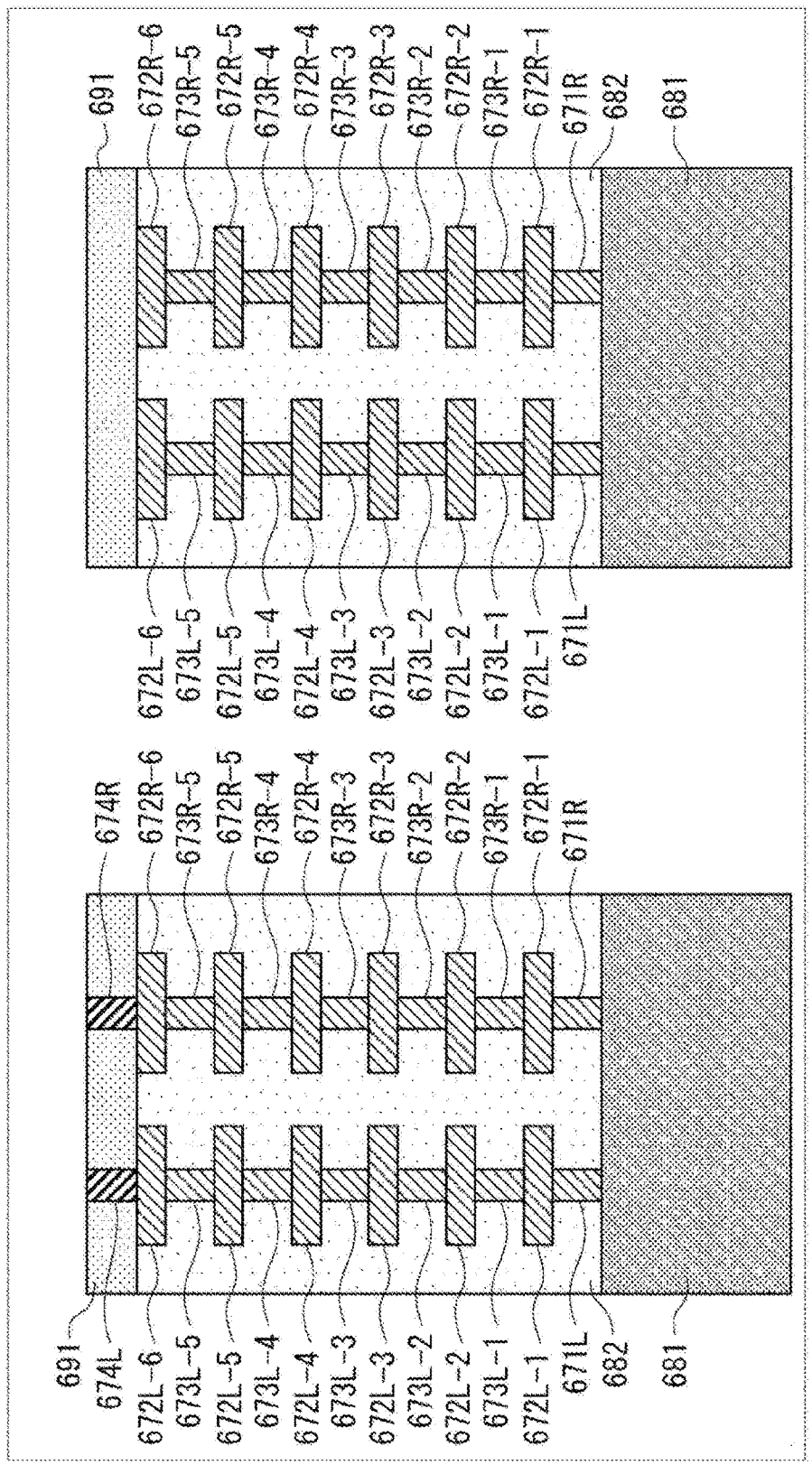
FIG. 37 is a diagram for describing the method for manufacturing the second embodiment of the moisture-resistant ring.

Next, as illustrated in FIG. 37, the metal film 693 on the oxide film 691 is removed by polishing, leaving the metal film 693 in the grooves 692L and 692R. Consequently, the walls 674L and 674R made of tungsten are formed.

Figure 38:
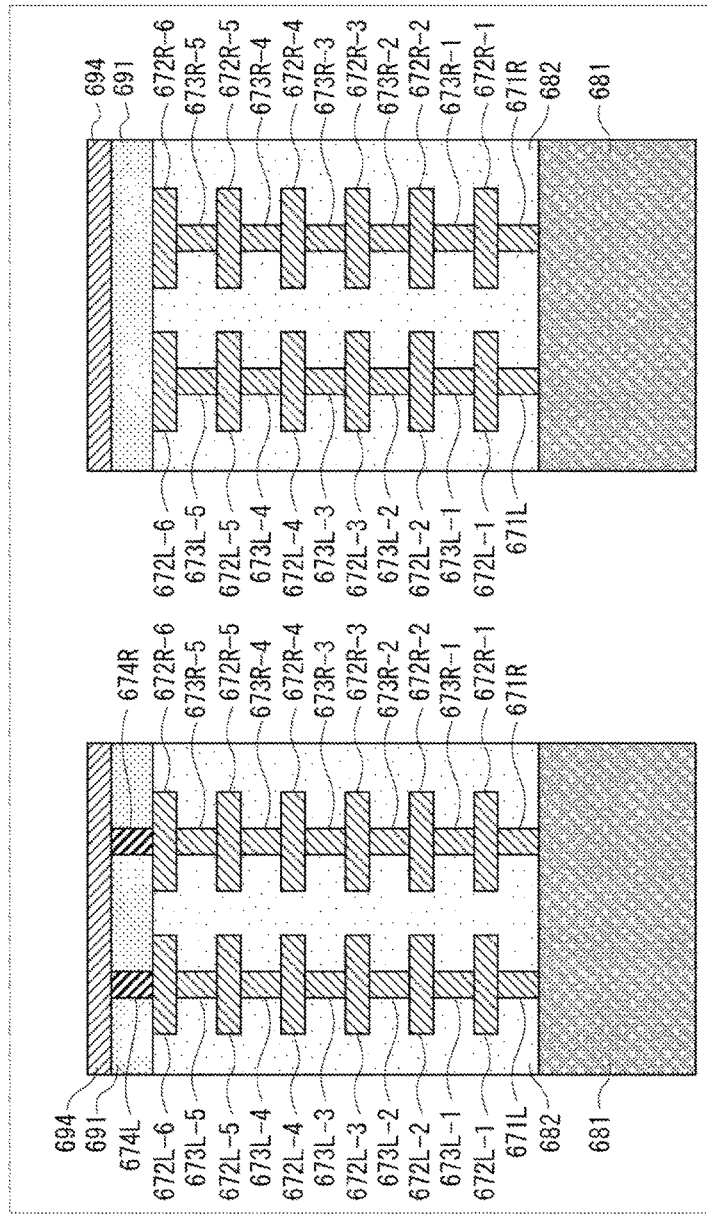
FIG. 38 is a diagram for describing the method for manufacturing the second embodiment of the moisture-resistant ring.

Next, as illustrated in FIG. 38, a metal film 694 made of aluminum is evaporated onto the oxide film 691.

Figure 39:
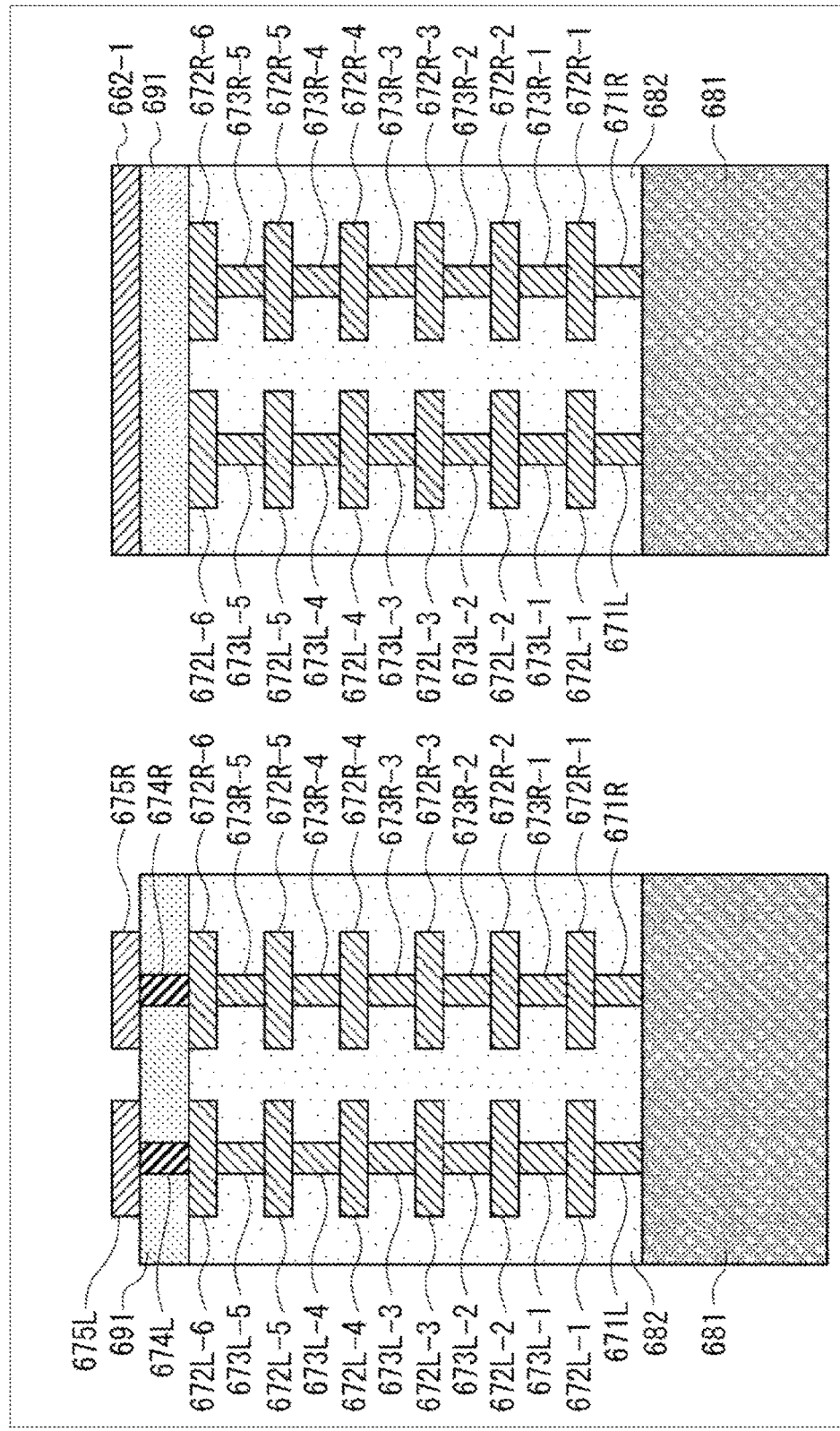
FIG. 39 is a diagram for describing the method for manufacturing the second embodiment of the moisture-resistant ring.

Next, as illustrated in FIG. 39, the metal film 694 is etched. Consequently, the inter-circuit wiring layer including the wires 662-1 to 662-3 and the dummy wires 675L and 675R is formed. Split exposure is used to form the inter-circuit wiring layer as described above.

Figure 40:
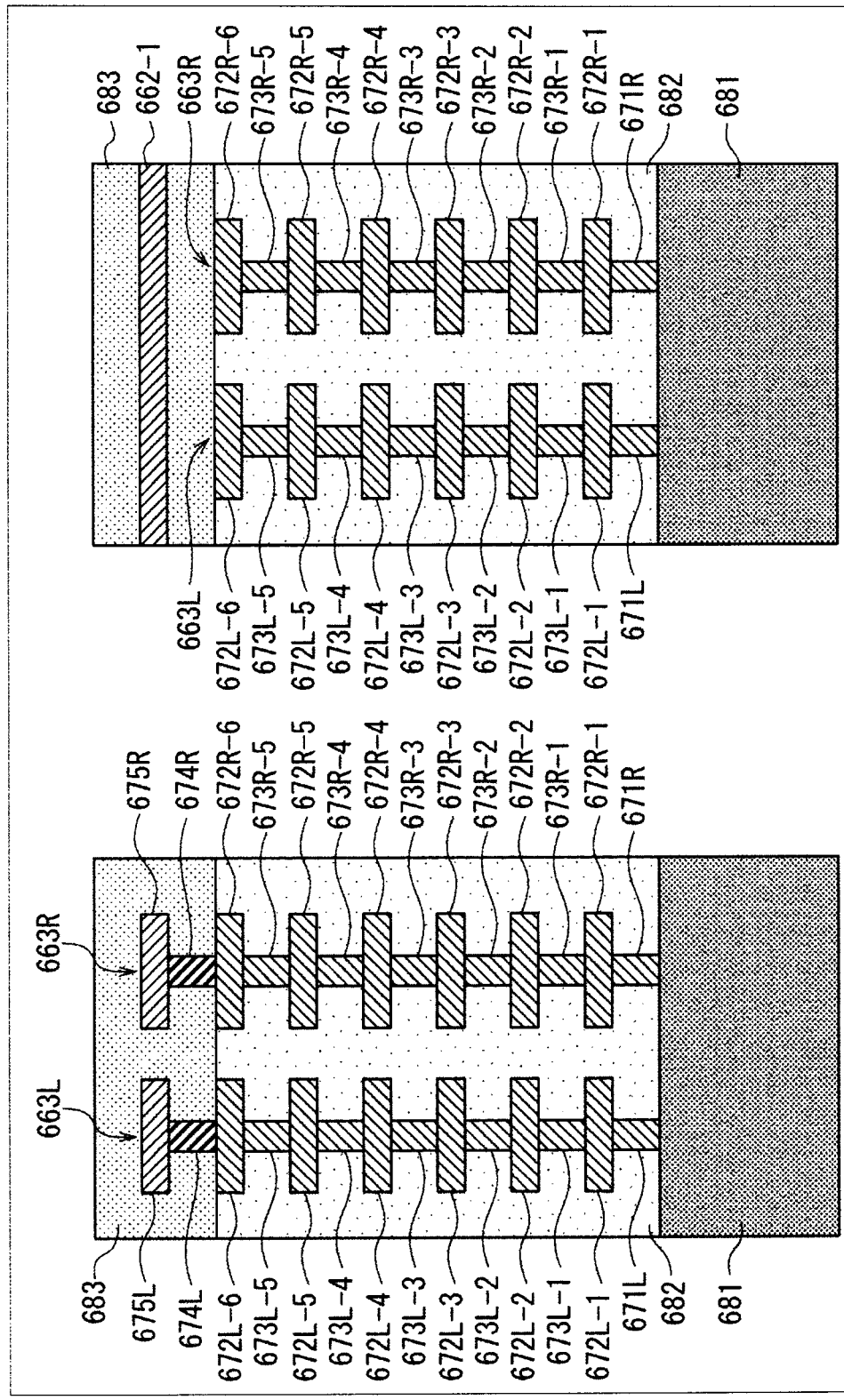
FIG. 40 is a diagram for describing the method for manufacturing the second embodiment of the moisture-resistant ring.

Lastly, as illustrated in FIG. 40, an oxide film is deposited on the inter-circuit wiring layer. Consequently, the inter-layer insulating film 683 is formed, together with the oxide film 691 deposited in the step described above with reference to FIG. 34. Incidentally, for example, a protective layer made of polyimide or the like is further formed on the inter-layer insulating film.

Next, a third method for avoiding interference between a wire in the inter-circuit wiring layer and a moisture-resistant ring is described with reference to FIGS. 41 to 71.

In the example described above with reference to FIGS. 27 to 33, almost all the wiring layers of the logic substrate 651 can be formed by one-shot exposure. Accordingly, cost reduction can be achieved. On the other hand, the inter-circuit wiring layer is limited to be the uppermost layer of the logic substrate 651 and also the number of discontinuous sections of the moisture-resistant rings 663L and 663R cannot be very much increased, considering moisture resistance. Therefore, complicated wiring cannot be very much achieved between two signal processing circuits.

Hence, in order to achieve cost reduction and achieve more complicated wiring between signal processing circuits while ensuring moisture resistance, for example, a combination of the above-mentioned first and second methods is conceivable. In other words, it is conceivable to combine a moisture-resistant ring surrounding the periphery of each signal processing circuit (hereinafter also referred to as the circuit moisture-resistant ring), and a moisture-resistant ring surrounding the periphery of the logic substrate (hereinafter also referred to as the substrate moisture-resistant ring).

Figure 41:
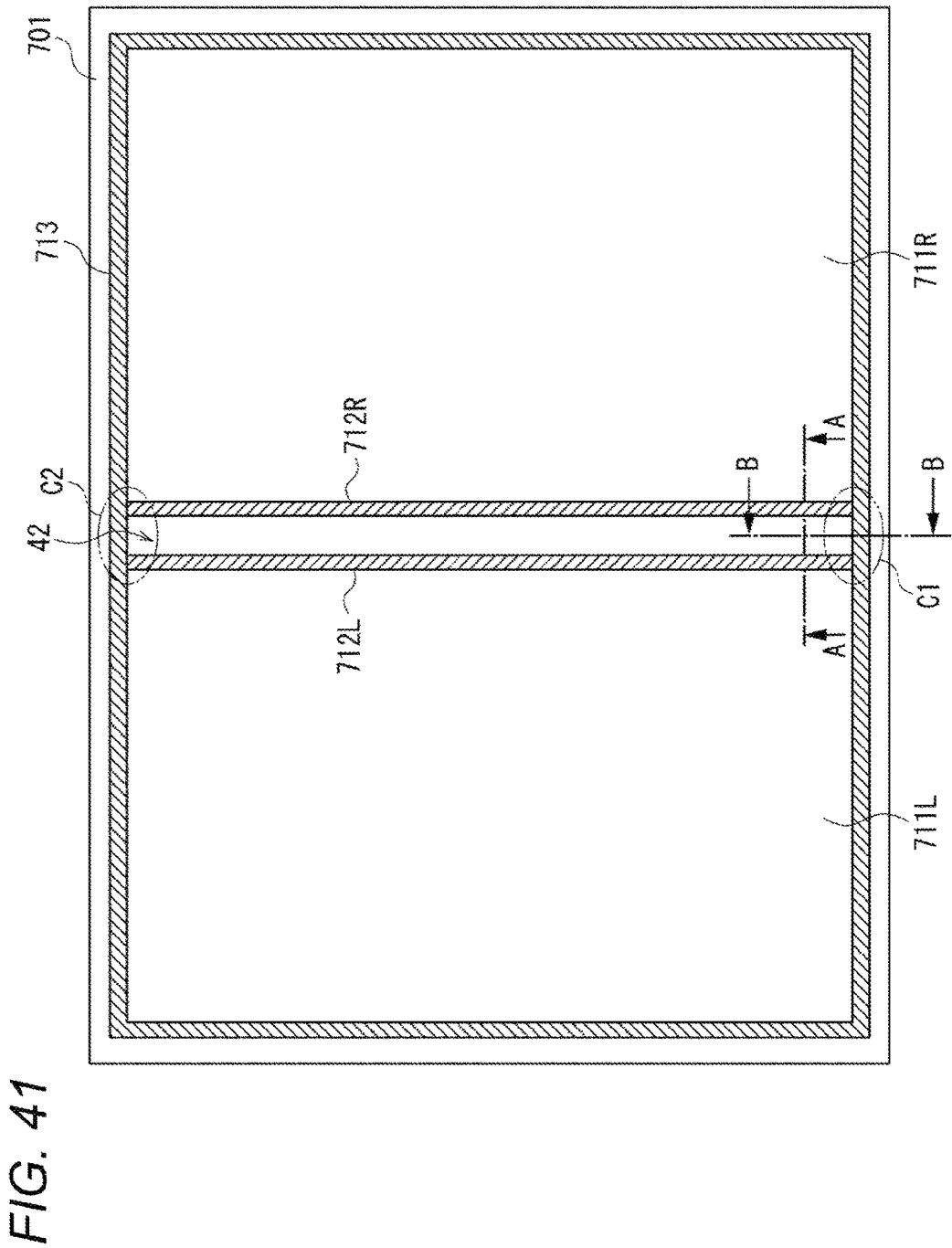
FIG. 41 is a plan view schematically illustrating a third embodiment of the logic substrate configured to avoid interference between a wire in an inter-circuit wiring layer and a moisture-resistant ring.

FIG. 41 is a plan view schematically illustrating a configuration example of a moisture-resistant ring of a logic substrate 701 in a combination of the circuit moisture-resistant rings and the substrate moisture-resistant ring.

The logic substrate 701 is different from the above-mentioned logic substrate 601 of FIG. 24 in that instead of the signal processing circuits 611L and 611R, signal processing circuit 711L and 711R are provided across the scribe area 42. Moreover, there is also a difference in that a moisture-resistant ring 712L surrounding the periphery of the signal processing circuit 711L and a moisture-resistant ring 712R surrounding the periphery of the signal processing circuit 711R are formed, and in a layer above them, a moisture-resistant ring 713 surrounding an outer periphery of the signal processing circuits 711L and 711R is further formed along the vicinity of an outer periphery of the logic substrate 701.

In this manner, the logic substrate 701 has a dual-layer structure where the moisture-resistant rings 712L and 712R that are the circuit moisture-resistant rings, and the moisture-resistant ring 713 being the substrate moisture-resistant ring are stacked.

Incidentally, in the following description, the lower side of FIG. 41 is assumed to be the front of the logic substrate 701, the upper side of FIG. 41 to be the back of the logic substrate 701, the left-hand side of FIG. 41 to be the left-hand side of the logic substrate 701, and the right-hand side of FIG. 41 to be the right-hand side of the logic substrate 701. Therefore, a direction in which the scribe area 42 extends is the front-and-back direction (or depth direction) of the logic substrate 701, and a direction in which the signal processing circuits 711L and 711R are adjacent is the left-and-right direction (or lateral direction) of the logic substrate 701.

Here, a first embodiment of the moisture-resistant ring with the dual-layer structure is described with reference to FIGS. 42 to 44. In the first embodiment, the moisture-resistant ring with the dual-layer structure includes a moisture-resistant ring 712La, a moisture-resistant ring 712Ra, and a moisture-resistant ring 713a.

Figure 42:
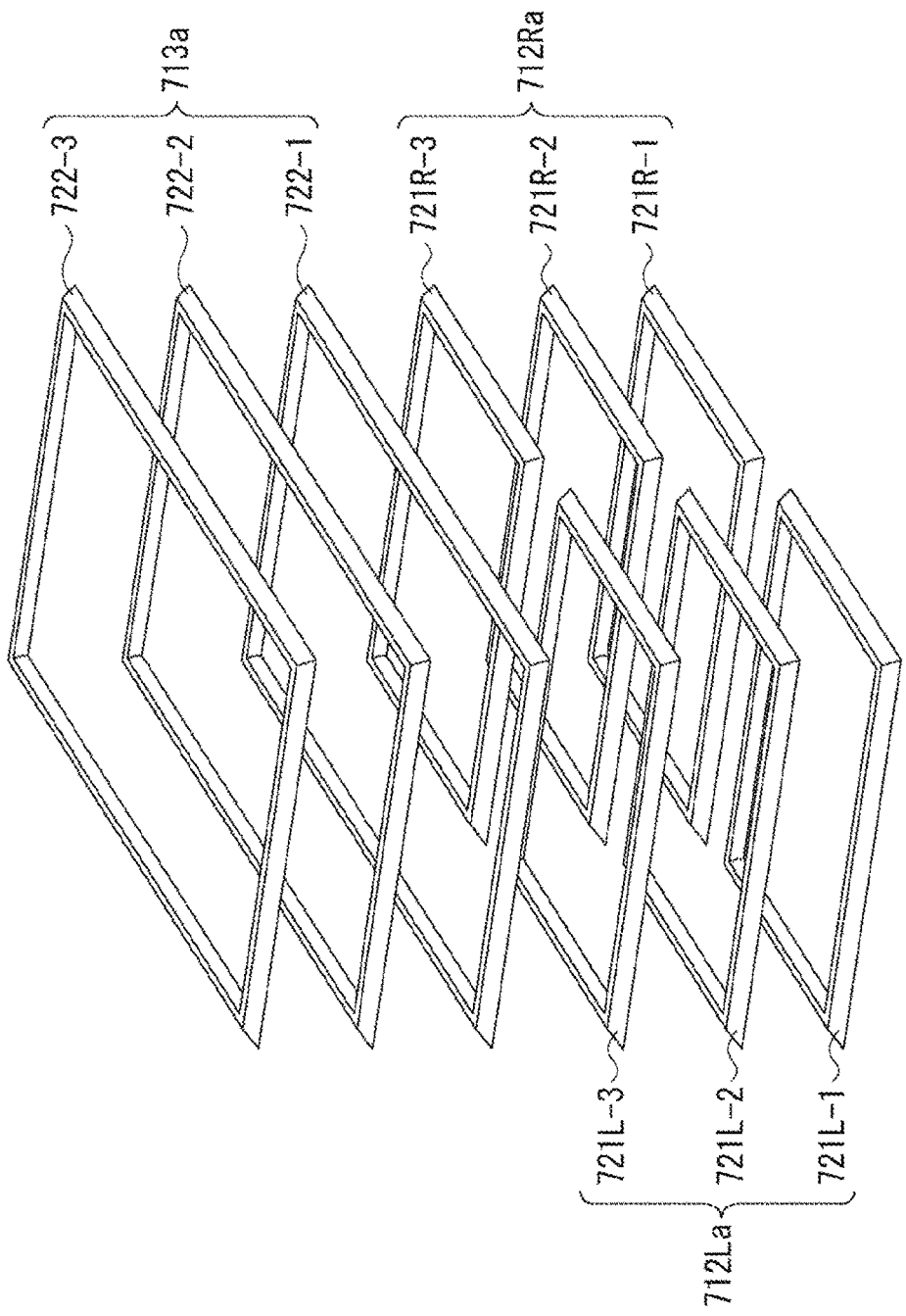
FIG. 42 is an image diagram schematically illustrating dummy wires forming the third embodiment of the moisture-resistant ring.

FIG. 42 is an image diagram schematically illustrating dummy wires forming the moisture-resistant ring 712La, the moisture-resistant ring 712Ra, and the moisture-resistant ring 713a. The moisture-resistant ring 712La is configured including substantially the same rectangular ring-shaped dummy wires 721L-1 to 721L-3. The moisture-resistant ring 712Ra is configured including substantially the same rectangular ring-shaped dummy wires 721R-1 to 721R-3. The moisture-resistant ring 713a is configured including substantially the same rectangular ring-shaped dummy wires 722-1 to 722-3.

Figure 43:
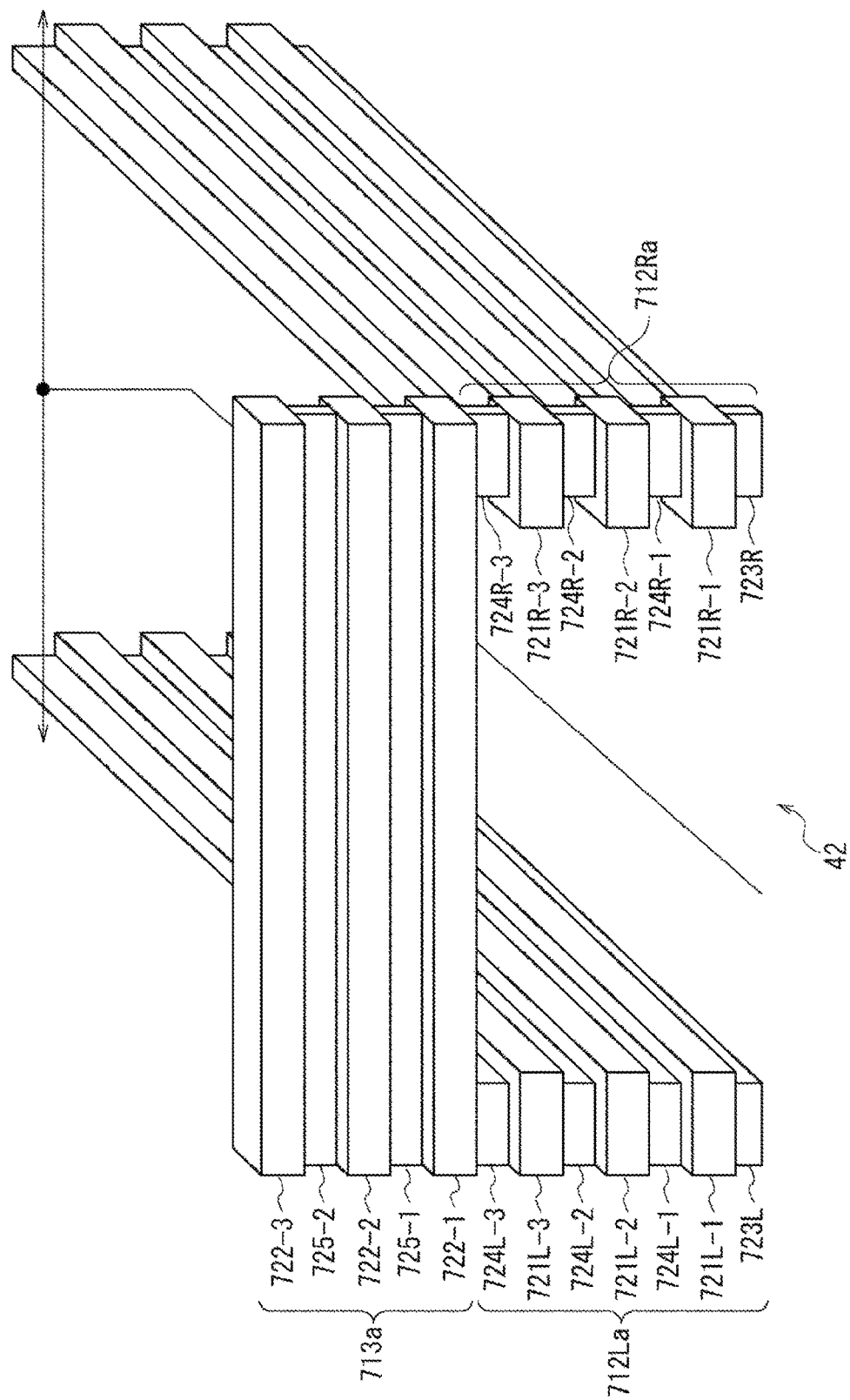
FIG. 43 is a perspective view schematically illustrating the third embodiment of the moisture-resistant ring.
Figure 44:
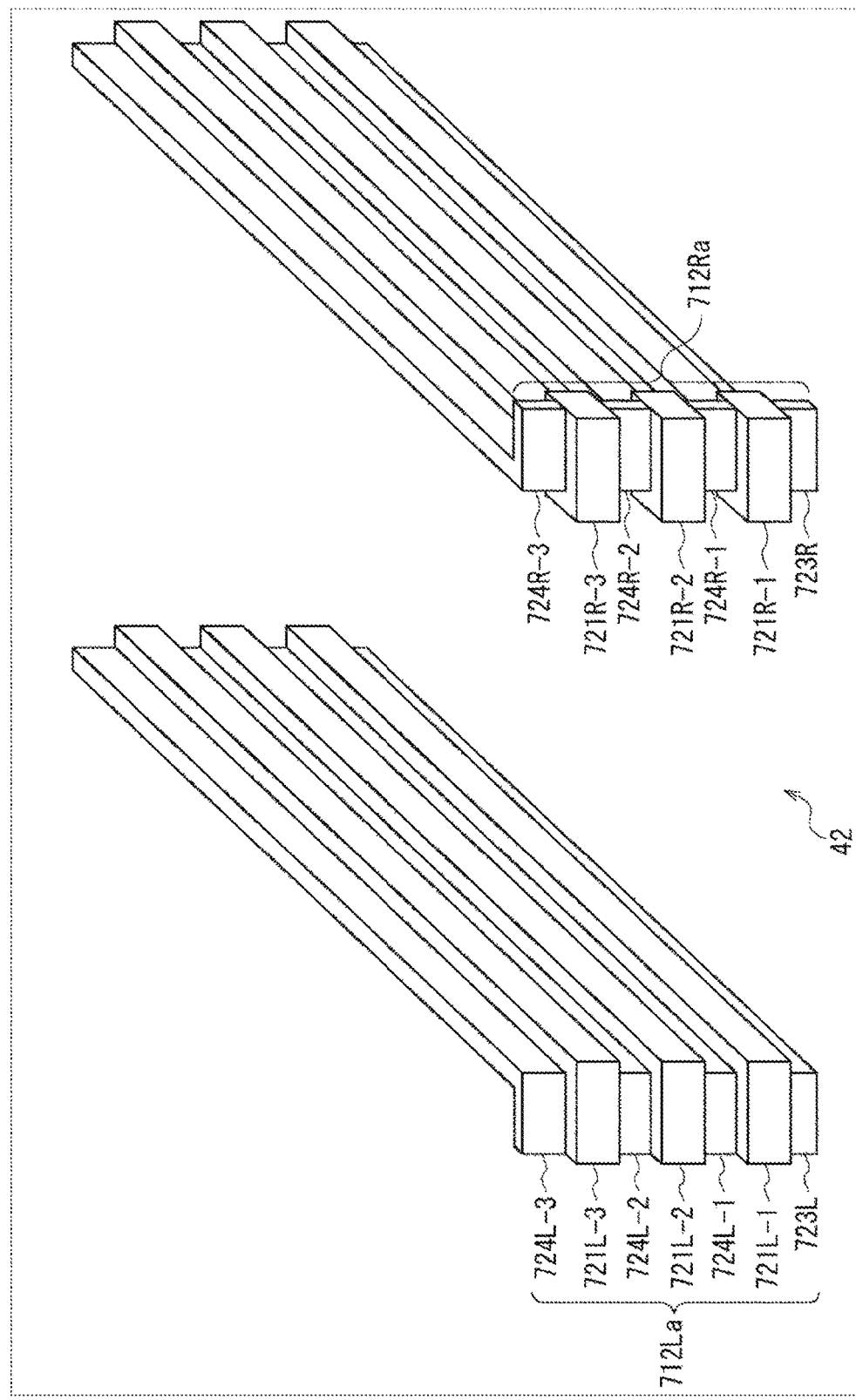
FIG. 44 is a perspective view schematically illustrating parts of layers of the third embodiment of the moisture-resistant ring.

FIG. 43 is a perspective view schematically illustrating the configuration of the moisture-resistant ring in the vicinity enclosed in a frame C1 of FIG. 41. FIG. 44 is a diagram of FIG. 43 excluding the moisture-resistant ring 713a.

The moisture-resistant ring 712La includes the dummy wires 721L-1 to 721L-3, a wall 723L made of a material of a contact, and walls 724L-1 to 724L-3 made of a material of a via. The moisture-resistant ring 712Ra includes the dummy wires 721R-1 to 721R-3, a wall 723R made of the material of a contact, and walls 724R-1 to 724R-3 made of the material of a via. The moisture-resistant ring 713a includes the dummy wires 722-1 to 722-3, and walls 725-1 and 725-2 made of the material of a via.

The dummy wires 721L-1 and 721R-1 are formed in the lowermost first wiring layer of the logic substrate 701. The dummy wires 721L-2 and 721R-2 are formed in a second wiring layer of the logic substrate 701. The dummy wires 721L-3 and 721R-3 are formed in a third wiring layer of the logic substrate 701. The dummy wire 722-1 is formed in a fourth wiring layer of the logic substrate 701. The dummy wire 722-2 is formed in a fifth wiring layer of the logic substrate 701. The dummy wire 722-3 is formed in the uppermost sixth wiring layer of the logic substrate 701.

The dummy wires 721L-1 to 721L-3 have substantially the same rectangular ring shape, and are formed along the vicinity of an outer periphery of the signal processing circuit 711L in each wiring layer in such a manner as to surround the periphery of the signal processing circuit 711L.

The wall 723L and the walls 724L-1 to 724L-3 have substantially the same rectangular ring shape, and are formed along the vicinity of the outer periphery of the signal processing circuit 711L in such a manner as to surround the periphery of the signal processing circuit 711L. The wall 723L is formed in the same step as a contact that connects a substrate layer 751 (FIG. 47 and the like) and the first wiring layer of the logic substrate 701 to connect the substrate layer 751 and the dummy wire 721L-1. The walls 724L-1 to 724L-3 are formed in the same step as vias that connect adjacent wiring layers of the first to fourth wiring layers. The wall 724L-1 is the via that connects the dummy wires 721L-1 and 721L-2. The wall 724L-2 is the via that connects the dummy wires 721L-2 and 721L-3. The wall 724L-3 is the via that connects the dummy wires 721L-3 and 722-1.

In this manner, the moisture-resistant ring 712La forms a wall that surrounds the periphery of the signal processing circuit 711L with the wall 723L to the wall 724L-3.

The dummy wires 721R-1 to 721R-3 have substantially the same rectangular ring shape, and are formed along the vicinity of an outer periphery of the signal processing circuit 711R in each wiring layer in such a manner as to surround the periphery of the signal processing circuit 711R.

The wall 723R and the walls 724R-1 to 724R-3 have substantially the same rectangular ring shape, and are formed along the vicinity of the outer periphery of the signal processing circuit 711R in such a manner as to surround the periphery of the signal processing circuit 711R. The wall 723R is formed in the same step as a contact that connects the substrate layer 751 (FIG. 47 and the like) and the first wiring layer of the logic substrate 701 to connect the substrate layer 751 and the dummy wire 721R-1. The walls 724R-1 to 724R-3 are formed in the same step as vias that connect adjacent wiring layers of the first to fourth wiring layers. The wall 724R-1 is a via that connects the dummy wires 721R-1 and 721R-2. The wall 724R-2 is a via that connects the dummy wires 721R-2 and 721R-3. The wall 724R-3 is a via that connects the dummy wires 721R-3 and 722-1.

In this manner, the moisture-resistant ring 712Ra forms a wall that surrounds the periphery of the signal processing circuit 711R with the wall 723R to the wall 724R-3.

The dummy wires 722-1 to 722-3 have substantially the same rectangular ring shape, and are formed along the vicinity of the outer periphery of the logic substrate 701 in each wiring layer in such a manner as to surround the outer periphery of the signal processing circuits 711L and 711R.

The walls 725-1 and 725-2 have substantially the same rectangular ring shape, and are formed along the vicinity of the outer periphery of the logic substrate 701 in such manner as to surround the outer periphery of the signal processing circuits 711L and 711R. The walls 725-1 and 725-2 are formed in the same step as vias that connect adjacent wiring layers of the fourth to sixth wiring layers. The wall 725-1 is a via that connects the dummy wires 722-1 and 722-2. The wall 725-2 is a via that connects the dummy wires 722-2 and 722-3.

In this manner, the moisture-resistant ring 713a forms a wall that surrounds the periphery of the logic substrate 701 with the dummy wires 722-1 to 722-3.

One-shot exposure is used to form the layers below the layer including the walls 724L-3 and 724R-3. Split exposure is used to form the layers above the layer including the dummy wire 722-1. Consequently, the cost can be reduced more than a case where split exposure is used to form all the layers, as described above with reference to FIGS. 24 to 26.

Moreover, for example, copper is used for the first to sixth wiring layers. In addition, the dummy wires 721L-1 to 721L-3, 721R-1 to 721R-3, and 722-1 to 722-3, and the walls 724L-1 to 724L-3, 724R-1 to 724R-3, 725-1, and 725-2 are made of copper. The walls 723L and 723R are made of tungsten. Moreover, for example, an insulating film made of a low-K material with a low dielectric constant is used for an inter-layer insulating film from a surface of the substrate layer 751 to an upper end of the sixth wiring layer.

In addition, for example, an inter-circuit wiring layer that connects the signal processing circuits 711L and 711R is provided in the same layers as the dummy wires 722-1 to 722-3. Accordingly, more complicated wiring can be achieved between the two signal processing circuits.

However, as illustrated in FIG. 43, if the moisture-resistant rings 712La and 712Ra and the moisture-resistant ring 713a are simply stacked, moisture enters the wiring layers and the signal processing circuits 711L and 711R of the logic substrate 701; accordingly, moisture resistance cannot be ensured.

For example, as indicated by an arrow of FIG. 43, moisture that has entered from the space between the moisture-resistant rings 712La and 712Ra on the side surfaces of the logic substrate 701 in areas enclosed in the frame C1 and a frame C2 of FIG. 41 proceeds upward in FIG. 43, and enters the inside of the moisture-resistant ring 713a. Furthermore, the moisture enters the inside of the moisture-resistant ring 712La and the inside of the moisture-resistant ring 712Ra over the moisture-resistant rings 712La and 712Ra.

Therefore, it is required to block these moisture entry paths and improve moisture resistance.

A second embodiment of the moisture-resistant ring with the dual-layer structure is described here with reference to FIGS. 45 to 48. The second embodiment is different in the improvement of moisture resistance from the first embodiment. Incidentally, the same reference signs are assigned to portions corresponding to FIGS. 43 and 44, in FIGS. 45 to 48.

Figure 45:
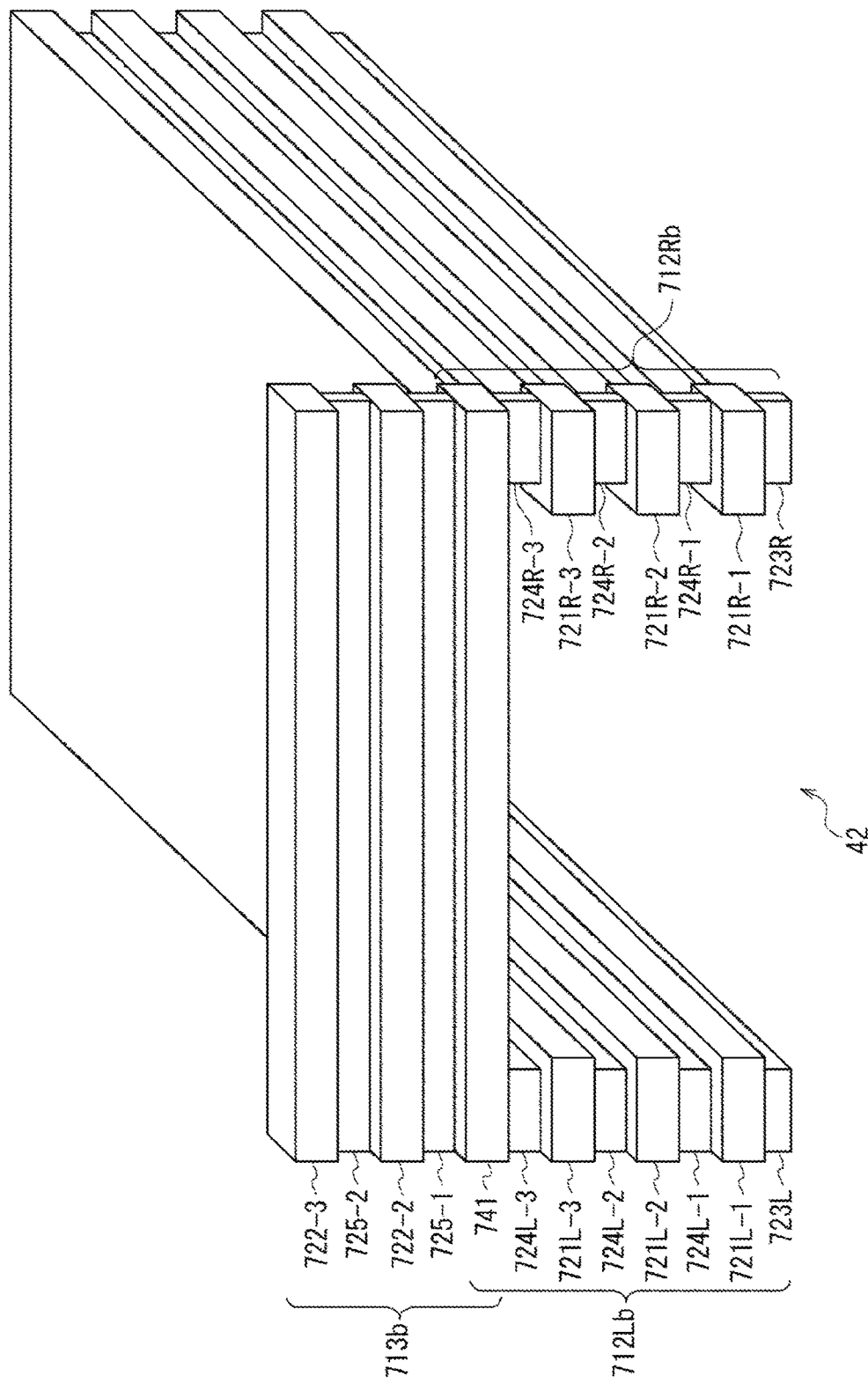
FIG. 45 is a perspective view schematically illustrating a fourth embodiment of the moisture-resistant ring.
Figure 46:
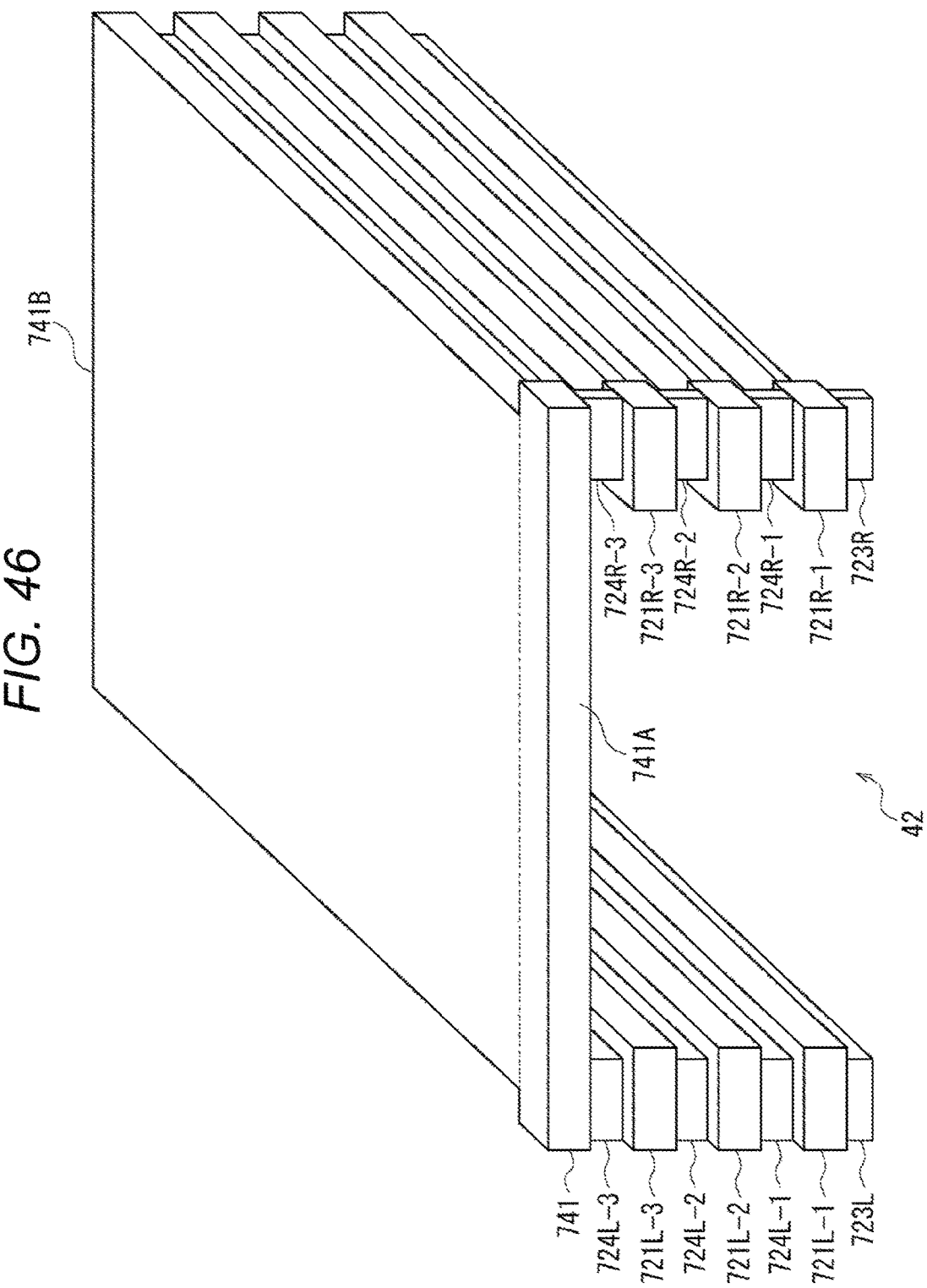
FIG. 46 is a perspective view schematically illustrating parts of layers of the fourth embodiment of the moisture-resistant ring.
Figure 47:
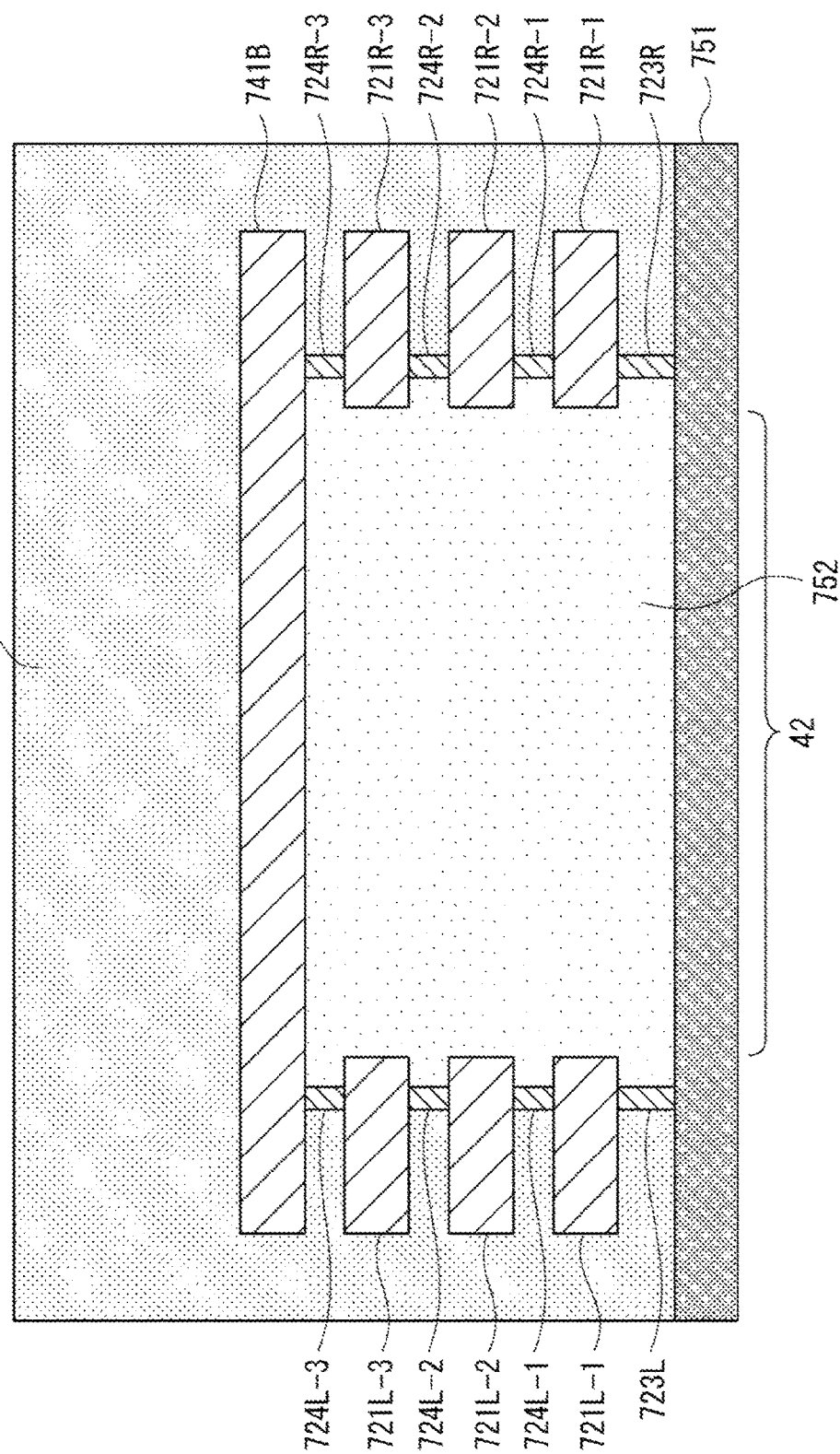
FIG. 47 is an A-A cross-sectional view illustrating the fourth embodiment of the moisture-resistant ring.
Figure 48:
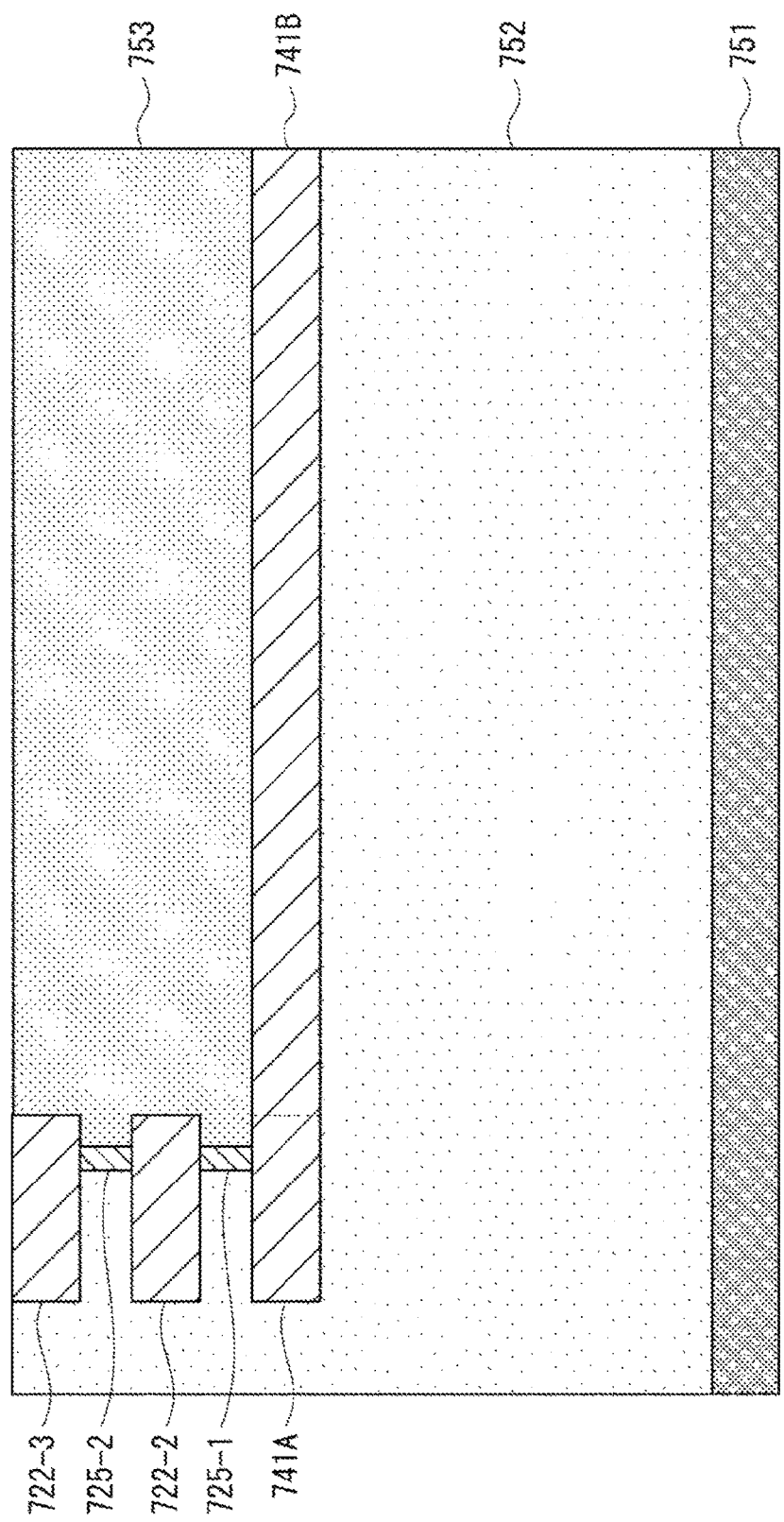
FIG. 48 is a B-B cross-sectional view illustrating the fourth embodiment of the moisture-resistant ring.

FIG. 45 is a perspective view schematically illustrating the configuration of the moisture-resistant ring in the vicinity enclosed in the frame C1 of FIG. 41. FIG. 46 is a diagram of FIG. 44 excluding a portion above the wall 725-1. FIG. 47 is a cross-sectional view of an A-A part of FIG. 41. FIG. 48 is a cross-sectional view of a B-B part of FIG. 41.

FIG. 45 is different from FIG. 43 in that instead of the dummywire 722-1, a dummywire 741 is provided in the fourth wiring layer. In addition, the moisture-resistant ring with the dual-layer structure includes a moisture-resistant ring 712Lb, a moisture-resistant ring 712Rb, and a moisture-resistant ring 713b.

The moisture-resistant ring 712Lb includes the dummy wires 721L-1 to 721L-3, the wall 723L, the walls 724L-1 to 724L-3, and part of the dummywire 741. The moisture-resistant ring 712Rb includes the dummy wires 721R-1 to 721R-3, the wall 723R, the walls 724R-1 to 724R-3, and part of the dummy wire 741. The moisture-resistant ring 713b includes the dummy wires 722-2 and 722-3, the walls 725-1 and 725-2, and part of the dummy wire 741. The dummy wire 741 is located at the boundary between the moisture-resistant rings 712Lb and 712Rb and the moisture-resistant ring 713b, and is included as a component of each moisture-resistant ring.

Incidentally, the dummy wire 741 is described below, separated into a ring portion 741A and a lid portion 741B by an auxiliary line indicated by a dotted line of FIG. 46, as appropriate.

The ring portion 741A of the dummy wire 741 has the same shape as the dummy wire 722-1 of FIG. 43. Therefore, the dummy wire 741 has the shape of the dummy wire 722-1 with the addition of the lid portion 741B.

The lid portion 741B has a rectangular plate shape extending in the front-and-back direction, and connects the front and back sides of the ring portion 741A. The left side surface of the lid portion 741B is at substantially the same position as the left side surface of the right side of the dummy wire 721L-3 in the left-and-right direction. The right side surface of the lid portion 741B is at substantially the same position as the right side surface of the left side of the dummy wire 721R-3 in the left-and-right direction.

Therefore, a barrier unit including the partial ring portion 741A and the lid portion 741B of the dummy wire 741 blocks an upper surface of an area between the moisture-resistant rings 712Lb and 712Rb. In other words, the barrier unit separates the area between the moisture-resistant rings 712Lb and 712Rb and an area surrounded by the moisture-resistant ring 713b. Consequently, as illustrated in FIGS. 47 and 48, the moisture-resistant ring 712Lb, the moisture-resistant ring 712Rb, and the moisture-resistant ring 713b ensure the separation of a non-moisture resistant area 752 and a moisture-resistant area 753.

Incidentally, the non-moisture resistant area 752 is an area that is not surrounded by any of the moisture-resistant rings 712Lb, 712Rb, and 713b on the substrate layer 751. The moisture-resistant area 753 is an area surrounded by at least one of the moisture-resistant rings 712Lb, 712Rb, and 713b on the substrate layer 751. Circuits, wires, and the like are provided in the moisture-resistant area 753; accordingly, moisture resistance is required.

In addition, also if, for example, an insulating film made of a low-K material is used for the inter-layer insulating film from the surface of the substrate layer 751 to the upper end of the sixth wiring layer, including the layers adjacent to the layer including the barrier unit, moisture that has entered the non-moisture resistant area 752 is prevented from entering the moisture-resistant area 753. Therefore, the moisture resistance of the moisture-resistant area 753 is retained, and the reliability of a solid state imaging device using the logic substrate 701 improves.

Moreover, as compared to the above-mentioned technology disclosed in Patent Document 3, there is no need to provide a moisture-resistant film dedicated to ensure moisture resistance. Accordingly, it is possible to reduce the manufacturing process and reduce the manufacturing cost.

Incidentally, split exposure is used to form the fourth wiring layer including the dummy wire 741.

Next, a third embodiment of the moisture-resistant ring with the dual-layer structure is described with reference to FIGS. 49 to 54. The third embodiment is for improving moisture resistant as in the second embodiment. Incidentally, the same reference signs are as signed to portions corresponding to FIGS. 43 and 44, in FIGS. 49 to 54.

Figure 49:
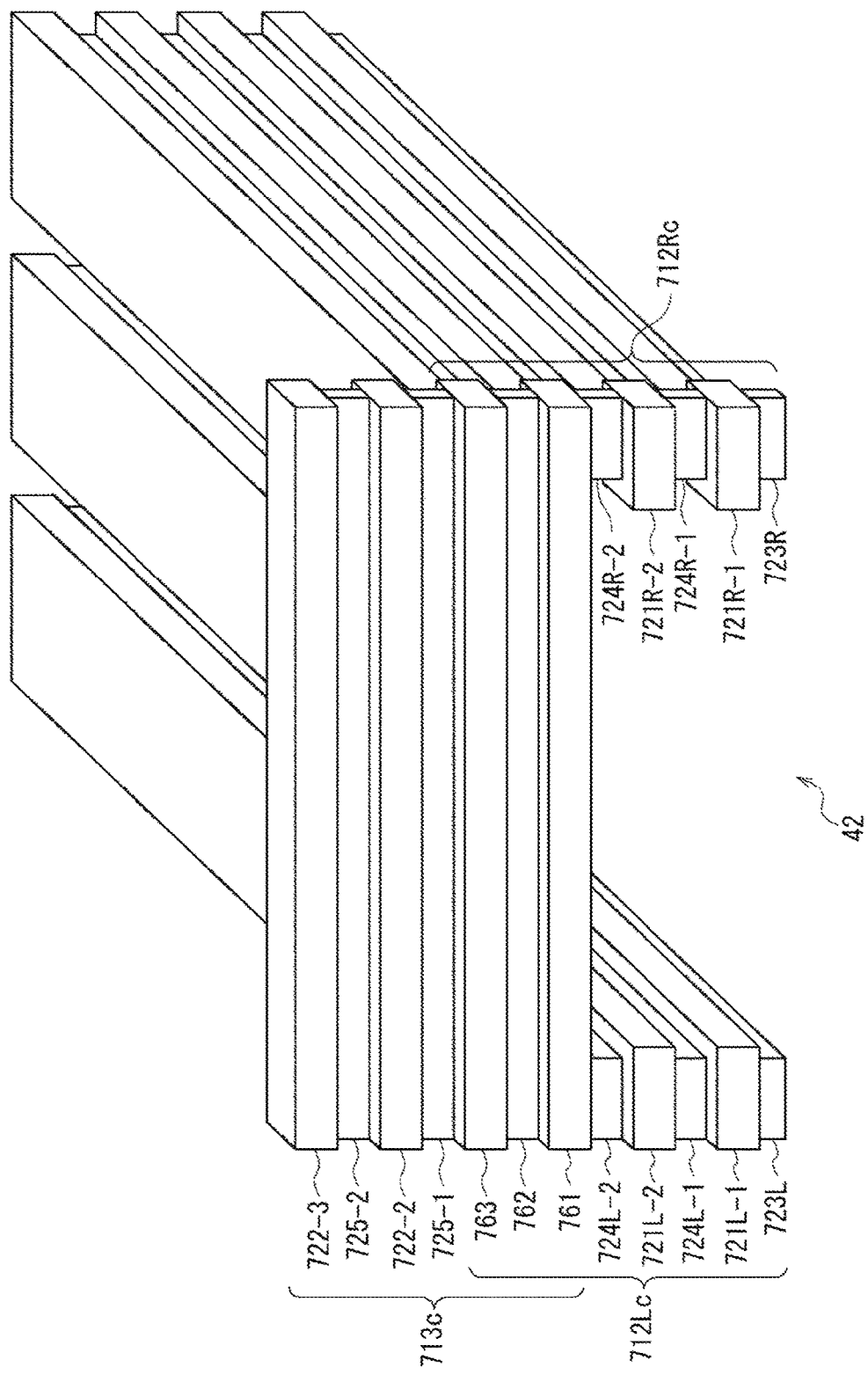
FIG. 49 is a perspective view schematically illustrating a fifth embodiment of the moisture-resistant ring.
Figure 50:
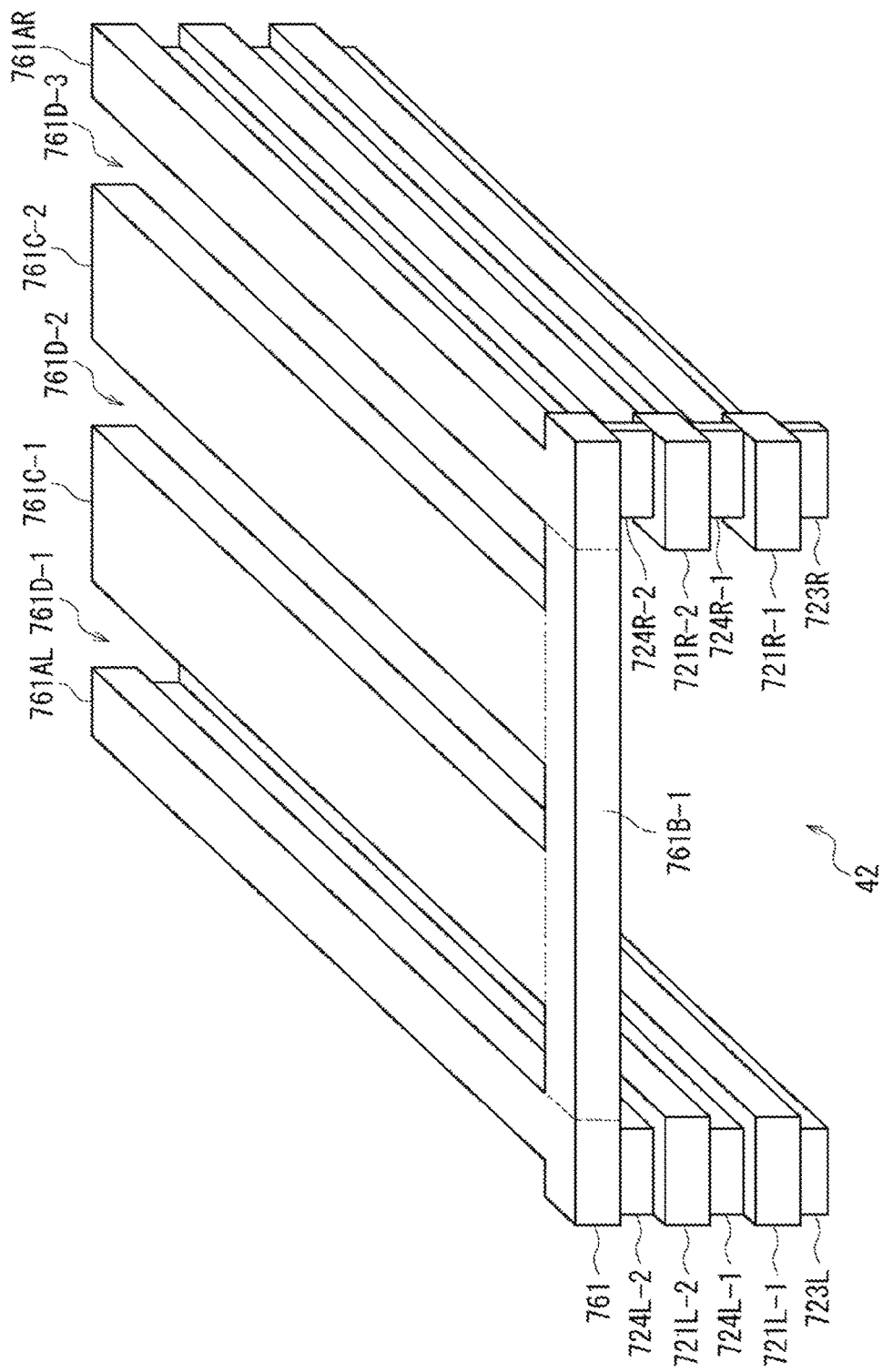
FIG. 50 is a perspective view schematically illustrating parts of layers of the fifth embodiment of the moisture-resistant ring.
Figure 51:
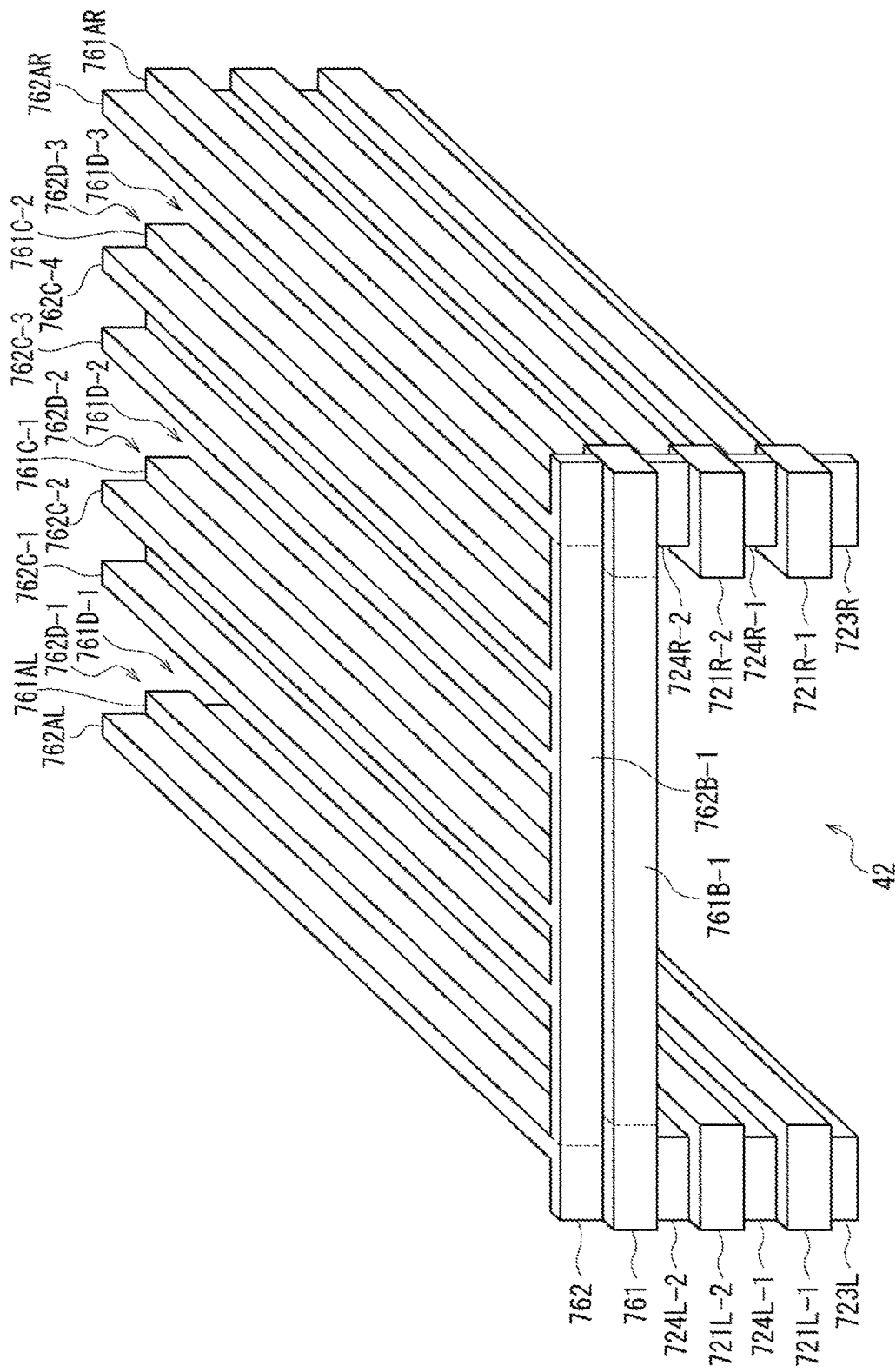
FIG. 51 is a perspective view schematically illustrating parts of layers of the fifth embodiment of the moisture-resistant ring.
Figure 52:
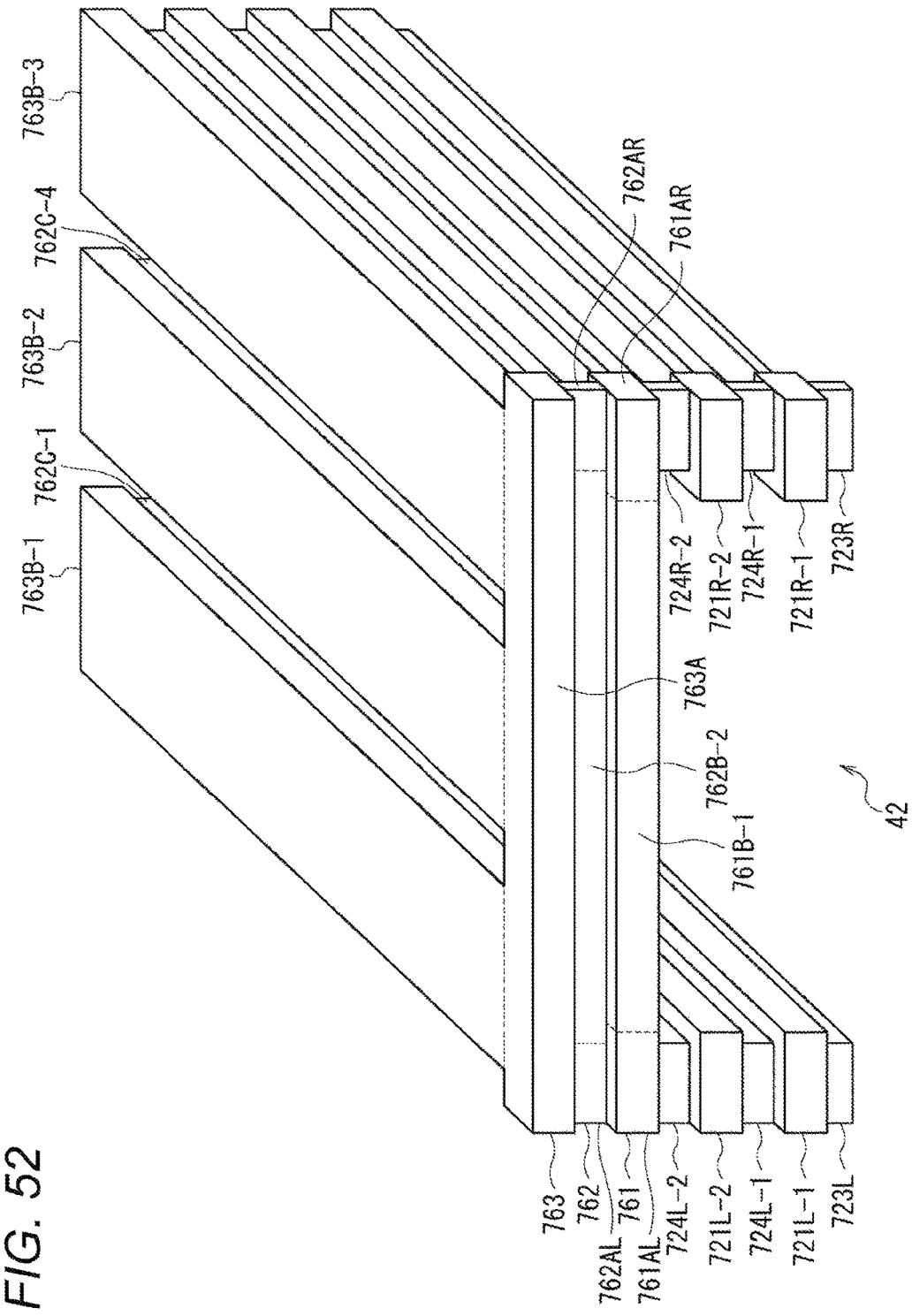
FIG. 52 is a perspective view schematically illustrating parts of layers of the fifth embodiment of the moisture-resistant ring.
Figure 53:
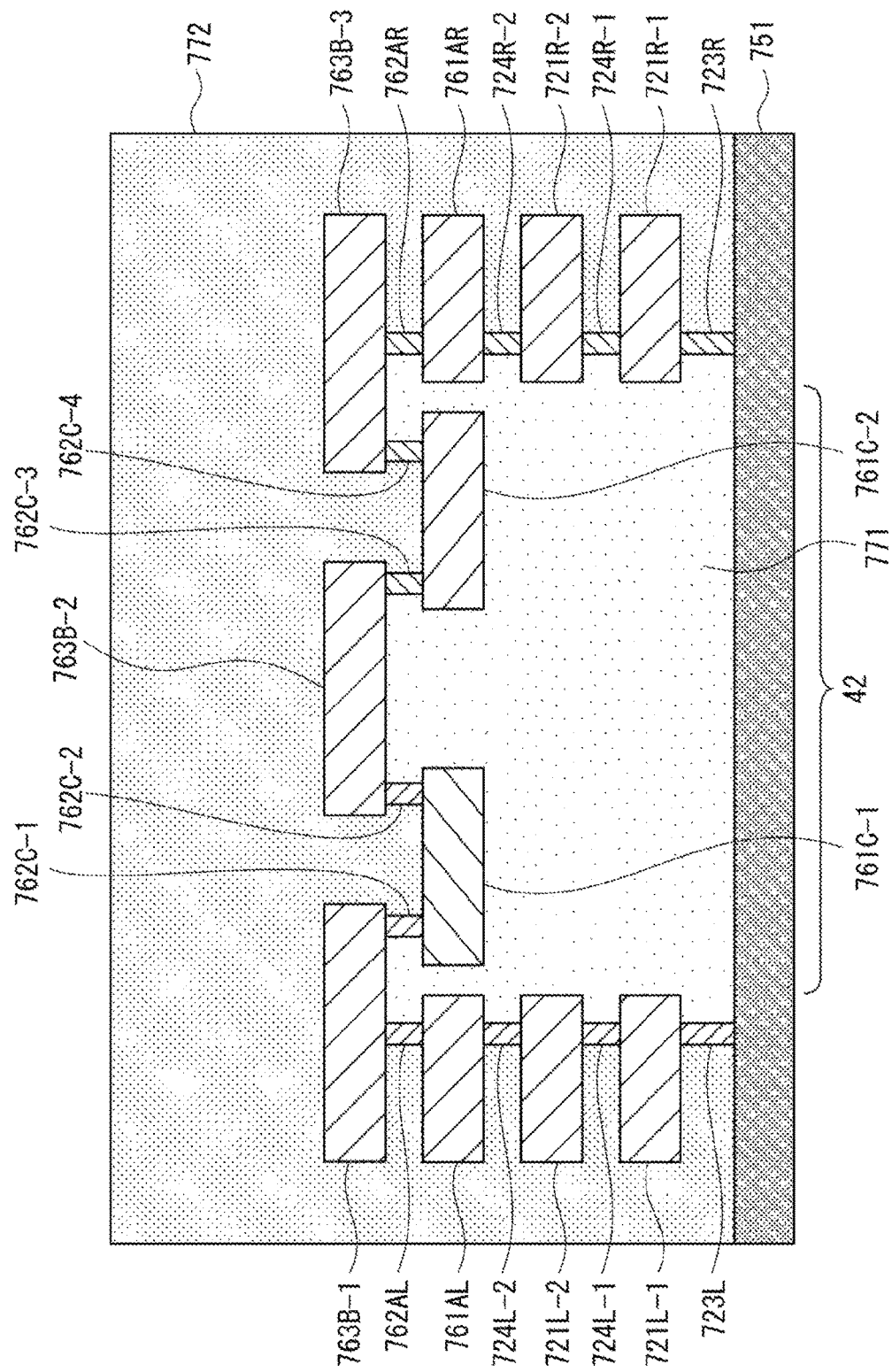
FIG. 53 is an A-A cross-sectional view illustrating the fifth embodiment of the moisture-resistant ring.
Figure 54:
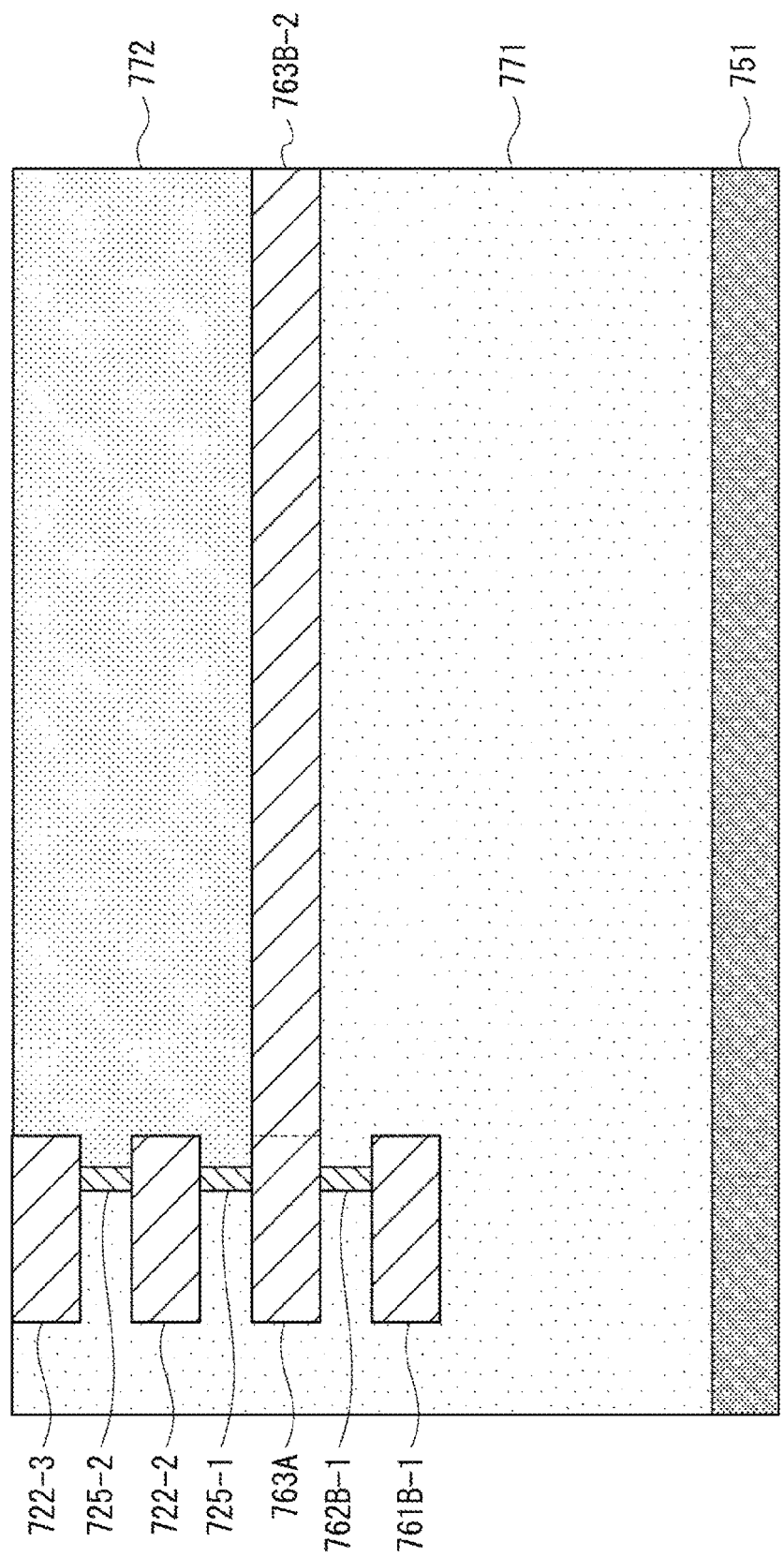
FIG. 54 is a B-B cross-sectional view illustrating the fifth embodiment of the moisture-resistant ring.

FIG. 49 is a perspective view schematically illustrating the configuration of the moisture-resistant ring in the vicinity enclosed in the frame C1 of FIG. 41. FIG. 50 is a diagram of FIG. 49 excluding a portion above a wall 762. FIG. 51 is a diagram of FIG. 50 with the addition of the wall 762. FIG. 52 is a diagram of FIG. 51 with the addition of a dummy wire 763. FIG. 53 is a cross-sectional view of the A-A part of FIG. 41. FIG. 54 is a cross-sectional view of the B-B part of FIG. 41.

FIG. 49 is different from FIG. 43 in the configuration from the third to fourth wiring layers. Specifically, instead of the dummy wires 721L-3 and the dummy wire 721R-3, a dummy wire 761 is provided in the third wiring layer. Instead of the walls 724L-3 and 724R-3, the wall 762 is provided between the third and fourth wiring layers. Instead of the dummy wire 722-1, the dummy wire 763 is provided in the fourth wiring layer. In addition, the moisture-resistant ring with the dual-layer structure includes moisture-resistant rings 712Lc, 712Rc, and 713c.

The moisture-resistant ring 712Lc includes the dummy wires 721L-1 and 721L-2, the wall 723L, the walls 724L-1 and 724L-2, part of the dummy wire 761, part of the wall 762, and part of the dummy wire 763. The moisture-resistant ring 712Rc includes the dummy wires 721R-1 and 721R-2, the wall 723R, the walls 724R-1 and 724R-2, part of the dummy wire 761, part of the wall 762, and part of the dummy wire 763. The moisture-resistant ring 713c includes the dummy wires 722-2 and 722-3, the walls 725-1 and 725-2, part of the dummy wire 761, part of the wall 762, and part of the dummy wire 763. The dummy wire 761, the wall 762, and the dummy wire 763 are located at the boundary between the moisture-resistant rings 712Lc and 712Rc and the moisture-resistant ring 713c, and are included as components of each moisture-resistant ring.

Incidentally, the dummy wire 761 is described below, separated into a ring portion 761AL, a ring portion 761AR, a connection portion 761B-1, a connection portion 761B-2 (not illustrated), a lid portion 761C-1, and a lid portion 761C-2 by auxiliary lines indicated by dotted lines of FIG. 50, as appropriate. Moreover, the wall 762 is described below, separated into a ring portion 762AL, a ring portion 762AR, a connection portion 762B-1, a connection portion 762B-2 (not illustrated), and connection portions 762C-1 to 762C-4 by an auxiliary line indicated by a dotted line of FIG. 51, as appropriate. Furthermore, the dummy wire 763 is described below, separated into a ring portion 763A and lid portions 763B-1 to 763B-3 by an auxiliary line indicated by a dotted line of FIG. 52, as appropriate.

The ring portions 761AL and 761AR of the dummy wire 761 have the same shape as the dummy wires 721L-3 and 721R-3 of FIG. 43. Therefore, the dummy wire 761 has a shape where the connection portion 761B-1, the connection portion 761B-2, the lid portion 761C-1, and the lid portion 761C-2 are added to the dummy wires 721L-3 and 721R-3.

The connection portion 761B-1 connects the front side of the ring portion 761AL and the front side of the ring portion 761AR. The unillustrated connection portion 761B-2 connects the back side of the ring portion 761AL and the back side of the ring portion 761AR. Therefore, the sides of the ring portion 761AL excluding the right side, the sides of the ring portion 761AR excluding the left side, the connection portion 761B-1, and the connection portion 761B-2 form a ring that surrounds the outer periphery of the signal processing circuits 711L and 711R along the vicinity of the outer periphery of the logic substrate 701.

The lid portions 761C-1 and 761C-2 have a rectangular plate shape extending in the front-and-back direction, and connect the connection portions 761B-1 and 761B-2. The lid portions 761C-1 and 761C-2 are placed at predetermined spacings between the right side of the ring portion 761AL and the left side of the ring portion 761AR.

A rectangular opening portion 761D-1 is then formed between the right side of the ring portion 761AL and the lid portion 761C-1. A rectangular opening portion 761D-2 is formed between the lid portions 761C-1 and 761C-2. A rectangular opening portion 761D-3 is formed between the lid portion 761C-2 and the left side of the ring portion 761AR. The opening portions 761D-1 to 761D-3 are of substantially the same size.

The wall 762 is a via that connects the dummy wires 761 and 763. The ring portions 762AL and 761AR of the wall 762 have the same shape as the walls 724L-3 and 724R-3 of FIG. 43. Therefore, the wall 762 has a shape where the connection portions 762B-1, 762B-2, and 762C-1 to 762C-4 are added to the walls 724L-3 and 724R-3.

The connection portion 762B-1 connects the front side of the ring portion 762AL and the front side of the ring portion 762AR on an upper surface of the connection portion 761B-1 of the dummy wire 761. The unillustrated connection portion 762B-2 connects the back side of the ring portion 762AL and the back side of the ring portion 762AR on an upper surface of the connection portion 761B-2 (not illustrated) of the dummy wire 761. Therefore, the sides of the ring portion 762AL excluding the right side, the sides of the ring portion 762AR excluding the left side, the connection portion 762B-1, and the connection portion 762B-2 form a ring that surrounds the outer periphery of the signal processing circuits 711L and 711R along the vicinity of the outer periphery of the logic substrate 701.

The connection portions 762C-1 to 762C-4 have a rectangular plate shape extending in the front-and-back direction, and connect the connection portions 762B-1 and 762B-2. The connection portions 761C-1 to 761C-4 are placed at predetermined spacings between the right side of the ring portion 762AL and the left side of the ring portion 762AR. The connection portion 762C-1 is placed near the left end of an upper surface of the lid portion 761C-1 of the dummy wire 761. The connection portion 762C-2 is placed near the right end of the upper surface of the lid portion 761C-1 of the dummy wire 761. The connection portion 762C-3 is placed near the left end of an upper surface of the lid portion 761C-2 of the dummy wire 761. The connection portion 762C-4 is placed near the right end of the upper surface of the lid portion 761C-2 of the dummy wire 761.

Then, the ring portion 762AL, the connection portion 762B-1, the connection portion 762C-1, and the connection portion 762B-2 (not illustrated) form an opening portion 762D-1 in such a manner as to surround the periphery of the opening portion 761D-1 of the dummy wire 761. The connection portion 762C-2, the connection portion 762B-1, the connection portion 762C-3, and the connection portion 762B-2 (not illustrated) form an opening portion 762D-2 in such a manner as to surround the periphery of the opening portion 761D-2 of the dummy wire 761. The connection portion 762C-4, the connection portion 762B-1, the ring portion 762AR, and the connection portion 762B-2 (not illustrated) form an opening portion 762D-3 in such a manner as to surround the periphery of the opening portion 761D-3 of the dummy wire 761.

The ring portion 763A of the dummy wire 763 has the same shape as the dummy wire 722-1 of FIG. 43. Therefore, the dummy wire 763 has the shape of the dummy wire 722-1 with the addition of the lid portions 763B-1 to 763B-3.

The lid portions 763B-1 to 763B-3 have a plate shape extending in the front-and-back direction, and connect the front side and the back side of the ring portion 763A.

The left side surface of the lid portion 763B-1 is located leftward of the right side of the ring portion 762AL of the wall 762 in the left-and-right direction, and is at substantially the same position as the left side surface of the right side of the ring portion 761AL of the dummy wire 761. The right side surface of the lid portion 763B-1 is located slightly rightward of the connection portion 762C-1 of the wall 762 in the left-and-right direction. Therefore, the lid portion 763B-1 blocks the opening portion 762D-1 of the wall 762 from above.

The left side surface of the lid portion 763B-2 is located slightly leftward of the connection portion 762C-2 of the wall 762 in the left-and-right direction. The right side surface of the lid portion 763B-2 is located slightly rightward of the connection portion 762C-3 of the wall 762 in the left-and-right direction. Therefore, the lid portion 763B-2 blocks the opening portion 762D-2 of the wall 762 from above.

The left side surface of the lid portion 763B-3 is located slightly leftward of the connection portion 762C-4 of the wall 762 in the left-and-right direction. The right side surface of the lid portion 763B-3 is located slightly rightward of the left side of the ring portion 762AR of the wall 762 in the left-and-right direction, and is at substantially the same position as the right side surface of the left side of the ring portion 761AR of the dummy wire 761. Therefore, the lid portion 763B-3 blocks the opening portion 762D-3 of the wall 762 from above.

A barrier unit including part of the dummy wire 761, part of the wall 762, and part of the dummy wire 763 then blocks an upper surface of an area between the moisture-resistant rings 712Lc and 712Rc. In other words, the barrier unit separates the area between the moisture-resistant rings 712Lc and 712Rc and an area surrounded by the moisture-resistant ring 713c.

Consequently, as illustrated in FIGS. 53 and 54, the moisture-resistant rings 712Lc, 712Rc, and 713c ensure the separation of a non-moisture resistant area 771 and a moisture-resistant area 772. Accordingly, moisture that has entered the non-moisture resistant area 771 is prevented from entering the moisture-resistant area 772. Therefore, the moisture resistance of the moisture-resistant area 772 is retained, and the reliability of a solid state imaging device using the logic substrate 701 improves.

Moreover, as illustrated in FIG. 53, the dummy wires in the third wiring layer and the dummy wires in the fourth wiring layer are alternately placed in the left-and-right direction in the barrier unit. The barrier unit has a chain structure having a cross section of a rectangular wave-like shape. Consequently, the area of each dummy wire can be made smaller than the above-mentioned lid portion 741B of the dummy wire 741 of FIG. 46 to facilitate manufacturing.

Furthermore, as compared to the above-mentioned technology disclosed in Patent Document 3, there is no need to provide a moisture-resistant film dedicated to ensure moisture resistance. Accordingly, it is possible to reduce the manufacturing process and reduce the manufacturing cost.

Incidentally, split exposure is used to from the third wiring layer including the dummy wire 761, a layer including the wall 762 between the third and fourth wiring layers, and the fourth wiring layer including the dummy wire 763.

Moreover, the number of alternately repeated dummy wires in the third and fourth wiring layers in the left-and-right direction is not limited to this example and can be set to any given number.

Furthermore, the barrier unit may be formed using three or more wiring layers.

Next, a fourth embodiment of the moisture-resistant ring with the dual-layer structure is described with reference to FIGS. 55 to 60. The fourth embodiment is for improving moisture resistance as in the second and third embodiments. Incidentally, the same reference sings are assigned to portions corresponding to FIGS. 43 and 44, in FIGS. 55 to 60.

Figure 55:
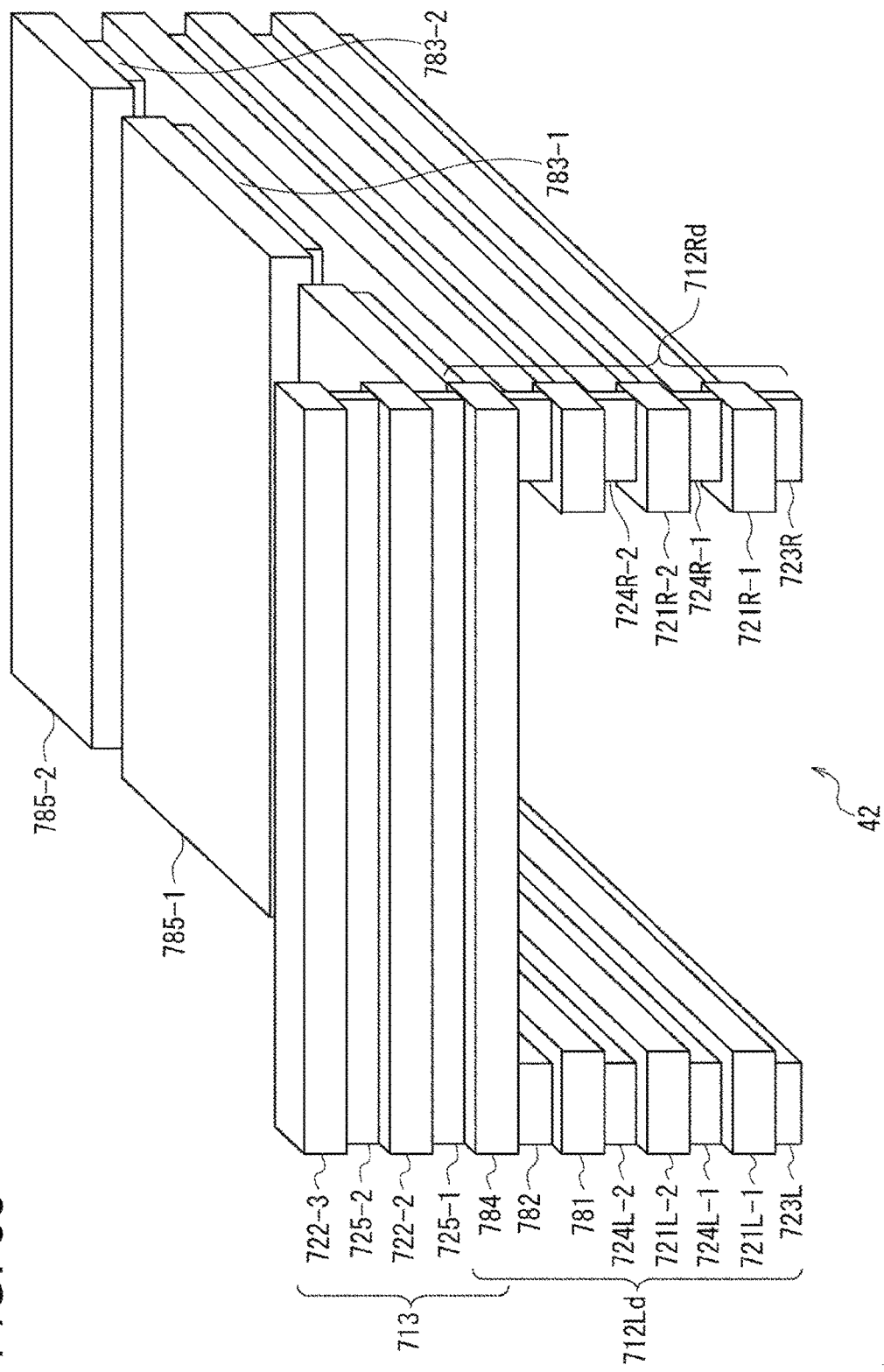
FIG. 55 is a perspective view schematically illustrating a sixth embodiment of the moisture-resistant ring.
Figure 56:
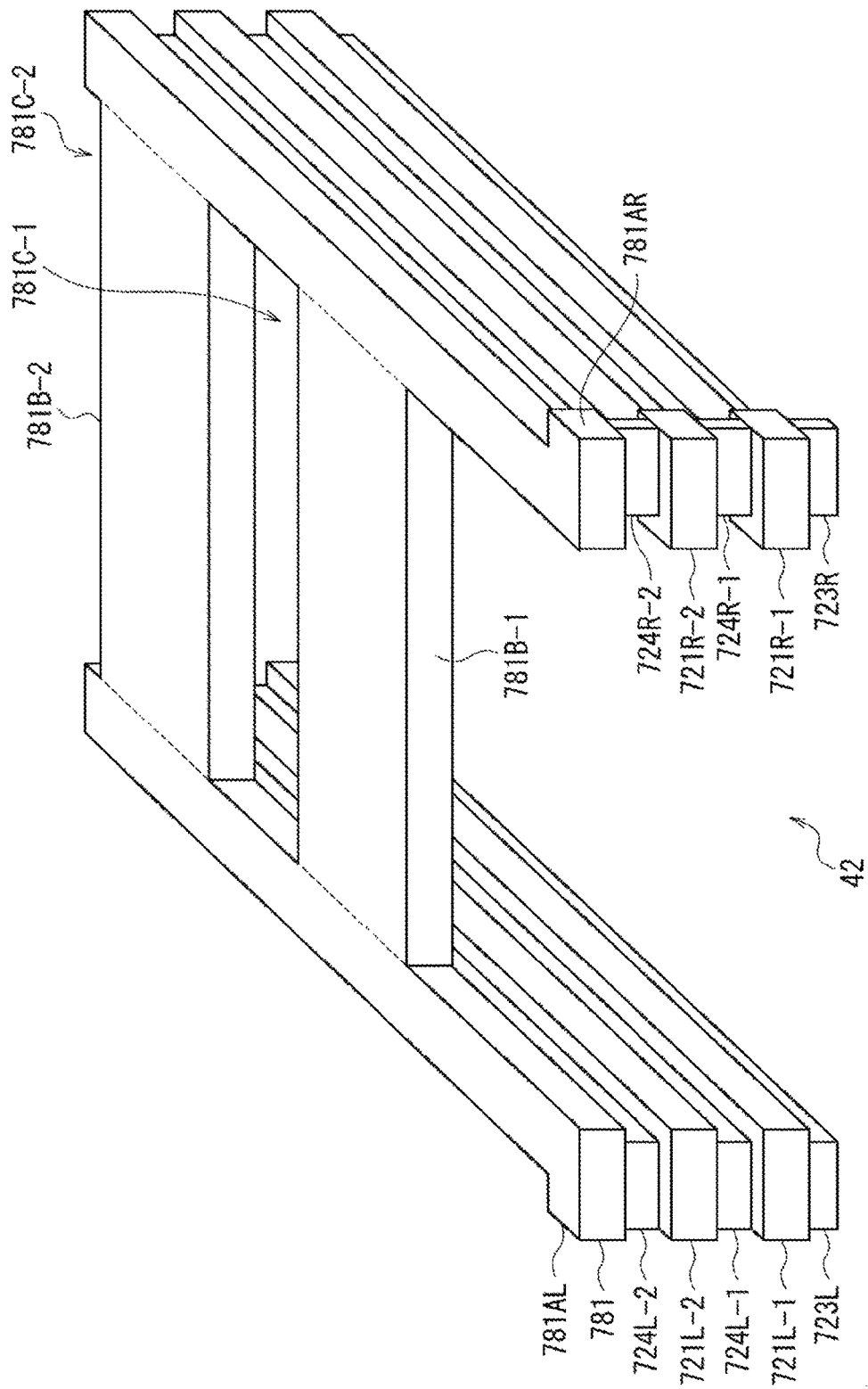
FIG. 56 is a perspective view schematically illustrating parts of layers of the sixth embodiment of the moisture-resistant ring.
Figure 57:
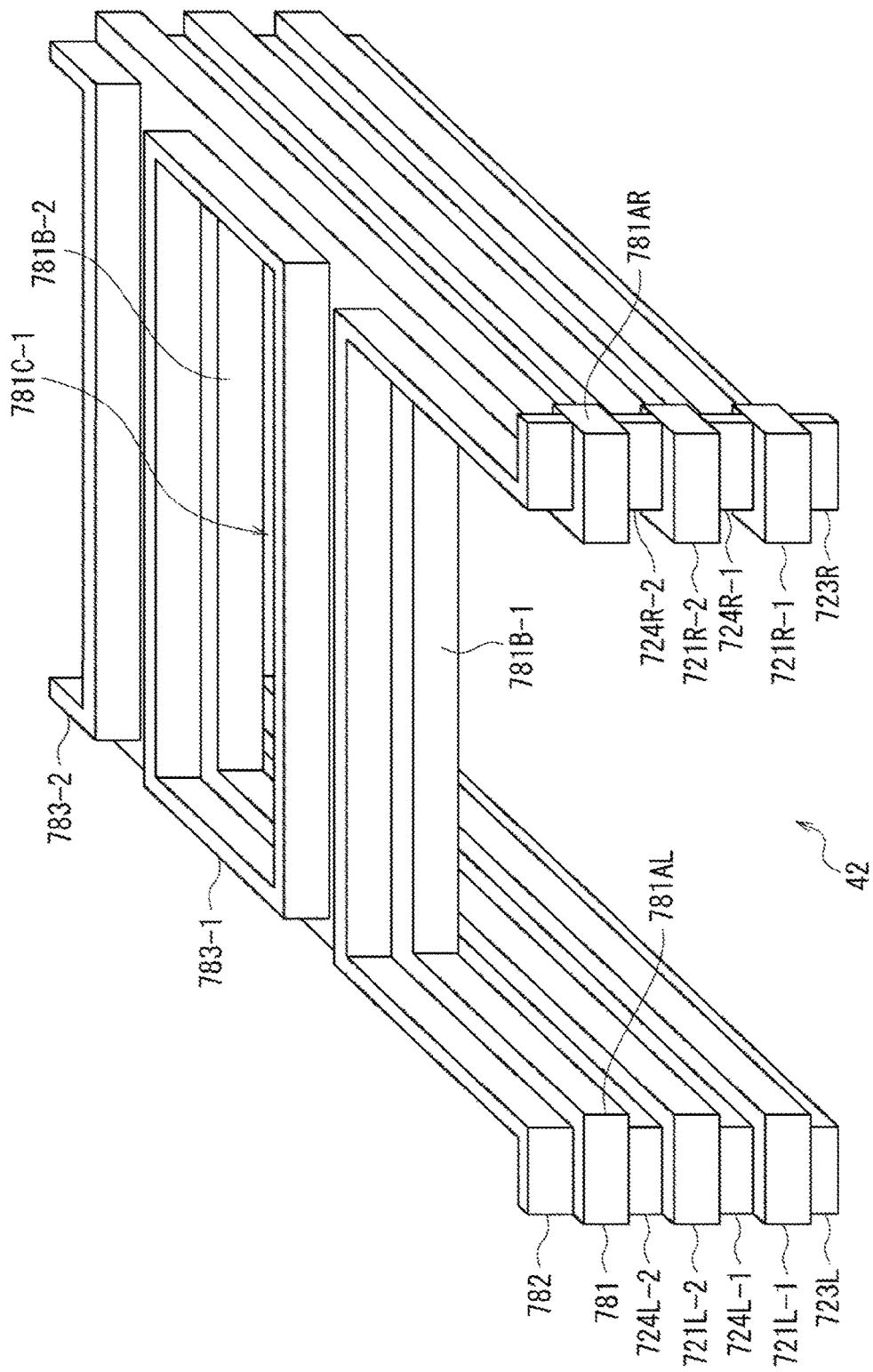
FIG. 57 is a perspective view schematically illustrating parts of layers of the sixth embodiment of the moisture-resistant ring.
Figure 58:
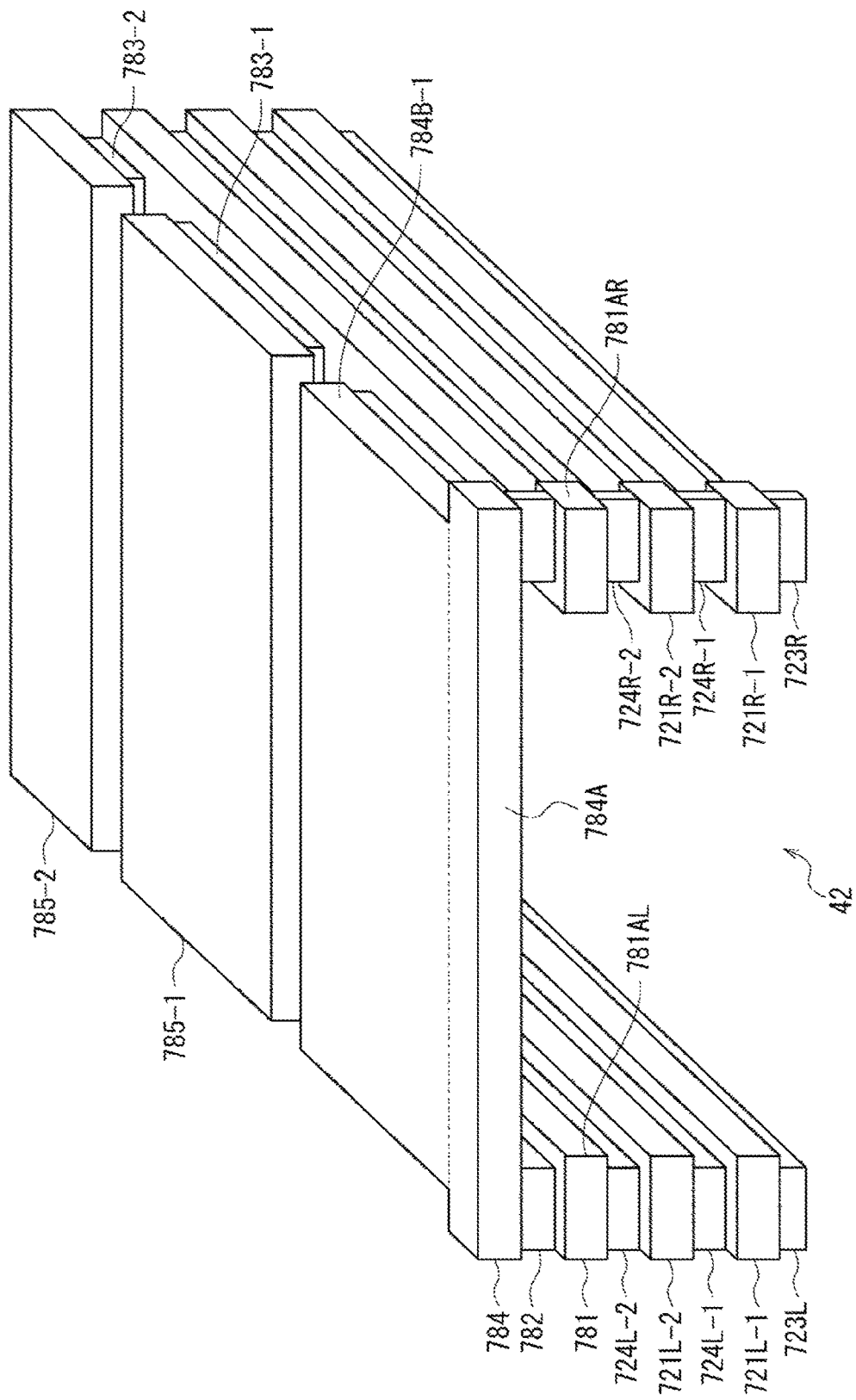
FIG. 58 is a perspective view schematically illustrating parts of the layer of the sixth embodiment of the moisture-resistant ring.
Figure 59:
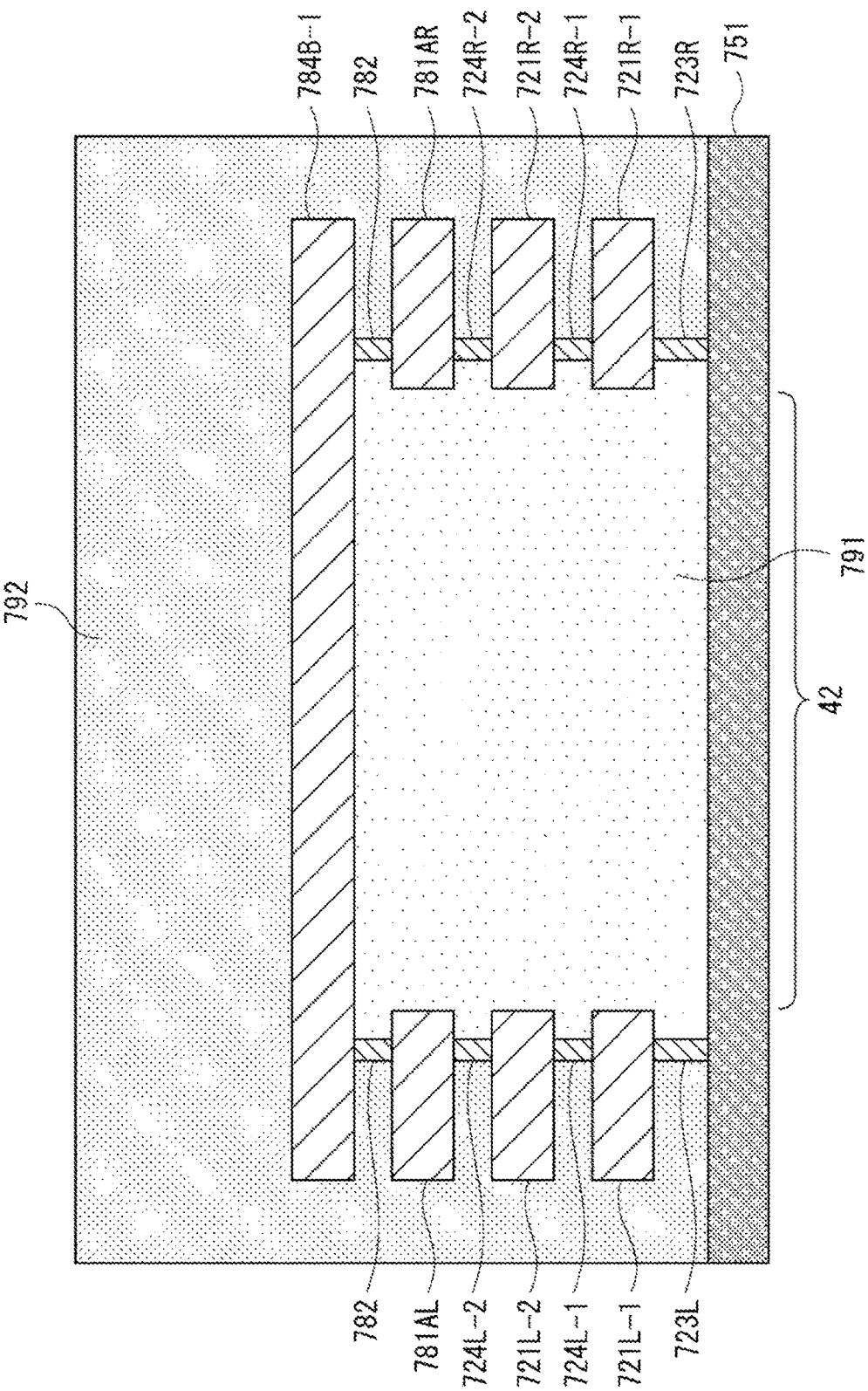
FIG. 59 is an A-A cross-sectional view illustrating the sixth embodiment of the moisture-resistant ring.
Figure 60:
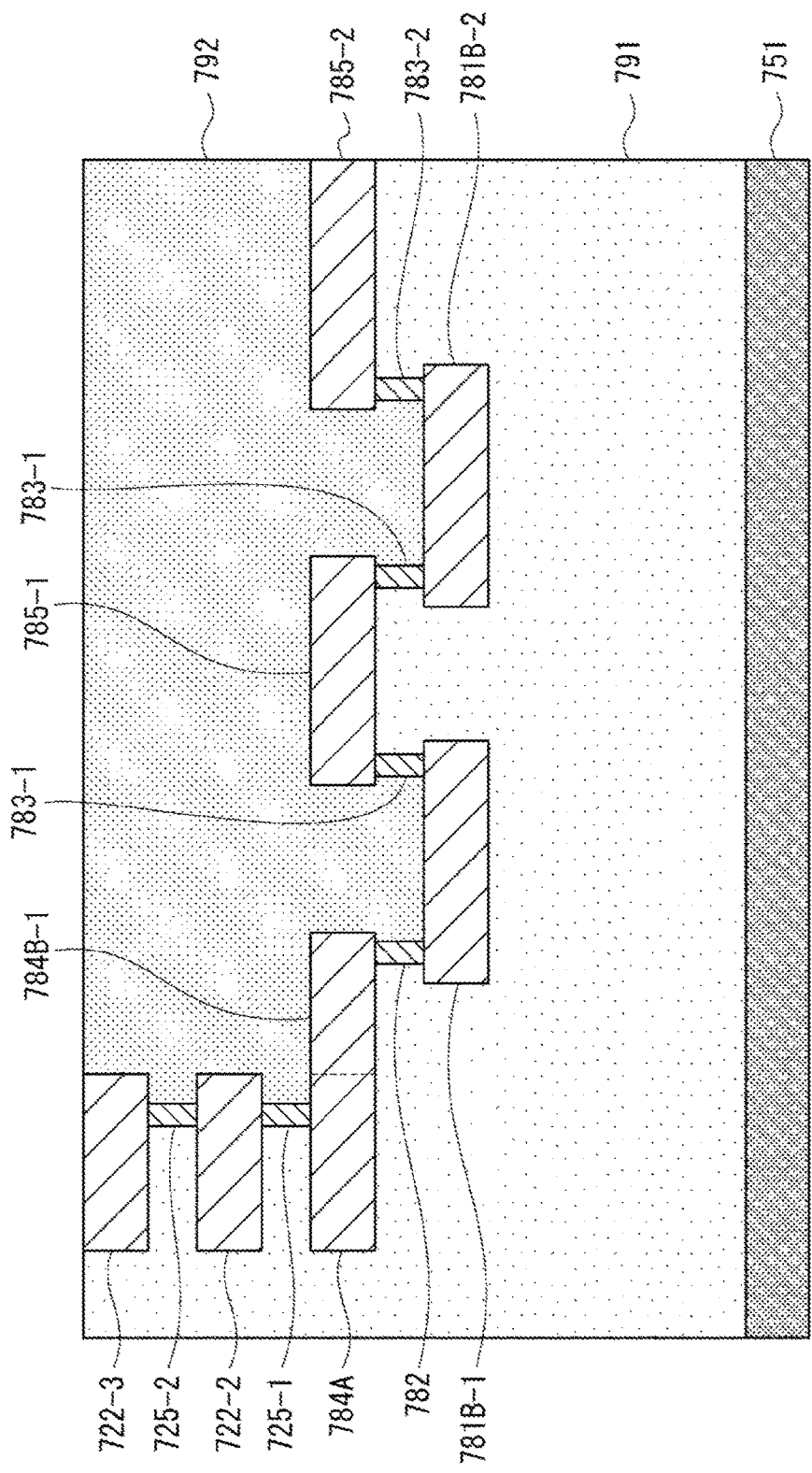
FIG. 60 is a B-B cross-sectional view illustrating the sixth embodiment of the moisture-resistant ring.

FIG. 55 is a perspective view schematically illustrating the configuration of the moisture-resistant ring in the vicinity enclosed in the frame C1 of FIG. 41. FIG. 56 is a diagram of FIG. 55 excluding a wall 782, and a portion above walls 783-1 and 783-2. FIG. 57 is a diagram of FIG. 56 with the addition of the wall 782, and the walls 783-1 and 783-2. FIG. 58 is a diagram of FIG. 57 with the addition of a dummy wire 784, and dummy wires 785-1 and 785-2. FIG. 59 is a cross-sectional view of the A-A part of FIG. 41. FIG. 60 is a cross-sectional view of the B-B part of FIG. 41.

FIG. 55 is different from FIG. 43 in the configuration from the third to fourth wiring layers. Specifically, instead of the dummywires 721L-3 and 721R-3, a dummywire 781 is provided in the third wiring layer. Instead of the walls 724L-3 and 724R-3, the wall 782 and walls 783-1 to 783-$n$ (the wall 783-3 and later are not illustrated) are provided between the third wiring layer and the fourth wiring layer. Instead of the dummy wire 722-1, the dummy wire 784 and dummy wires 785-1 to 785-$n$ (the wall 785-3 and later are not illustrated) are provided in the fourth wiring layer. In addition, the moisture-resistant ring with the dual-layer structure includes a moisture-resistant ring 712Ld, a moisture-resistant ring 712Rd, and a moisture-resistant ring 713$d$.

Incidentally, if there is no need to distinguish the walls 783-1 to 783-$n$ individually, they are simply referred to as the wall 783 below. If there is no need to distinguish the dummy wires 785-1 to 785-$n$ individually, they are simply referred to as the dummy wire 785 below.

The moisture-resistant ring 712Ld includes the dummy wires 721L-1 and 721L-2, the wall 723L, the walls 724L-1 and 724L-2, part of the dummy wire 781, part of the wall 782, parts of the walls 783-1 to 783-$n$, part of the dummy wire 784, and parts of the dummy wires 785-1 to 785-$n$. The moisture-resistant ring 712Rd includes the dummy wires 721R-1 and 721R-2, the wall 723R, the walls 724R-1 and 724R-2, part of the dummy wire 781, part of the wall 782, parts of the walls 783-1 to 783-$n$, part of the dummy wire 784, and parts of the dummy wires 785-1 to 785-$n$. The moisture-resistant ring 713$d$ includes the dummy wires 722-2 and 722-3, the walls 725-1 and 725-2, part of the dummy wire 781, part of the wall 782, parts of the walls 783-1 to 783-$n$, part of the dummy wire 784, and parts of the dummy wires 785-1 to 785-$n$. The dummy wire 781, the wall 782, the walls 783-1 to 783-$n$, the dummy wire 784, and the dummy wires 785-1 to 785-$n$ are placed at the boundary between the moisture-resistant rings 712Ld and 712Rd and the moisture-resistant ring 713$d$, and are included as components of each moisture-resistant ring.

Incidentally, the dummy wire 781 is described below, separated into a ring portion 781AL, a ring portion 781AR, and lid portions 781B-1 to 781B-(n+1) (the lid portion 781B-3 and later are not illustrated) by auxiliary lines indicated by dotted lines of FIG. 56, as appropriate. Moreover, the dummy wire 784 is described below, separated into a ring portion 784A, a lid portion 784B-1, and a lid portion 784B-2 (not illustrated) by an auxiliary line indicated by a dotted line of FIG. 58.

The ring portions 781AL and 781AR of the dummy wire 781 have the same shape as the dummy wires 721L-3 and 721R-3 of FIG. 43. Therefore, the dummy wire 781 has a shape where the lid portions 781B-1 to 781B-(n+1) are added to the dummy wires 721L-3 and 721R-3.

Incidentally, if there is no need to distinguish the lid portions 781B-1 to 781B-(n+1) individually, they are simply referred to as the lid portion 781B below.

Each lid portion 781B has a rectangular plate shape extending in the left-and-right direction, and connects the right side of the ring portion 781AL and the left side of the ring portion 781AR. Each lid portion 781B is placed at predetermined spacings in the front-and-back direction. The right side of the ring portion 781AL, the left side of the ring portion 781AR, the adjacent lid portion 781B then form rectangular opening portions 781C-1 to 781C-$n$.

Incidentally, if there is no need to distinguish the opening portions 781C-1 to 781C-n individually, they are simply referred to as the opening portion 781C below.

The wall 782 is a via that connects the dummy wires 781 and 784. The wall 782 has a substantially rectangular ring shape, and is formed along the vicinity of the outer periphery of the logic substrate 701 in such a manner as to surround the outer periphery of the signal processing circuits 711L and 711R. However, the wall 782 is recessed toward the inside of the logic substrate 701 in the vicinities enclosed in the frames C1 and C2 of FIG. 41 to match the shape of the dummy wire 781 below the wall 782.

The walls 783-1 to 783-$n$ are vias that connect the dummy wire 781 and the dummy wires 785-1 to 785-$n$, respectively. The walls 783-1 to 783-$n$ have substantially the same rectangular ring shape, and are formed on an upper surface of the dummy wire 781 in such a manner as to respectively surround the peripheries of the openings 781C-1 to 781C-$n$ of the dummy wire 781.

The ring portion 784A of the dummy wire 784 has the same shape as the dummy wire 722-1 of FIG. 43. Therefore, the dummy wire 784 has the shape of the dummy wire 722-1 with the addition of the lid portions 784B-1 and 784B-2.

The lid portion 784B-1 has a rectangular plate shape extending in the left-and-right direction. The lid portion 784B-1 blocks, from above, an opening portion formed by the ring portion 784A and the front recessed portion of the wall 782.

The lid portion 784B-2 (not illustrated) has a rectangular plate shape extending in the left-and-right direction. The lid portion 784B-1 blocks, from above, an opening portion formed by the ring portion 784A and the back recessed portion (not illustrated) of the wall 782.

The dummy wires 785-1 to 785-$n$ have a rectangular plate shape extending in the left-and-right direction. The dummy wires 785-1 to 785-$n$ are formed in such a manner as to respectively block the opening portions of the walls 783-1 to 783-$n$ from above.

Therefore, a barrier unit including part of the dummy wire 781, part of the wall 782, the walls 783-1 to 783-$n$, part of the dummy wire 784, and the dummy wires 785-1 to 785-$n$ blocks an upper surface of an area between the moisture-resistant rings 712Ld and 712Rd. In other words, the barrier unit separates the area between the moisture-resistant rings 712Ld and 712Rd and an area surrounded by the moisture-resistant ring 713$d$.

Consequently, as illustrated in FIGS. 59 and 60, the moisture-resistant ring 712Ld, the moisture-resistant ring 712Rd, and the moisture-resistant ring 713d ensure the separation of a non-moisture resistant area 791 and a moisture-resistant area 792. Accordingly, moisture that has entered the non-moisture resistant area 791 is prevented from entering the moisture-resistant area 792. Therefore, the moisture resistance of the moisture-resistant area 792 is retained, and the reliability of a solid state imaging device using the logic substrate 701 improves.

Moreover, as illustrated in FIG. 60, the dummy wires in the third wiring layer and the dummy wires in the fourth wiring layer are alternately placed in the barrier unit in the front-and-back direction. The barrier unit has a chain structure having a cross section of a rectangular wave-like shape. Consequently, the area of each dummy wire can be made smaller than the above-mentioned lid portion 741B of the dummy wire 741 of FIG. 46 to facilitate manufacturing.

Furthermore, as compared to the above-mentioned technology disclosed in Patent Document 3, there is no need to provide a moisture-resistant film dedicated to ensure moisture resistance. Accordingly, it is possible to reduce the manufacturing process and reduce the manufacturing cost.

Incidentally, split exposure is used to form the third wiring layer including the dummy wire 781, a layer between the third and fourth wiring layers including the wall 782 and the walls 783-1 to 783-n, and the fourth wiring layer including the dummy wire 784 and the dummy wires 785-1 to 785-n.

Moreover, the number of alternately repeated dummy wires in the third and fourth wiring layers in the front-and-back direction can be set to any given number.

Furthermore, the barrier unit may be formed using three or more wiring layers.

Figure 61:
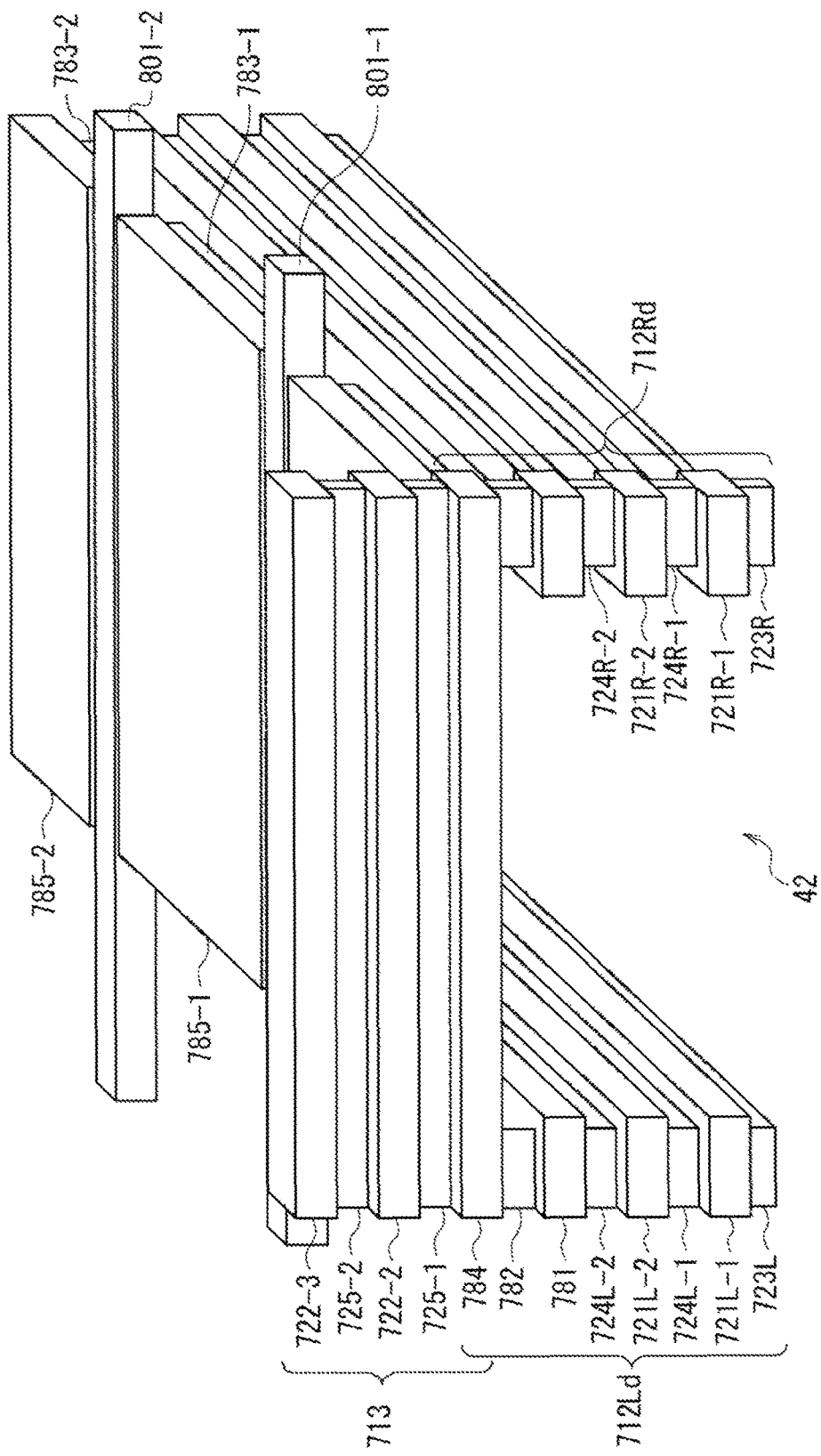
FIG. 61 is a perspective view schematically illustrating a modification of the sixth embodiment of the moisture-resistant ring.
Figure 62:
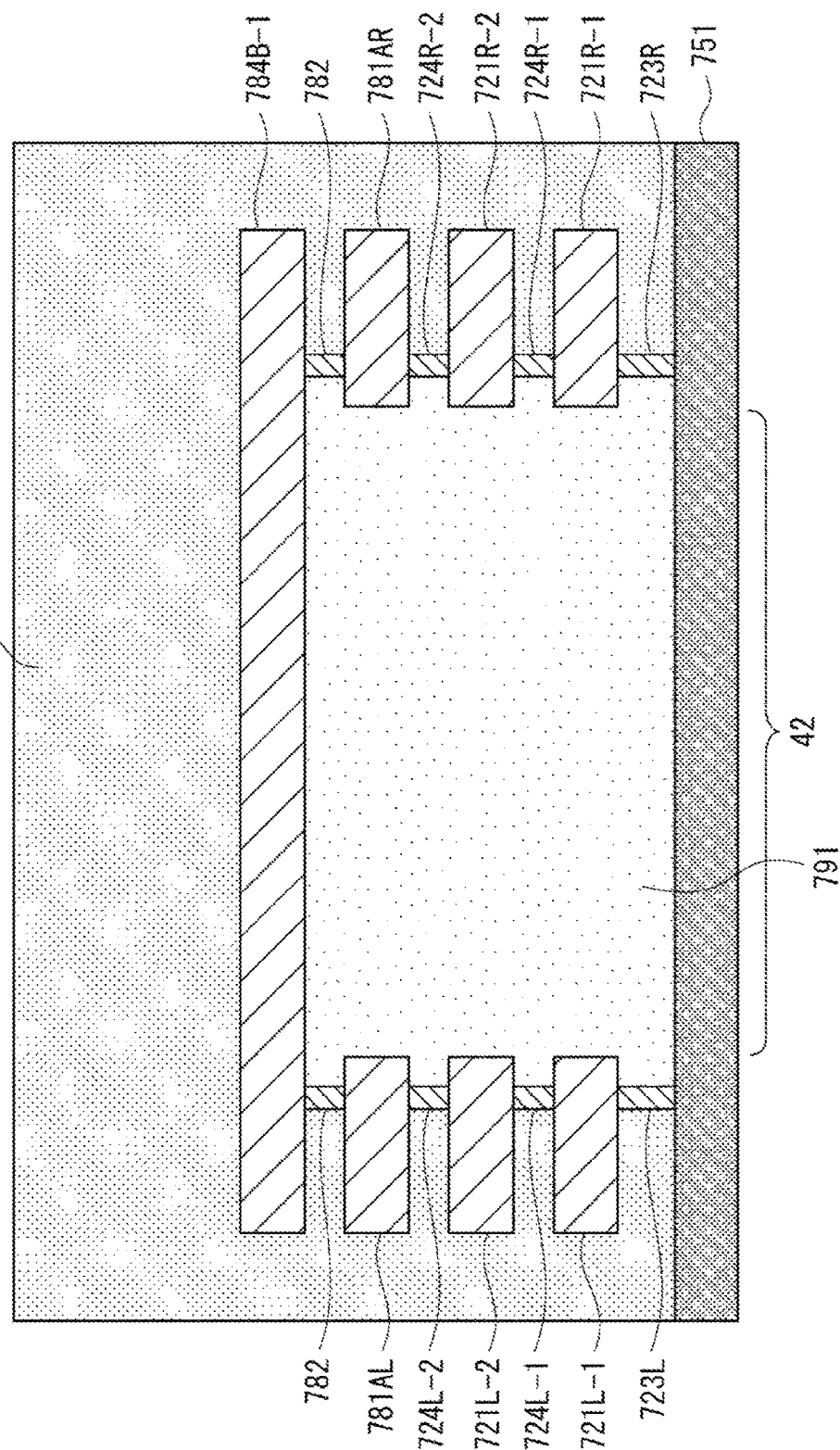
FIG. 62 is an A-A cross-sectional view illustrating the modification of the sixth embodiment of the moisture-resistant ring.
Figure 63:
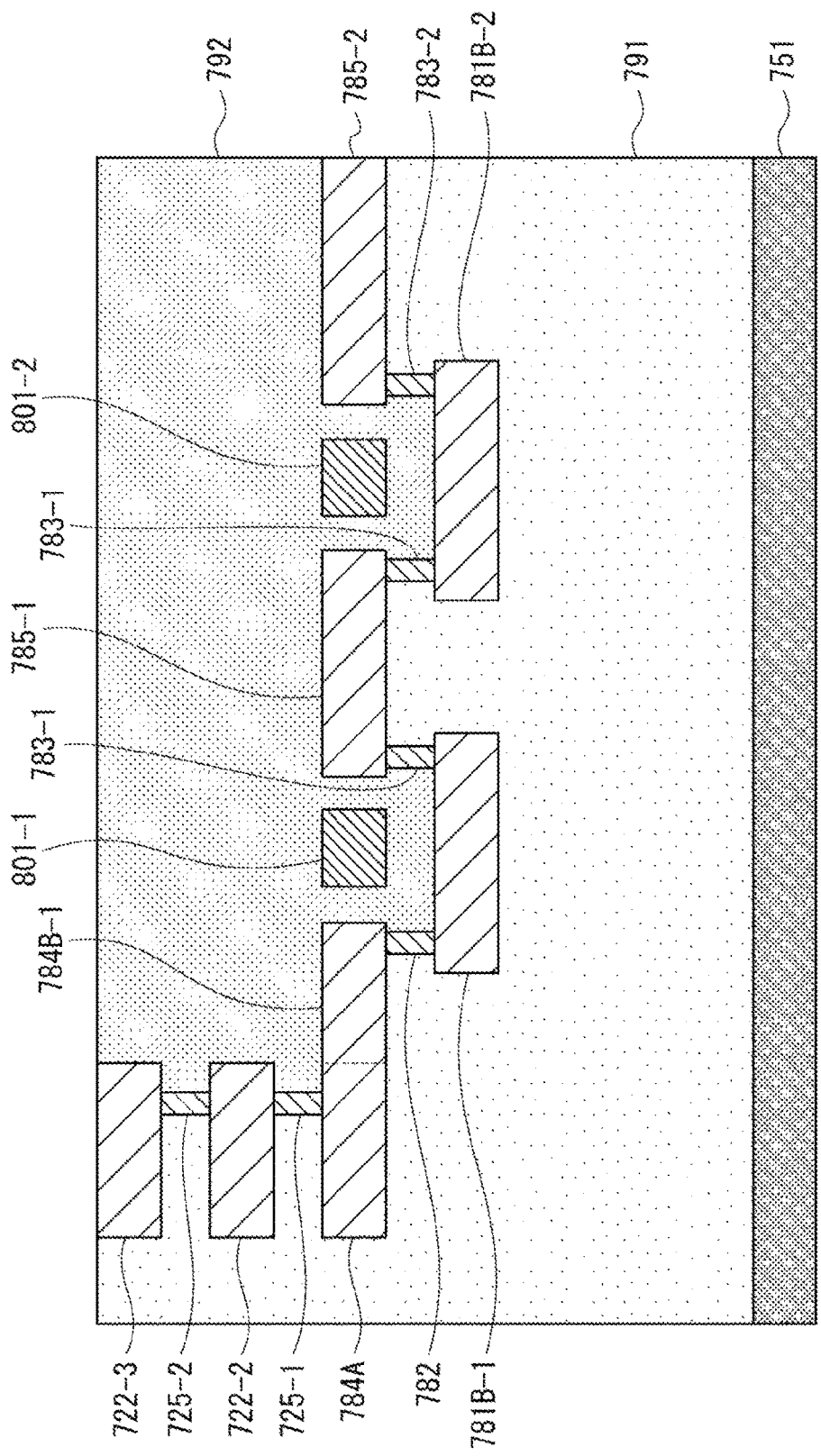
FIG. 63 is a B-B cross-sectional view illustrating the modification of the sixth embodiment of the moisture-resistant ring.

FIGS. 61 to 63 illustrate a modification of the fourth embodiment of the moisture-resistant ring with the dual-layer structure. FIG. 61 is a perspective view schematically illustrating the configuration of the moisture-resistant ring in the vicinity enclosed in the frame C1 of FIG. 41. FIG. 62 is a cross-sectional view of the A-A part of FIG. 41. FIG. 63 is a cross-sectional view of the B-B part of FIG. 41.

In this modification, as illustrated in FIGS. 61 to 63, wires for connecting the signal processing circuits 711L and 711R are provided in the fourth wiring layer including the dummy wire 784 and the dummy wires 785-1 to 785-n. For example, a wire 801-1 is provided between the dummy wires 784 and 785-1. A wire 801-1 is provided between the dummy wires 785-1 and 785-2.

In this manner, wires between the signal processing circuits 711L and 711R can be provided effectively using a wiring layer forming the barrier unit.

Next, a fifth embodiment of the moisture-resistant ring with the dual-layer structure is described with reference to FIGS. 64 to 68. The fifth embodiment is for improving moisture resistance as in the second to fourth embodiments. Incidentally, the same reference signs are assigned to portions corresponding to FIGS. 43 and 44, in FIGS. 64 to 68.

Figure 64:
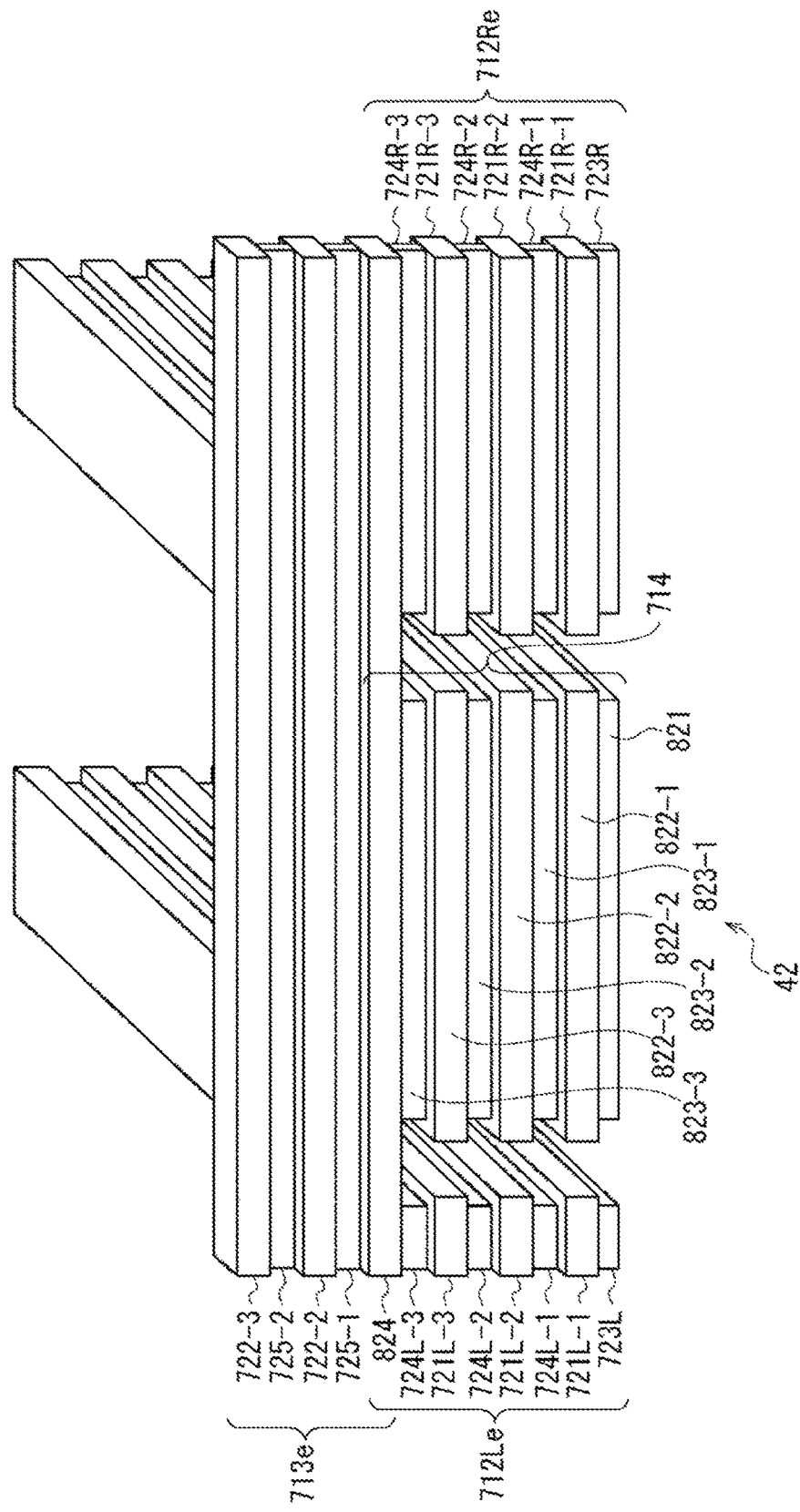
FIG. 64 is a perspective view schematically illustrating a seventh embodiment of the moisture-resistant ring.
Figure 65:
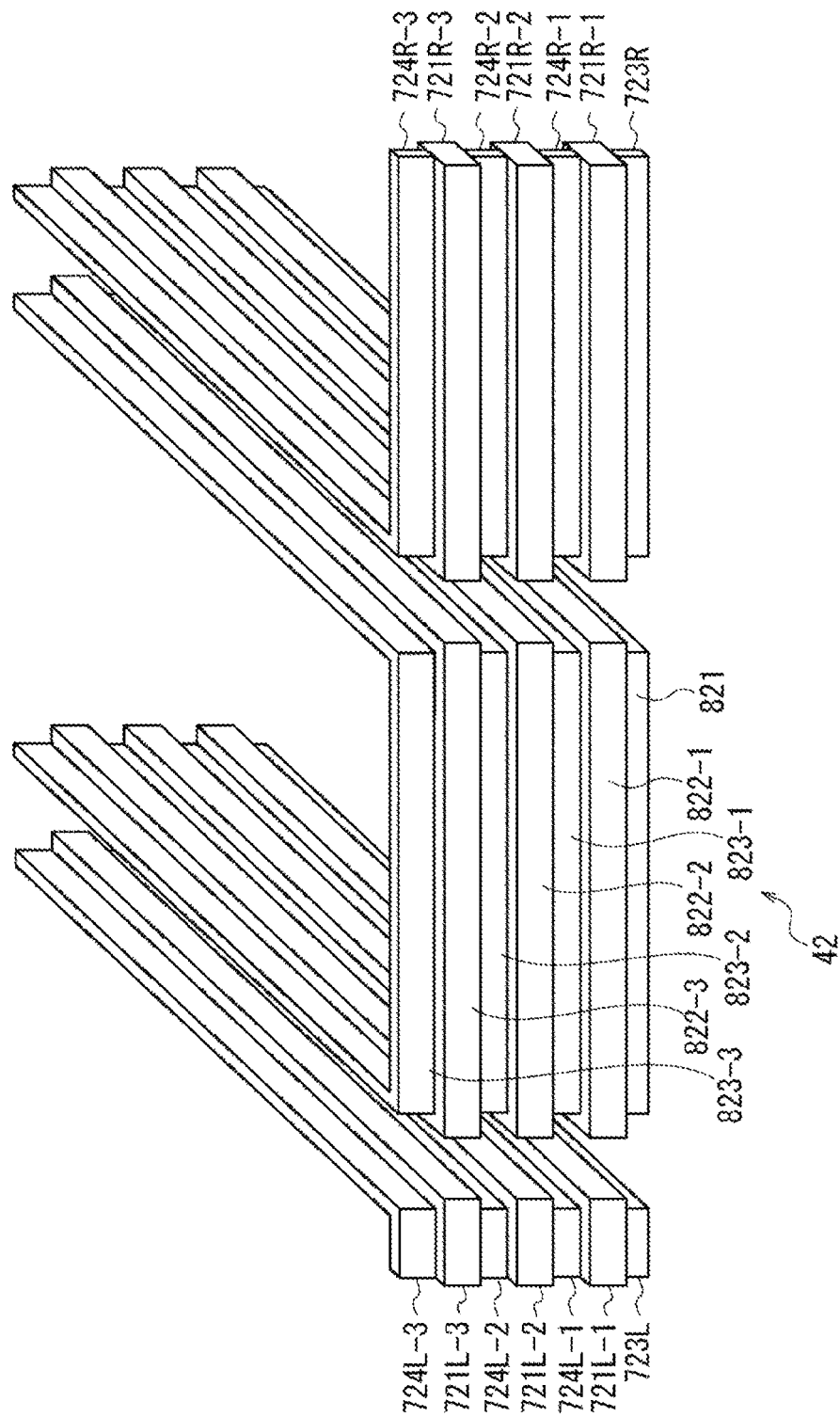
FIG. 65 is a perspective view schematically illustrating parts of layers of the seventh embodiment of the moisture-resistant ring.
Figure 66:
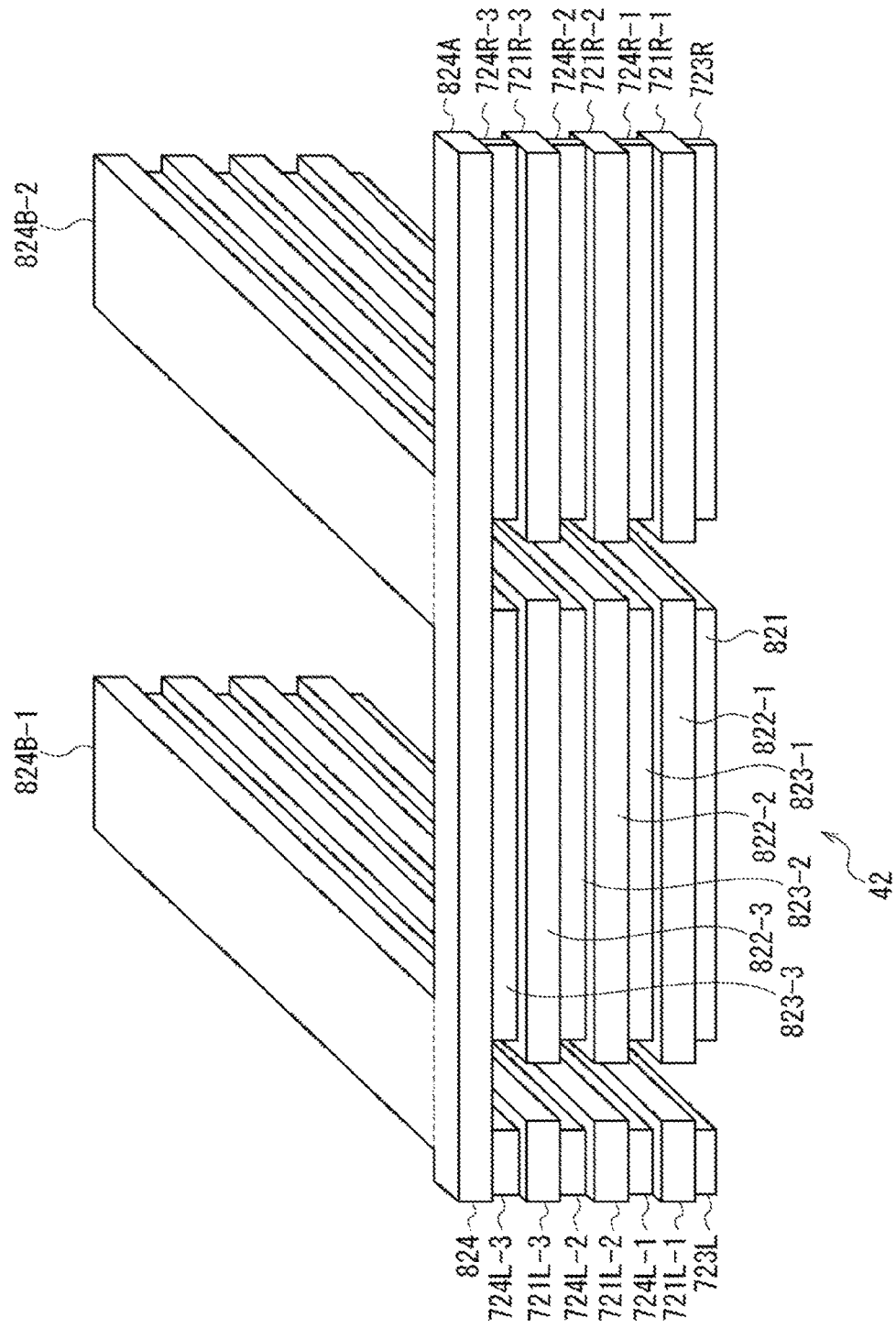
FIG. 66 is a perspective view schematically illustrating parts of layers of the seventh embodiment of the moisture-resistant ring.
Figure 67:
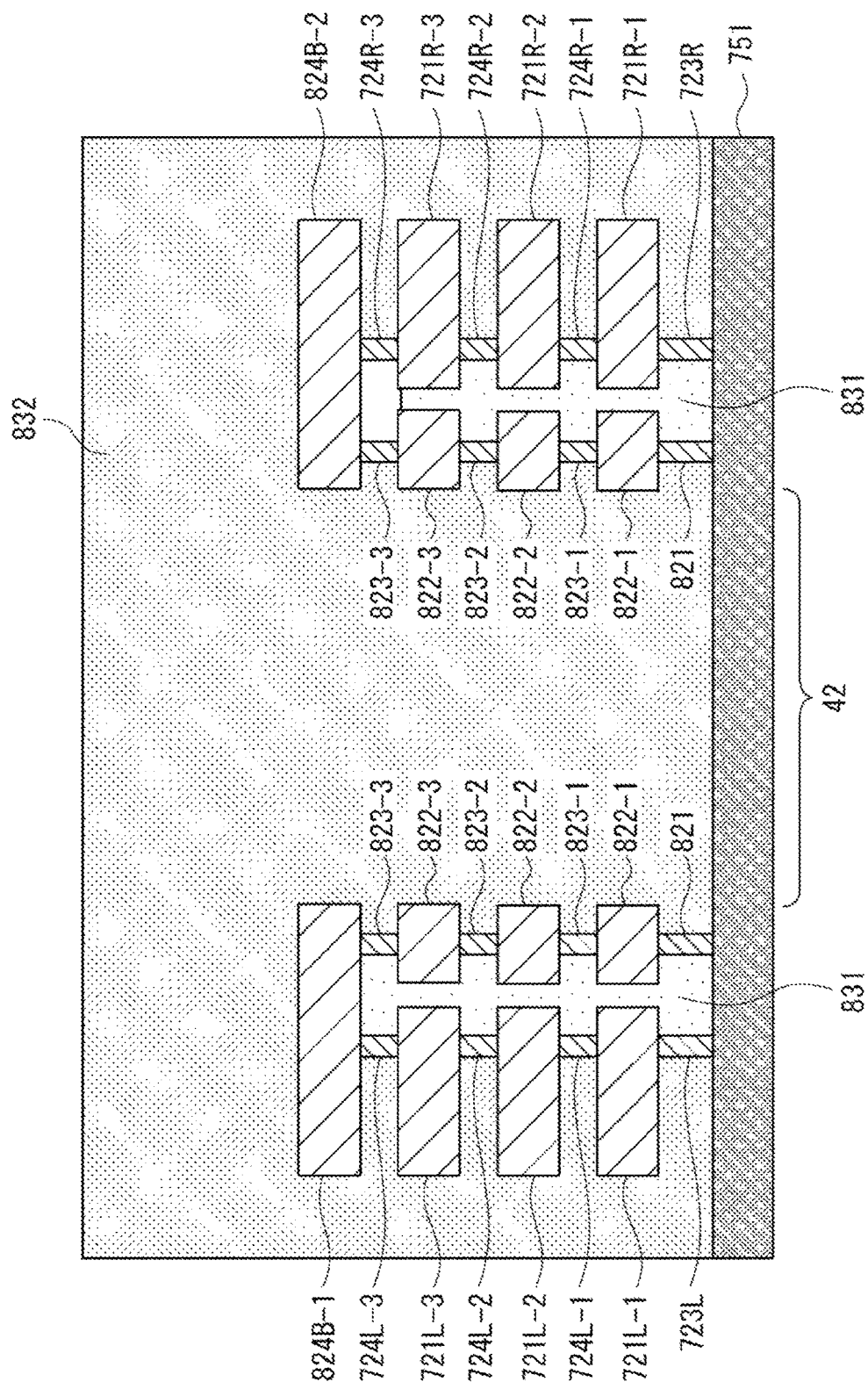
FIG. 67 is an A-A cross-sectional view illustrating the seventh embodiment of the moisture-resistant ring.
Figure 68:
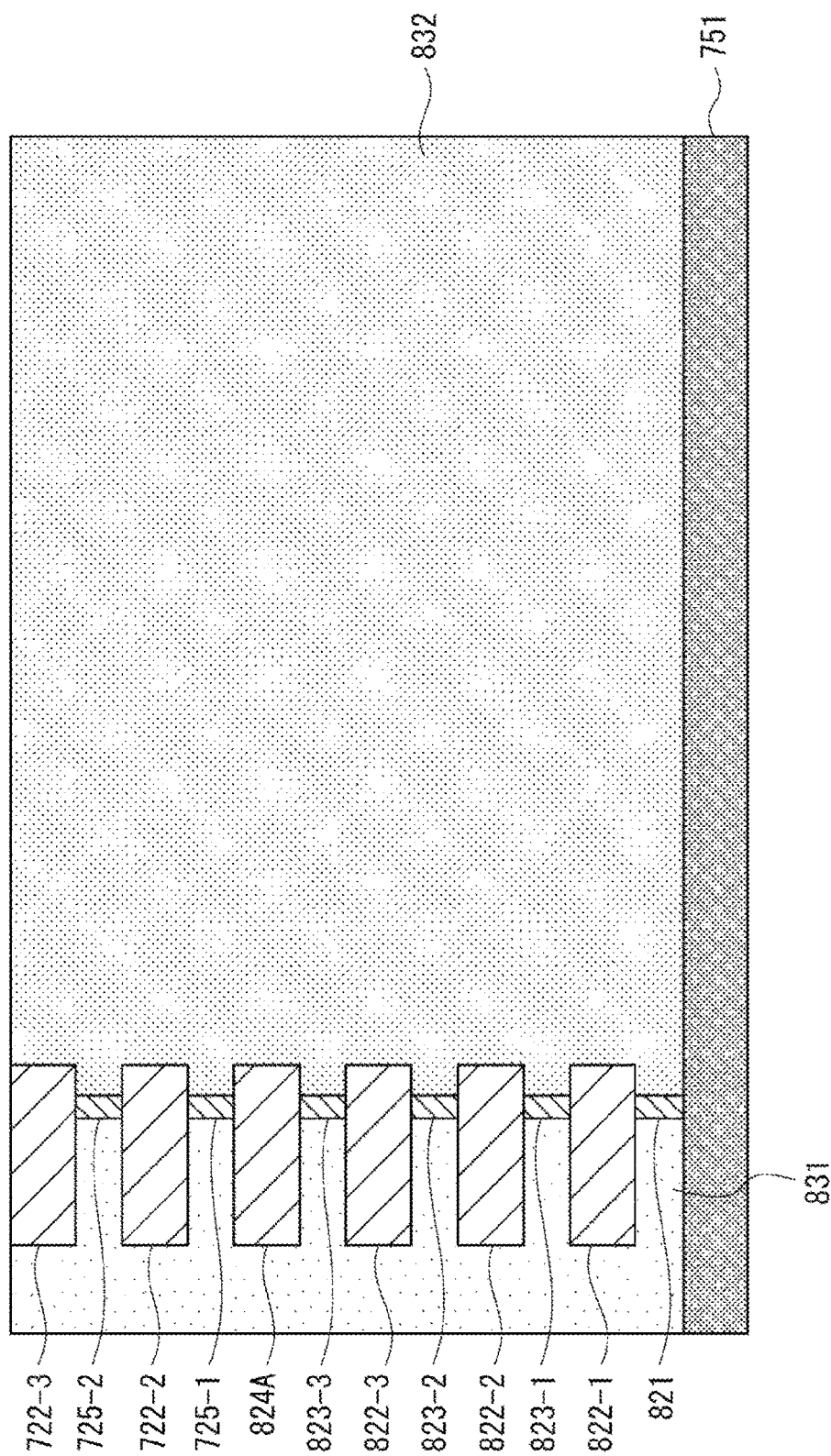
FIG. 68 is a B-B cross-sectional view illustrating the seventh embodiment of the moisture-resistant ring.

FIG. 64 is a perspective view schematically illustrating the configuration of the moisture-resistant ring with the dual-layer structure in the vicinity enclosed in the frame C1 of FIG. 41. FIG. 65 is a diagram of FIG. 64 excluding a portion above a dummy wire 824. FIG. 66 is a diagram of FIG. 65 with the addition of the dummy wire 824. FIG. 67 is a cross-sectional view of the A-A part of FIG. 41. FIG. 68 is a cross-sectional view of the B-B part of FIG. 41.

FIG. 64 is different from FIG. 43 in the configuration from the first to fourth wiring layers. Specifically, dummy wires 822-1 to 822-3 are added to the first to third wiring layers. A wall 821 is added between the substrate layer 751 and the first wiring layer. Walls 823-1 to 823-3 are added between adjacent wiring layers of the first to fourth wiring layers. Instead of the dummy wire 722-1, the dummy wire 824 is provided in the fourth wiring layer. In addition, the moisture-resistant ring with the dual-layer structure includes moisture-resistant rings 712Le, 712Re, 713e, and 714.

The moisture-resistant ring 712Le includes the dummy wires 721L-1 to 721L-3, the wall 723L, the walls 724L-1 to 724L-3, part of the dummy wire 824. The moisture-resistant ring 712Re includes the dummy wires 721R-1 to 721R-3, the wall 723R, the walls 724R-1 to 724R-3, and part of the dummy wire 824. The moisture-resistant ring 713e includes the dummy wires 722-2 and 722-3, the walls 725-1 and 725-2, and part of the dummy wire 824. The moisture-resistant ring 714 includes the wall 821, the dummy wires 822-1 to 822-3, the walls 823-1 to 823-3, and part of the dummy wire 824. The dummy wire 824 is placed at the boundary between the moisture-resistant rings 712Le, 712Re, and 714, and the moisture-resistant ring 713e, and is included as a component of each moisture-resistant ring.

Incidentally, the dummy wire 824 is described below, separated into a ring portion 824A and lid portions 824B-1 and 824B-2 by auxiliary lines indicated by dotted lines of FIG. 66, as appropriate.

The dummy wires 822-1 to 822-3 have substantially the same rectangular ring shape, and are formed, leaving a predetermined space from the moisture-resistant rings 712Le and 712Re, in each wiring layer in such a manner as to surround the periphery of the scribe area 42.

The wall 821 and the walls 823-1 to 823-3 have substantially the same rectangular ring shape, and are formed, leaving a predetermined space from the moisture-resistant rings 712Le and 712Re, in such a manner as to surround the periphery of the scribe area 42.

The wall 821 is formed in the same step as the walls 723L and 723R, and connects the substrate layer 751 and the dummy wire 822-1.

The walls 823-1 to 823-3 are formed in the same step as vias that connect adjacent wiring layers of the first to fourth wiring layers. The wall 823-1 is a via that connects the dummy wires 822-1 and 822-2. The wall 823-2 is a via that connects the dummy wires 822-2 and 822-3. The wall 823-3 is a via that connects the dummy wires 822-3 and 824.

The ring portion 824A of the dummy wire 824 has the same shape as the dummy wire 722-1 of FIG. 43. Therefore, the dummy wire 824 has the shape of the dummy wire 722-1 with the addition of the lid portions 824B-1 and 824B-2.

The lid portion 824B-1 has a rectangular plate shape extending in the front-and-back direction, and connects the front side and the back side of the ring portion 824A. The left side surface of the lid portion 824B-1 is at substantially the same position as the left side surface of the right side of the dummy wire 721L-3 in the left-and-right direction. The right side surface of the lid portion 824B-1 is at substantially the same position as the right side surface of the left side of the dummy wire 822-3 in the left-and-right direction.

Therefore, a barrier unit including the partial ring portion 824A and the lid portion 824B-1 blocks an upper surface of an area between the moisture-resistant rings 712Le and 714. In other words, the barrier unit separates the area between the moisture-resistant rings 712Le and 714 and an area surrounded by the moisture-resistant ring 713e.

The lid portion 824B-2 has a rectangular plate shape extending in the front-and-back direction, and connects the front side and the back side of the ring portion 824A. The left side surface of the lid portion 824B-2 is at substantially the same position as the left side surface of the right side of the dummy wire 822-3 in the left-and-right direction. The right side surface of the lid portion 824B-2 is at substantially the same position as the right side surface of the left side of the dummy wire 721R-3 in the left-and-right direction.

Therefore, a barrier unit including the partial ring portion 824A and the lid portion 824B-2 blocks an upper surface of an area between the moisture-resistant rings 712Re and 714.

In other words, the barrier unit separates the area between the moisture-resistant rings 712Re and 714 and an area surrounded by the moisture-resistant ring 713e.

As described above, the moisture-resistant rings 712Le, 712Re, 713e, and 714 ensure the separation of non-moisture resistant areas 831 and a moisture-resistant area 832 as illustrated in FIGS. 67 and 68. Accordingly, moisture that has entered the non-moisture resistant area 831 is prevented from entering the moisture-resistant area 832. Therefore, the moisture resistance of the moisture-resistant area 832 is retained, and the reliability of a solid state imaging device using the logic substrate 701 improves.

Figure 69:
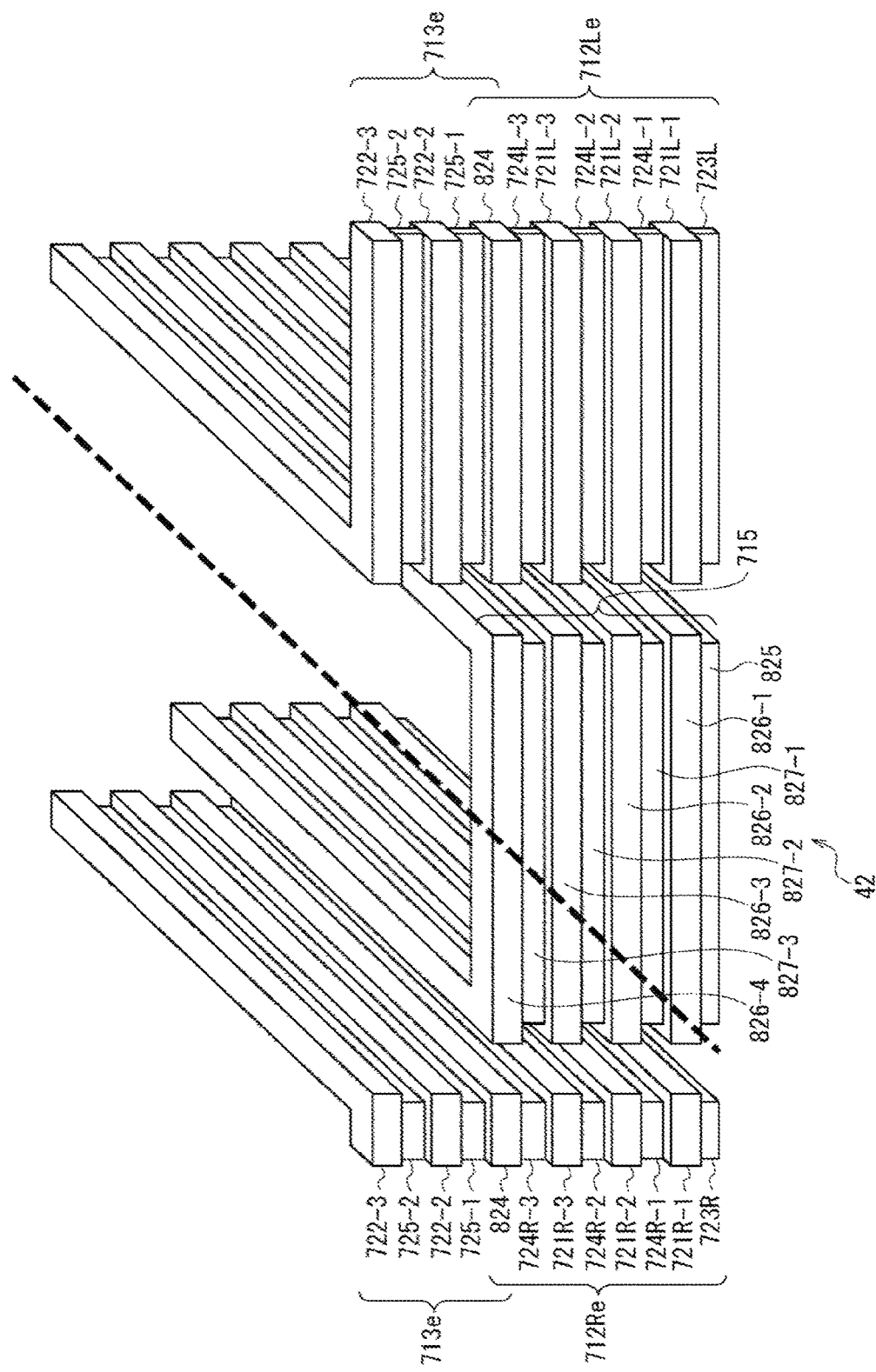
FIG. 69 is a perspective view schematically illustrating the seventh embodiment of the moisture-resistant ring.

Incidentally, in the fifth embodiment of the moisture-resistant ring with the dual-layer structure, a moisture-resistant ring 715 is formed also in the scribe area 42 that is actually cut between adjacent logic substrates 701 as illustrated in FIG. 69. The moisture-resistant ring 715 includes a wall 825, dummy wires 826-1 to 826-4, and walls 827-1 to 827-3.

The dummy wires 826-1 to 826-4 are respectively formed in the first to fourth wiring layers, and have substantially the same rectangular ring shape as the dummy wires 822-1 to 822-3 of the moisture-resistant ring 714. The dummy wires 826-1 to 826-4 are formed in the wiring layers, leaving a predetermined space from the moisture-resistant ring 712Re of the left logic substrate 701 and the moisture-resistant ring 712Le of the right logic substrate 701, in such a manner as to surround the periphery of the scribe area 42.

The wall 825 and the walls 826-1 to 826-3 have substantially the same rectangular ring shape as the wall 821 and the walls 823-1 to 823-3 of the moisture-resistant ring 714. The walls 825 and the walls 826-1 to 826-3 are formed, leaving a predetermined space from the moisture-resistant ring 712Re of the left logic substrate 701 and the moisture-resistant ring 712Le of the right logic substrate 701, in such a manner as to surround the periphery of the scribe area 42.

The wall 825 is formed in the same step as the walls 723L, 723R, and 821, and connects the substrate layer 751 and the dummy wire 826-1.

The walls 827-1 to 827-3 are formed in the same step as vias that connect adjacent wiring layers of the first to fourth wiring layers. The wall 827-1 is a via that connects the dummy wires 826-1 and 826-2. The wall 827-2 is a via that connects the dummy wires 826-2 and 826-3. The wall 827-3 is a via that connects the dummy wires 826-3 and 826-4.

The moisture-resistant ring 715 is then cut in the front-and-back direction as indicated by a dotted line of FIG. 69 upon the manufacture of the solid state imaging device 1. However, the left side surface of the logic substrate 701 has a double structure of the moisture-resistant rings 715 and 712Le. The right side surface of the logic substrate 701 has a double structure of the moisture-resistant rings 715 and 712Re. Therefore, even if the moisture-resistant ring 715 is cut, moisture resistance does not decrease.

Incidentally, split exposure is used to form the fourth wiring layer including the dummy wires 824 and 826-4. On the other hand, one-shot exposure is used to form the layers below the fourth wiring. In other words, one-shot exposure is used to form the layers excluding the dummy wires 824 and 826-4 of the moisture-resistant rings 714 and 715.

Moreover, the moisture-resistant ring 714 is provided to enable a reduction in the areas of the lid portions 824B-1 and 824B-2 of the dummy wire 824 as compared to the above-mentioned lid portion 741B of the dummy wire 741 of FIG. 46. Accordingly, manufacturing is facilitated.

Furthermore, as compared to the above-mentioned technology disclosed in Patent Document 3, there is no need to provide a moisture-resistant film dedicated to ensure moisture resistance. Accordingly, it is possible to reduce the manufacturing process and reduce the manufacturing cost.

Next, a modification of the above-mentioned moisture-resistant ring with the double structure is described.

In the above description, the example is illustrated in which the barrier unit is provided only below the substrate moisture-resistant ring surrounding the periphery of the logic substrate. However, the barrier unit may also be provided above the substrate moisture-resistant ring.

Figure 70:
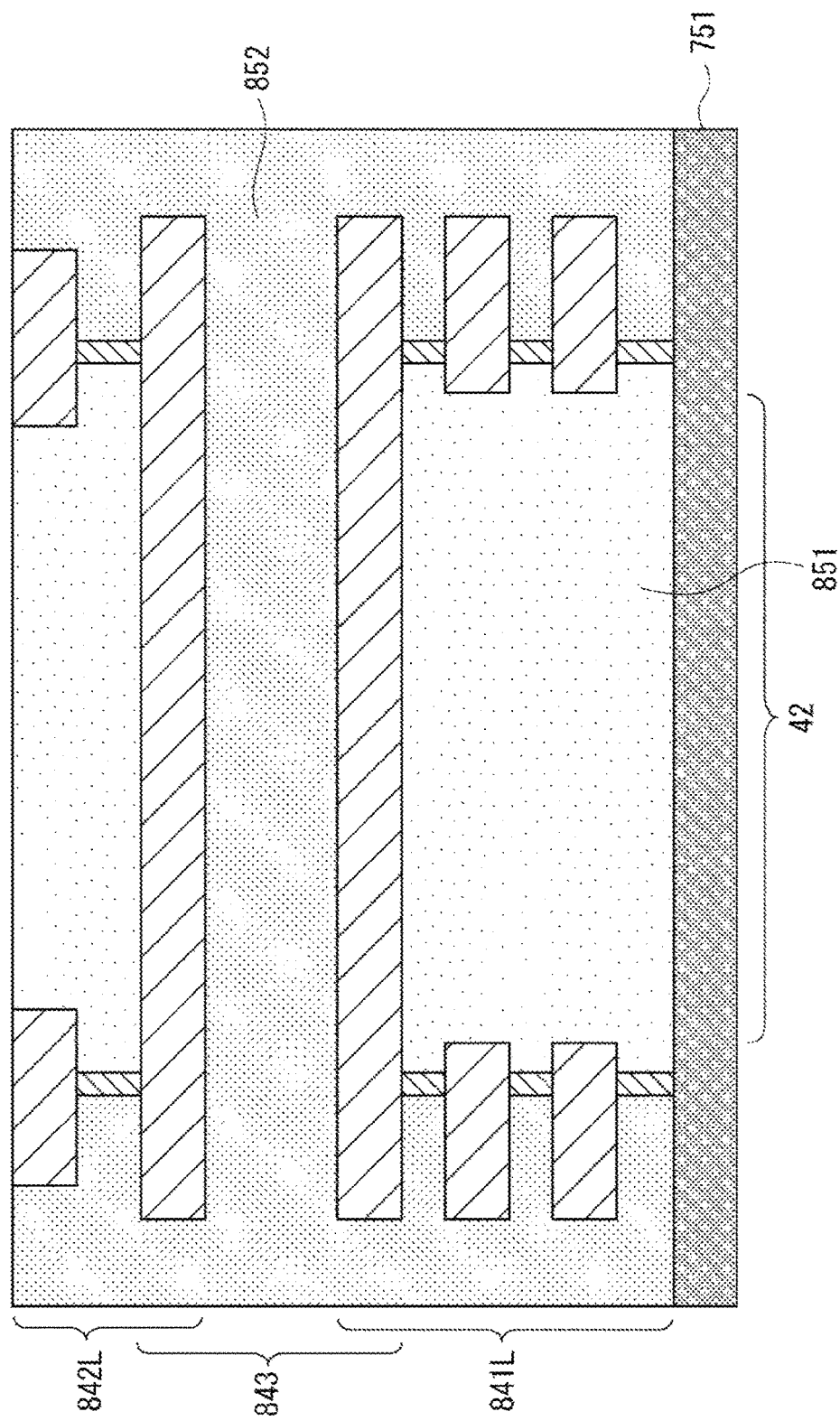
FIG. 70 is an A-A cross-sectional view illustrating an eighth embodiment of the moisture-resistant ring.
Figure 71:
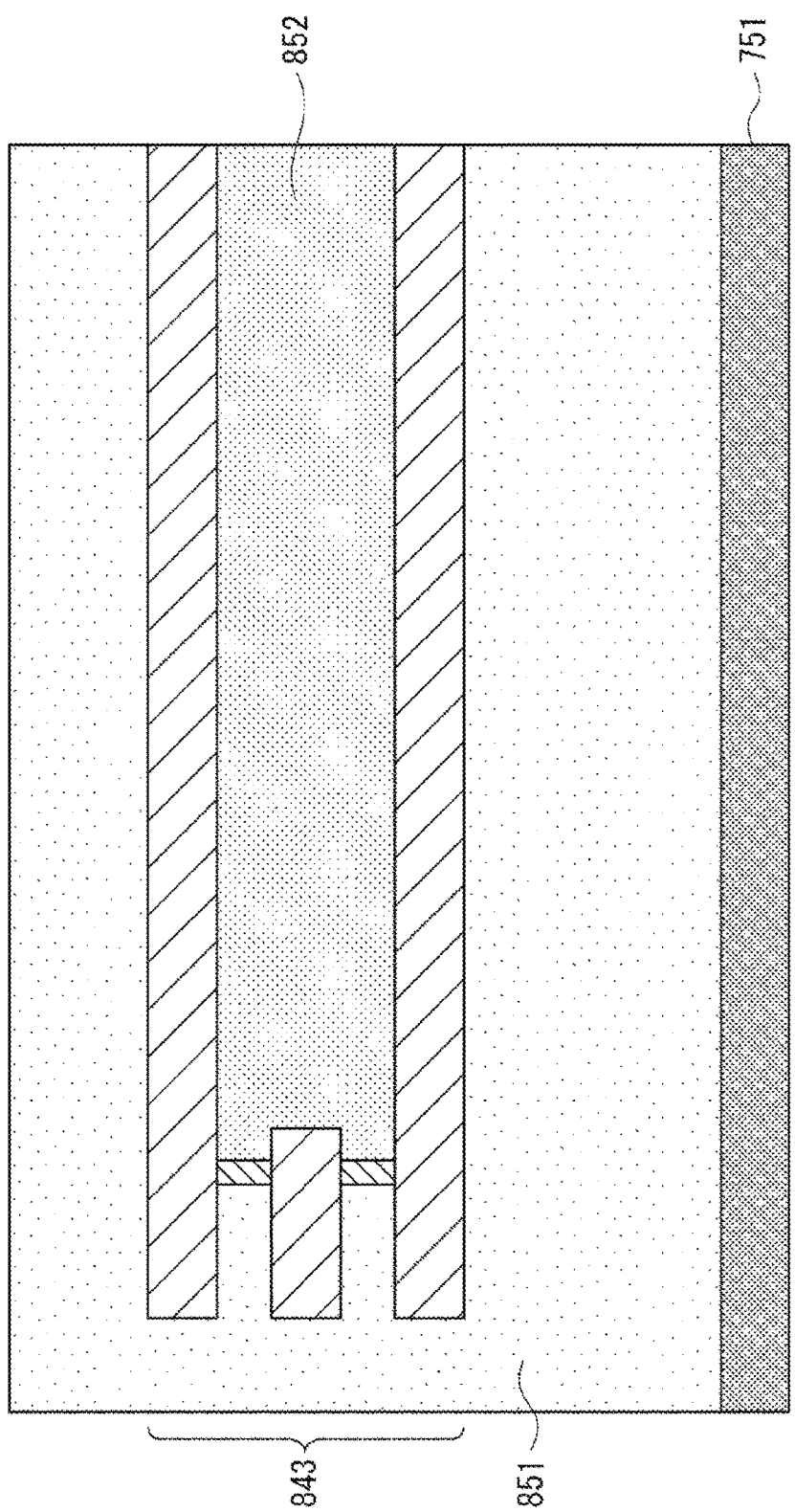
FIG. 71 is a B-B cross-sectional view illustrating the eighth embodiment of the moisture-resistant ring.

FIGS. 70 and 71 schematically illustrate a cross-sectional view of the A-A part and a cross-sectional view of the B-B part of FIG. 41 of when the barrier unit is also provided above the substrate moisture-resistant ring.

In this example, a circuit moisture-resistant ring 841L and a circuit moisture-resistant ring 841R (not illustrated) are formed on the substrate layer 751. On the other hand, a circuit moisture-resistant ring 842L and a circuit moisture-resistant ring 842R (not illustrated) are formed downward from the uppermost layer of the logic substrate 701. Moreover, a substrate moisture-resistant ring 843 is formed between the circuit moisture-resistant rings 841L and 841R and the circuit moisture-resistant rings 842L and 842R.

Then, a barrier unit that separates an area between the circuit moisture-resistant rings 841L and 841R and an area surrounded by the substrate moisture-resistant ring 843 is formed by any of the above-mentioned methods. Similarly, a barrier unit that separates an area between the circuit moisture-resistant rings 842L and 842R and an area surrounded by the substrate moisture-resistant ring 843 is formed. In other words, the barrier unit is also provided above in addition to below the substrate moisture-resistant ring 843.

Consequently, the separation of a non-moisture resistant area 851 and a moisture-resistant area 852 is ensured.

Incidentally, the barrier unit that blocks an entire opening portion of an upper surface of the substrate moisture-resistant ring 843 may be formed without providing the circuit moisture-resistant rings 842L and 842R.

Moreover, for example, it is also possible to reverse the stacking order of the circuit moisture-resistant ring and the substrate moisture-resistant ring. For example, the substrate moisture-resistant ring may be formed on the substrate layer 751 of the logic substrate 701 and the circuit moisture-resistant ring may be formed on the substrate moisture-resistant ring.

Moreover, the moisture-resistant ring 712L and the moisture-resistant rings 712La to 712Le are not necessarily required to be formed in such a manner as to surround the entire periphery of the signal processing circuit 711L, and may, for example, surround only part of the periphery of the signal processing circuit 711L within a range that can ensure moisture resistance. Similarly, the moisture-resistant ring 712R and the moisture-resistant tings 712Ra to 712Re are not necessarily required to be formed in such a manner as to surround the entire periphery of the signal processing circuit 711R, and may, for example, surround only part of the periphery of the signal processing circuit 711R within a range that can ensure moisture resistance.

Moreover, the moisture-resistant ring 713 and the moisture-resistant rings 713a to 713e are not necessarily required to be formed in such a manner as to surround the entire periphery of the logic substrate 701, and may, for example, surround only part of the periphery of the logic substrate 701 within the range that can ensure moisture resistance.

Furthermore, also if, for example, three or more signal processing circuits are placed in the logic substrate, it is similarly required to form the circuit moisture-resistant ring surrounding the periphery or part of the periphery of each signal processing circuit and the substrate moisture-resistant ring surrounding the periphery or part of the periphery of the logic substrate. It is then simply required to form the above-mentioned barrier unit between adjacent circuit moisture-resistant rings if needed.

Incidentally, the number of layers and material of the above-mentioned moisture-resistant ring, and the material of the inter-layer insulating film are mere examples, and can be changed if needed.

{5-2. Modification of the Imaging Process}

In the above description, the example is illustrated in which the signal processing circuits generate one sheet of image data divided into left and right parts. However, the method for dividing image data can be freely changed in accordance with the number of the signal processing circuits provided to the logic substrate and their layout. For example, image data may be divided into upper and lower parts or into n (n is three or more).

Moreover, for example, each of a plurality of (for example, two) signal processing circuits may generate entire image data without dividing image data, and generate image data to which pixel values of a plurality of sets of the generated image data are added. Consequently, it is possible to reduce random noise, absorb differences in the characteristics of the AD converters 81, and accordingly, improve image quality.

In this case, the pixel values of the plurality of sets of image data are assigned a weight to be added. For example, entire image data is generated by each of the two signal processing circuits, and added with a weight of 0.5. Accordingly, image data including average values of pixel values of the two sheets of entire image data can be obtained.

Furthermore, for example, image data may be divided, and also a plurality of signal processing circuits may generate image data of the same area to add the image data. For example, a left and a right signal processing circuit is provided redundantly. Two sets of image data of the left half of an object may be created, and two sets of image data of the right half may be generated. In addition, for example, image data obtained by adding pixel values of the two sets of the image data of the left half and image data obtained by adding pixel values of the two sets of the image data of the right half may be combined.

{5-3. Modification within the Scope of Application of the Present Technology}

In the above description, the example where the present technology is applied to a solid state imaging device is illustrated. However, the present technology can also be applied to another stacked-structure semiconductor device whose chip size is larger than the exposure field of the exposure apparatus.

6. Electronic Apparatus

A solid state imaging device to which the present technology is applied can be used as an imaging unit (image capture unit) in an imaging apparatus such as a digital still camera or a video camera, a mobile terminal apparatus having an imaging function such as a mobile phone, and a general electronic apparatus such as a copier using a solid state imaging device in an image reading unit. Incidentally, the above module-like form mounted on an electronic apparatus, that is, a camera module may be used as an imaging apparatus.

{6-1. Imaging Apparatus}

Figure 72:
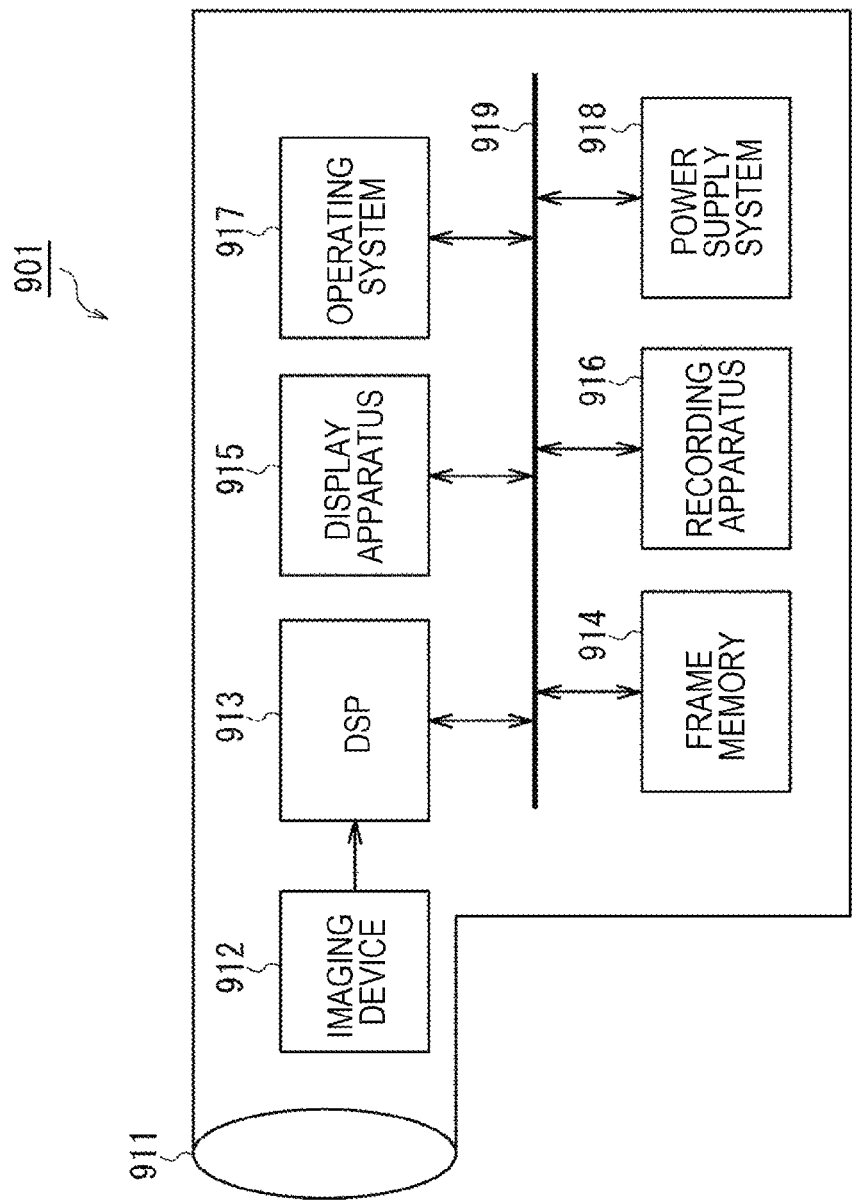
FIG. 72 is a block diagram illustrating a configuration example of an electronic apparatus.

FIG. 72 is a block diagram illustrating a configuration example of an imaging apparatus (camera apparatus) 901 being an example of an electronic apparatus to which the present technology is applied.

As illustrated in FIG. 72, the imaging apparatus 901 includes an optical system including a lens group 911, an imaging device 912, a DSP circuit 913 being a camera signal processing unit, a frame memory 914, a display apparatus 915, a recording apparatus 916, an operating system 917, and a power supply system 918. In addition, a configuration is adopted in which the DSP circuit 913, the frame memory 914, the display apparatus 915, the recording apparatus 916, the operating system 917, and the power supply system 918 are connected to one another via a bus line 919.

The lens group 911 captures incident light (image light) from an object and forms an image on an imaging surface of the imaging device 912. The imaging device 912 converts the light quantity of the incident light whose image has been formed on the imaging surface by the lens group 911 into an electrical signal, pixel by pixel, and outputs it as a pixel signal.

The display apparatus 915 includes a panel display apparatus such as a liquid crystal display apparatus or an organic electro luminescence (EL) display apparatus, and displays a moving image or still image captured by the imaging device 912. The recording apparatus 916 records the moving or still image captured by the imaging device 912 in a recording medium such as a memory card, a video tape, or a digital versatile disk (DVD).

The operating system 917 issues operation commands on various functions of the imaging apparatus 901 under the user's operation. The power supply system 918 supplies various powers being operating powers of the DSP circuit 913, the frame memory 914, the display apparatus 915, the recording apparatus 916, and the operating system 917 to these supply targets as appropriate.

Such an imaging apparatus 901 is applied to a video camera and a digital still camera, and is further applied to a camera module designed for mobile equipment such as a smartphone and a mobile phone. In addition, in the imaging apparatus 901, the solid state imaging devices according to the above-mentioned embodiments can be used as the imaging device 912. Consequently, the cost of the imaging apparatus 901 can be reduced.

Incidentally, embodiments of the present technology are not limited to the above-mentioned embodiments. Various modifications can be made within a range that does not depart from the gist of the present technology.

Moreover, for example, the present technology can also take the following configurations.

(1)

A solid state imaging device including:

a first substrate including a pixel circuit having a pixel array unit; and a second substrate including a first and a second signal processing circuit arranged side by side across a scribe area, wherein the first substrate and the second substrate are stacked, and the second substrate includes
  a first moisture-resistant ring surrounding at least part of a periphery of the first signal processing circuit,
  a second moisture-resistant ring surrounding at least part of a periphery of the second signal processing circuit,
  a third moisture-resistant ring surrounding at least part of a periphery of the second substrate in a layer different from the first and second moisture-resistant rings, and
  a barrier unit separating a first area between the first and second moisture-resistant rings and a second area, at least part of a periphery of which is surrounded by the third moisture-resistant ring, and having moisture resistance.

(2)
The solid state imaging device according to (1), wherein the barrier unit includes a dummy wire being a wire that is not used to transmit a signal.

(3)
The solid state imaging device according to (2), wherein the barrier unit includes a plurality of the dummy wires formed in a plurality of wiring layers, and a via connecting the dummy wires in different wiring layers.

(4)
The solid state imaging device according to (3), wherein the dummy wires in a first wiring layer and the dummy wires in a second wiring layer adjacent to the first wiring layer are alternately placed in a first direction in which the scribe area extends, or a second direction perpendicular to the first direction in at least part of the barrier unit.

(5)
The solid state imaging device according to (4), wherein a wire that connects the first and second signal processing circuits is formed in the first or second wiring layer that is closer to the third moisture-resistant ring.

(6)
The solid state imaging device according to (1),
wherein the second substrate further includes a fourth moisture-resistant ring formed, leaving a predetermined space from the first and second moisture-resistant rings, in such a manner as to surround at least part of a periphery of the scribe area, and
the barrier unit separates a third area between the first and fourth moisture-resistant rings and the second area, and a fourth area between the second and fourth moisture-resistant rings and the second area, between the first area and the second area.

(7)
The solid state imaging device according to any of (1) to (6),
wherein at least part of a layer including the first and second moisture-resistant rings is formed by one-shot exposure, and
layers including the third moisture-resistant ring and the barrier unit are formed by split exposure.

(8)
The solid state imaging device according to any of (1) to (7), wherein an inter-layer insulating film between the layer including the barrier unit and an adjacent layer thereof includes a low-K film.

(9)
The solid state imaging device according to any of (1) to (8), wherein a wire that connects the first and second signal processing circuits is formed in the layer including the third moisture-resistant ring.

(10)
The solid state imaging device according to any of (1) to (9),
wherein the pixel circuit is formed by split exposure, and at least part of the layers of the signal processing circuits are formed by one-shot exposure.

(11)
An electronic apparatus including a solid state imaging device including
  a first substrate including a pixel circuit having a pixel array unit, and
  a second substrate including a first and a second signal processing circuit arranged side by side across a scribe area,
  wherein the first substrate and the second substrate are stacked, and
  the second substrate includes
    a first moisture-resistant ring surrounding at least part of a periphery of the first signal processing circuit,
    a second moisture-resistant ring surrounding at least part of a periphery of the second signal processing circuit,
    a third moisture-resistant ring surrounding at least part of a periphery of the second substrate in a layer different from the first and second moisture-resistant rings, and
    a barrier unit separating a first area between the first and second moisture-resistant rings and a second area, at least part of a periphery of which is surrounded by the third moisture-resistant ring, and having moisture resistance.

REFERENCE SIGNS LIST

1 Solid state imaging device
11 Pixel substrate
12 Logic substrate
21 Pixel circuit
22 Scribe area
31 Pixel array unit
32 Unit pixel
41L, 41R Signal processing circuit
42 Scribe area
701 Logic substrate
711L, 711R Signal processing circuit
712L, 712La to 712Le, 712R, 712Ra to 712Re, 713, 713a to 713e, 714, 715 Moisture-resistant ring
721L-1 to 721R-3, 722-1 to 722-3 Dummy wire
723L, 723R, 724L-1 to 724R-3, 725-1, 725-2 Wall
741 Dummy wire
751 Substrate layer
752 Non-moisture resistant area
753 Moisture-resistant area
761 Dummy wire
762 Wall
763 Dummy wire
771 Non-moisture resistant area
772 Moisture-resistant area
781 Dummy wire
782, 783-1 to 783-n Wall
784, 785-1 to 785-n Dummy wire
791 Non-moisture resistant area
792 Moisture-resistant area
801-1, 801-2 Wire
821 Wall
822-1 to 822-3 Dummy wire
823-1 to 823-3 Wall
824 Dummy wire
825 Wall
826-1 to 826-4 Dummy wire 827-1 to 827-4 Wall
831 Non-moisture resistant area
832 Moisture-resistant area
841L, 841R, 842L, 842R, 843 Moisture-resistant ring
851 Non-moisture resistant area
852 Moisture-resistant area
901 Imaging apparatus
912 Imaging device

What is claimed is:

1. A solid state imaging device comprising:
a first substrate including a pixel circuit having a pixel array unit; and
a second substrate including a first and a second signal processing circuit arranged side by side across a scribe area,
wherein the first substrate and the second substrate are stacked, and
the second substrate includes
a first moisture-resistant ring surrounding at least part of a periphery of the first signal processing circuit,
a second moisture-resistant ring surrounding at least part of a periphery of the second signal processing circuit,
a third moisture-resistant ring surrounding at least part of a periphery of the second substrate in a layer different from the first and second moisture-resistant rings, and
a barrier unit separating a first area between the first and second moisture-resistant rings and a second area, at least part of a periphery of which is surrounded by the third moisture-resistant ring, and having moisture resistance.

2. The solid state imaging device according to claim 1, wherein the barrier unit includes a dummy wire being a wire that is not used to transmit a signal.

3. The solid state imaging device according to claim 2, wherein the barrier unit includes a plurality of the dummy wires formed in a plurality of wiring layers, and a via connecting the dummy wires in different wiring layers.

4. The solid state imaging device according to claim 3, wherein the dummy wires in a first wiring layer and the dummy wires in a second wiring layer adjacent to the first wiring layer are alternately placed in a first direction in which the scribe area extends, or a second direction perpendicular to the first direction in at least part of the barrier unit.

5. The solid state imaging device according to claim 4, wherein a wire that connects the first and second signal processing circuits is formed in the first or second wiring layer that is closer to the third moisture-resistant ring.

6. The solid state imaging device according to claim 1, wherein the second substrate further includes a fourth moisture-resistant ring formed, leaving a predetermined space from the first and second moisture-resistant rings, in such a manner as to surround at least part of a periphery of the scribe area, and
the barrier unit separates a third area between the first and fourth moisture-resistant rings and the second area, and
a fourth area between the second and fourth moisture-resistant rings and the second area.

7. The solid state imaging device according to claim 1, wherein at least part of a layer including the first and second moisture-resistant rings is formed by one-shot exposure, and
layers including the third moisture-resistant ring and the barrier unit are formed by split exposure.

8. The solid state imaging device according to claim 1, wherein an inter-layer insulating film between the layer including the barrier unit and an adjacent layer thereof comprises a low-K film.

9. The solid state imaging device according to claim 1, wherein a wire that connects the first and second signal processing circuits is formed in the layer including the third moisture-resistant ring.

10. The solid state imaging device according to claim 1, wherein the pixel circuit is formed by split exposure, and
at least part of the layers of the signal processing circuits are formed by one-shot exposure.

11. An electronic apparatus comprising a solid state imaging device including
a first substrate including a pixel circuit having a pixel array unit, and
a second substrate including a first and a second signal processing circuit arranged side by side across a scribe area,
wherein the first substrate and the second substrate are stacked, and
the second substrate includes
a first moisture-resistant ring surrounding at least part of a periphery of the first signal processing circuit,
a second moisture-resistant ring surrounding at least part of a periphery of the second signal processing circuit,
a third moisture-resistant ring surrounding at least part of a periphery of the second substrate in a layer different from the first and second moisture-resistant rings, and
a barrier unit separating a first area between the first and second moisture-resistant rings and a second area, at least part of a periphery of which is surrounded by the third moisture-resistant ring, and having moisture resistance.

* * * * *